(12) United States Patent
Hwang et al.

(10) Patent No.: US 9,368,737 B2
(45) Date of Patent: Jun. 14, 2016

(54) MULTI-LAYER GATE DIELECTRIC FIELD-EFFECT TRANSISTOR AND MANUFACTURING PROCESS THEREOF

(75) Inventors: Do Kyung Hwang, Duluth, GA (US); Jungbae Kim, Alpharetta, GA (US); Canek Fuentes-Hernandez, Atlanta, GA (US); Bernard Kippelen, Decatur, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 46 days.

(21) Appl. No.: 13/877,441

(22) PCT Filed: Oct. 5, 2011

(86) PCT No.: PCT/US2011/054989
§ 371 (c)(1),
(2), (4) Date: Jul. 1, 2013

(87) PCT Pub. No.: WO2012/048048
PCT Pub. Date: Apr. 12, 2012

(65) Prior Publication Data
US 2013/0270534 A1    Oct. 17, 2013

Related U.S. Application Data

(60) Provisional application No. 61/390,844, filed on Oct. 7, 2010.

(51) Int. Cl.
*H01L 35/24* (2006.01)
*H01L 51/05* (2006.01)
*H01L 51/00* (2006.01)

(52) U.S. Cl.
CPC ........ *H01L 51/0529* (2013.01); *H01L 51/0533* (2013.01); *H01L 51/0053* (2013.01); *H01L 51/0071* (2013.01); *H01L 51/0545* (2013.01)

(58) Field of Classification Search
CPC ............ H01L 51/0516; H01L 51/0529; H01L 51/0541; H01L 51/0545
USPC ............. 257/40, E51.005–E51.007, E51.027, 257/E51.036; 438/99
See application file for complete search history.

(56) References Cited

U.S. PATENT DOCUMENTS

2005/0104058 A1* 5/2005 Veres ................ H01L 21/02282
257/40
2006/0151781 A1* 7/2006 Kim .................... H01L 51/0529
257/40

(Continued)

FOREIGN PATENT DOCUMENTS

WO    WO-2009/129912    10/2009

OTHER PUBLICATIONS

D.K. Hwang et al., "Flexible and Stable Solution-Processed Organic Field Effect Transistors", Organic Electronics, vol. 12, No. 7, Jul. 1, 2011, pp. 1108-1113.

(Continued)

*Primary Examiner* — Matthew E Warren
(74) *Attorney, Agent, or Firm* — Pabst Patent Group LLP

(57) ABSTRACT

A field-effect transistor includes a gate, a source and a drain; a semiconductor layer between the source and the drain; and a gate insulator between the gate and the semiconductor layer. The gate insulator comprises a first layer adjoining the semiconductor layer; and a second layer. The first layer is formed from an amorphous fluoropolymer having a first dielectric constant and a first thickness. The second layer has a second dielectric constant and a second thickness. The first dielectric constant is smaller than 3, the first thickness is smaller than 200 nm, the second dielectric constant is higher than 5, and the second thickness is smaller than 500 nm.

18 Claims, 55 Drawing Sheets

(56) References Cited

U.S. PATENT DOCUMENTS

| | | | |
|---|---|---|---|
| 2006/0214154 A1* | 9/2006 | Yang | H01L 51/052 257/40 |
| 2007/0290198 A1* | 12/2007 | Goldfinger | B82Y 30/00 257/40 |
| 2010/0025668 A1 | 2/2010 | Benwadih et al. | |
| 2010/0102324 A1* | 4/2010 | Toguchi | B82Y 10/00 257/66 |
| 2010/0127269 A1* | 5/2010 | Daniel et al. | 257/66 |

OTHER PUBLICATIONS

Do Kyung Hwang et al., "Top-Gate Organic Field-Effect Transistors with High Environmental and Operational Stability", vol. 23, No. 10, Jan. 25, 2011, pp. 1293-1298.

International Search Report issued in connection with PCT/US2011/054989 mailed Jan. 26, 2012.

International Search Report issued in connection with PCT/US2012/032559 mailed Jun. 15, 2012.

Invitation to Pay Additional Fees and, Where Applicable, Protest Fee issued in connection with PCT/US2011/054989 mailed Nov. 16, 2011.

Jeremy Smith et al., "Solution-Processed Organic Transistors Based on Semi-Conducting Blends", Journal of Materials Chemistry, vol. 20, No. 13, Jan. 1, 2010, p. 2562.

Lauren E. Polander et al., "Solution-Processed Molecular Bis (Naphthalene Diimide) Derivatives With High Electron Mobility", Chemistry of Materials, vol. 23, No. 15, Jul. 18, 2011, pp. 3408-3410.

Written Opinion issued in connection with PCT/US2011/054989 mailed Jan. 26, 2012.

Written Opinion issued in connection with PCT/US2012/032559 mailed Jun. 15, 2012.

Zhang et al., "High Performance Pentacene Field-Effect Transistors Using Al2O3 Gate Dielectrics Prepared by Atomic Layer Deposition", Organic Electronics, vol. 8, No. 6, Oct. 23, 2007, pp. 718-726.

Fujisaki et al., "Low Voltage and Hysteresis-Free N-Type Organic Thin Film Transistor and Complementary Inverter with Bilayer Gate Insulator", Japanese Journal of Applied Physics, 48, 111504, 2009.

Gerber et al., "Ferroelectric Field Effect Transistors Using Very Thin Ferroelectric Polyvinylidene Fluoride Copolymer Films as Gate Dielectrics", Journal of Applied Physics, 107, 124119, 2010.

Jung et al., Low Voltage Operation of Nonvolatile Ferroelectric Capacitors Using Poly(vinylidene fluoride-trifluoroethylene) Copolymer and Thin $Al_2O_3$ Insulating Layer, ECS, 12(9), pp. H325-H328, 2009.

Khan et al., "Effect of Passivation on the Sensitivity and Stability of Pentacene Transistor Sensors in Aqueous Media", Biosensors and Bioelectronics, 26, pp. 4217-4221, 2011.

Kim et al., "Effect of the Hydrophobicity and Thickness of Polymer Gate Dielectrics on the Hysteresis Behavior of Pentacene-Based Field-Effect Transistors", Journal of Applied Physics, 105, 104509, 2009.

Kim et al., "High-Performance Solution-Processed Triisopropylsilylethynyl Pentacene Transistors and Inverters Fabricated by Using the Selective Self-Organization Technique", Applied Physics Letters, 93, 113306, 2008.

Lee et al, "Fabrication and Characterization of a MFIS-FET with a PVDF-TrFE/$ZrO_2$/Si Structure", Journal of the Korean Physical Society, vol. 56, No. 5, pp. 1484-1487, May 2010.

Reece et al., "Investigation of State Retention in Metal-Ferroelectric-Insulator-Semiconductor Structures Based on Langmuir-Blodgett Copolymer Films", Journal of Applied Physics, 108, 024109, 2010.

Shin et al., "Highly Air-Stable Electrical Performance of Graphene Field Effect Transistors by Interface Engineering with Amorphous Fluoropolymer", Applied Physics Letters, 98, 153505, 2011.

Sung et al., "Hybrid $TiO_x$/fluoropolymer Bi-layer Dielectrics for Low-Voltage Complementary Inverters", Organic Electronics, 11, 154-158, 2010.

* cited by examiner

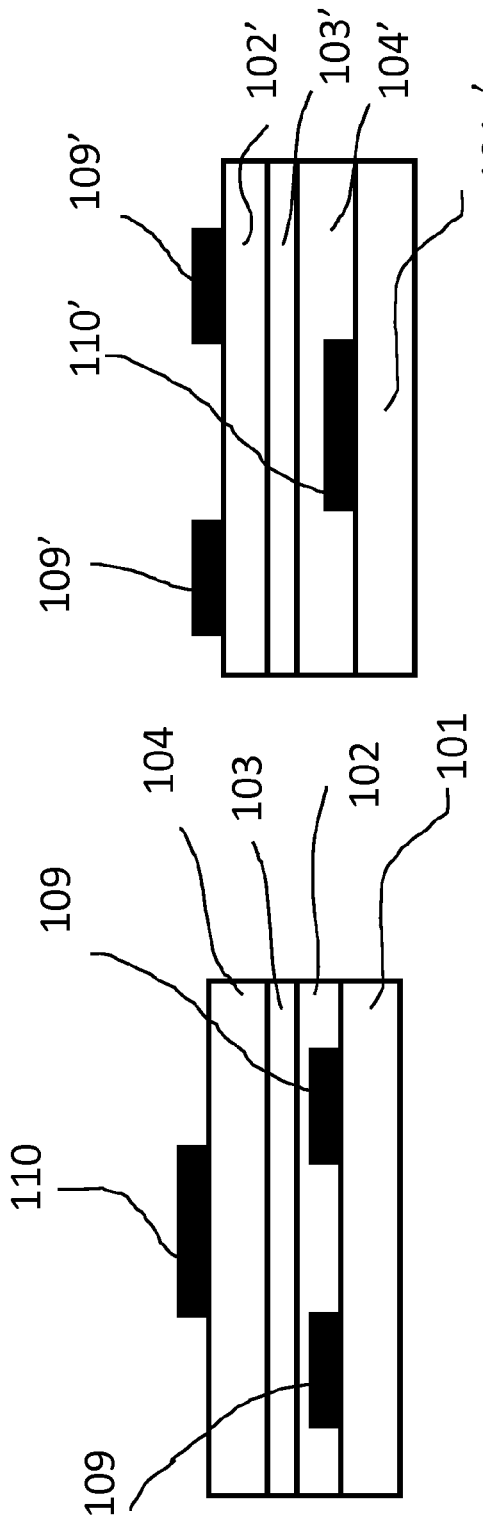
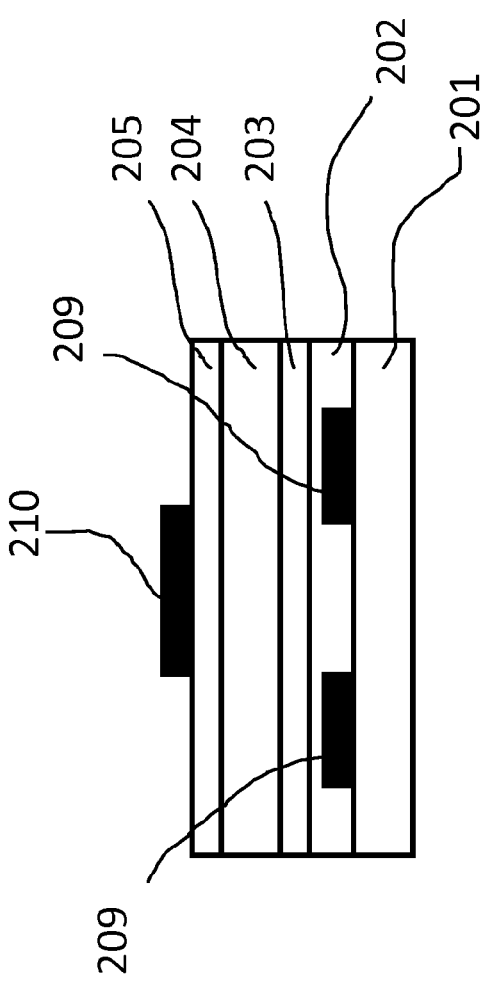

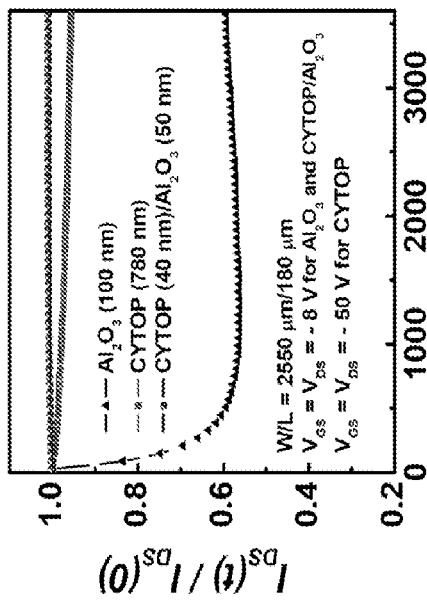
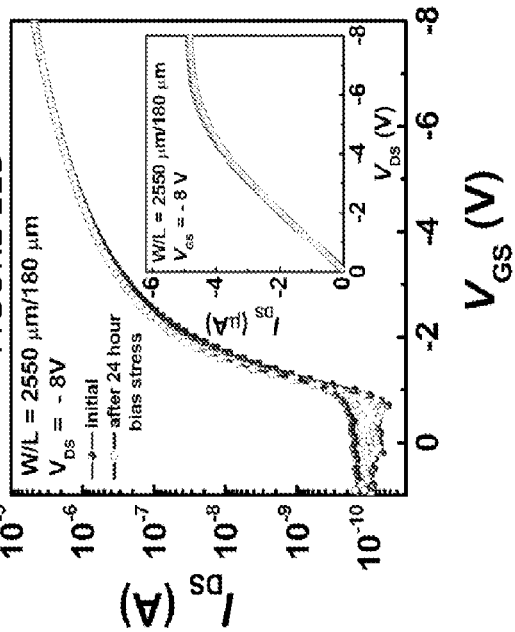
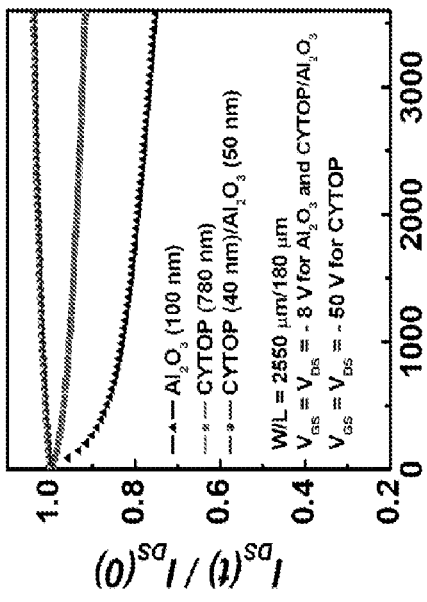
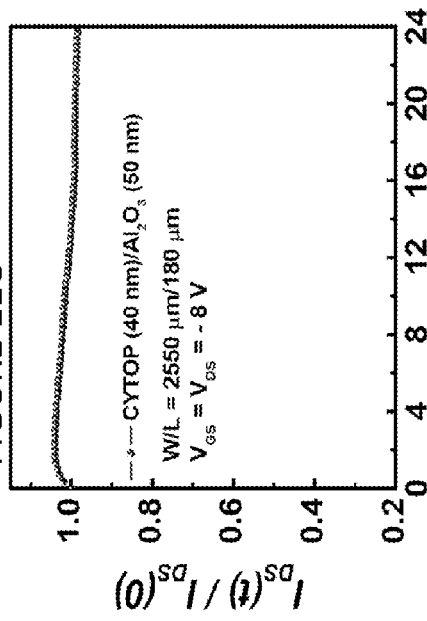

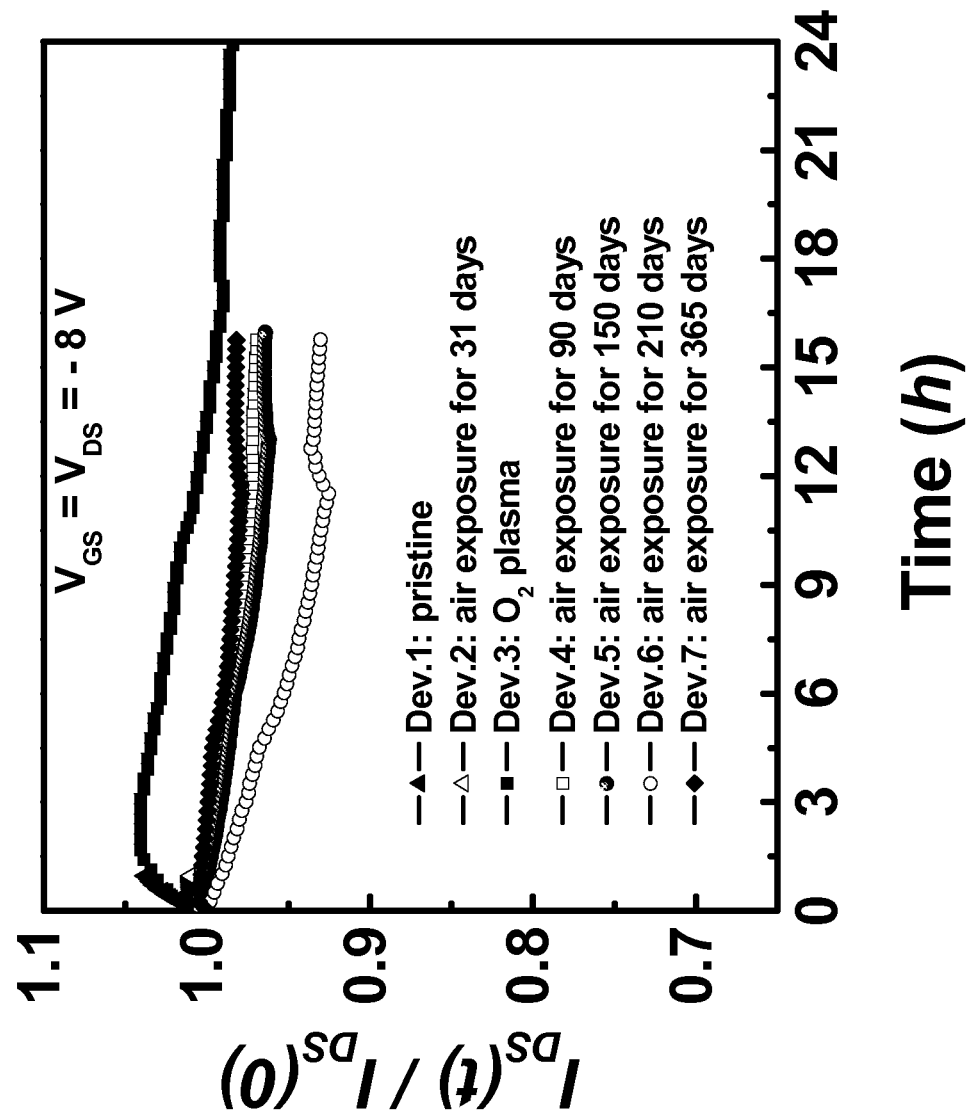

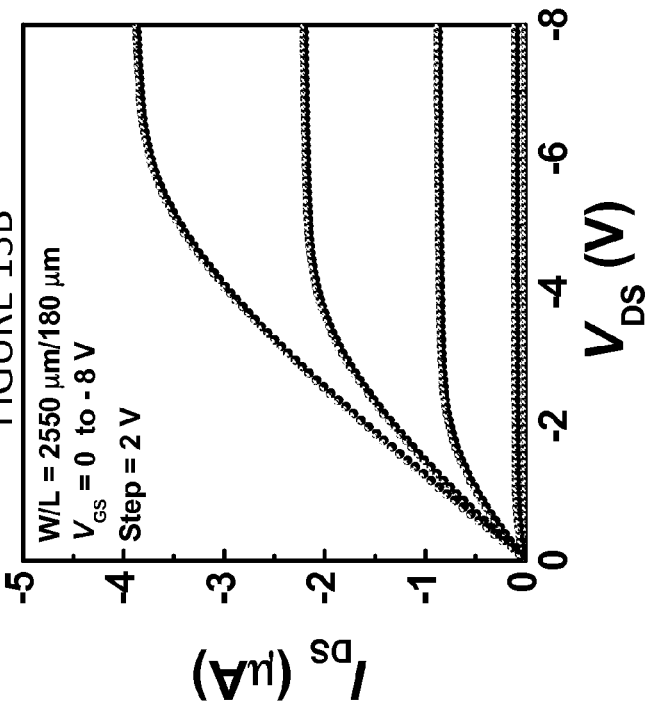
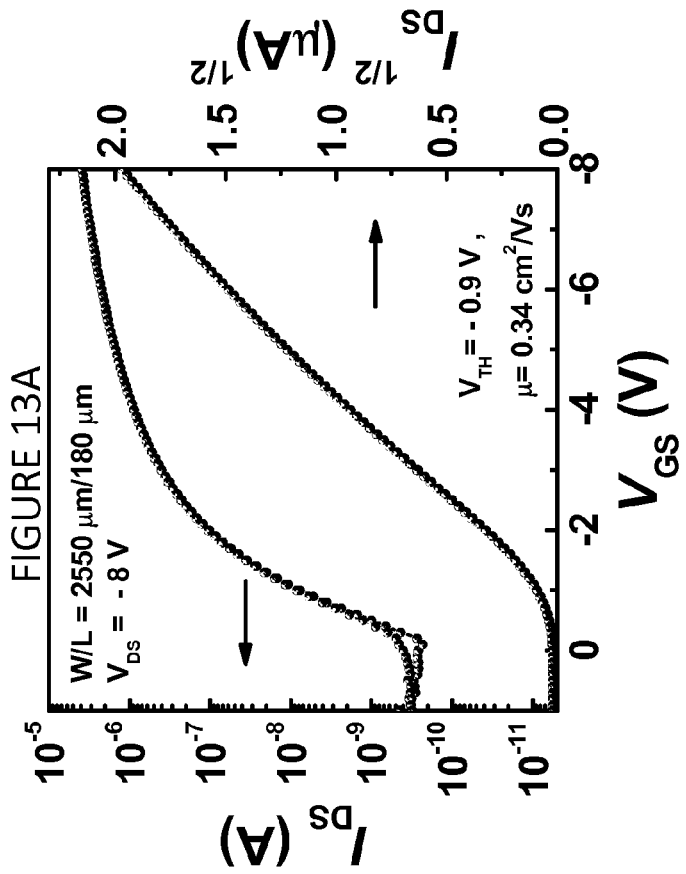

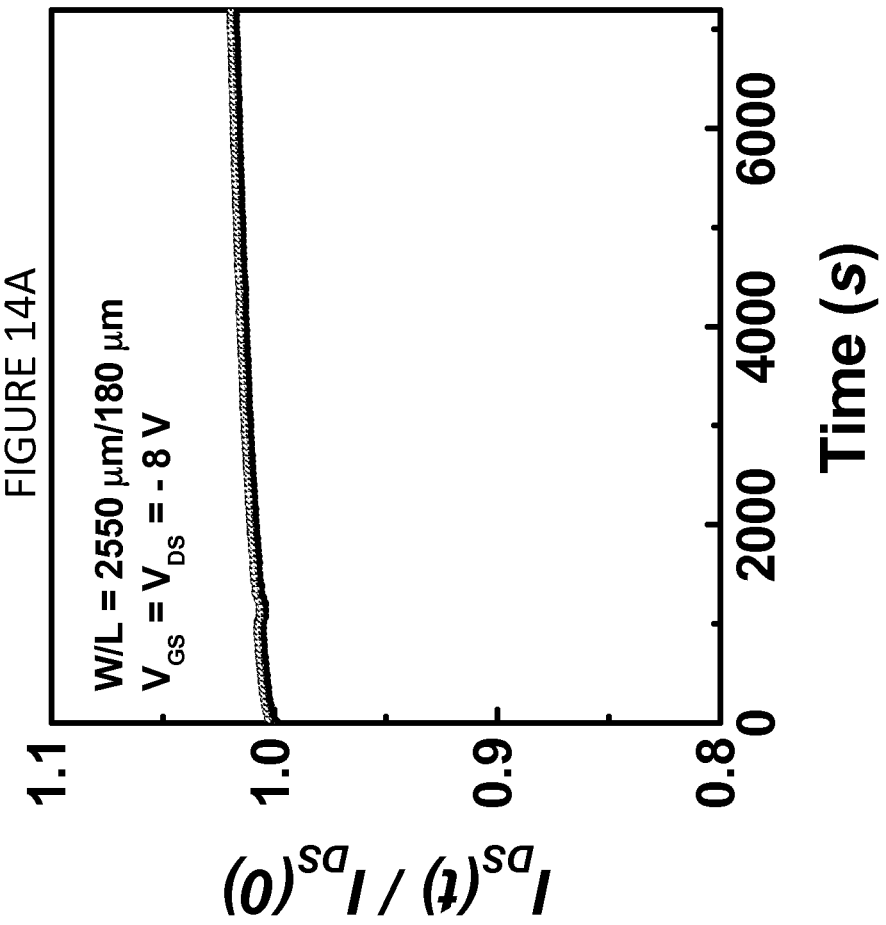

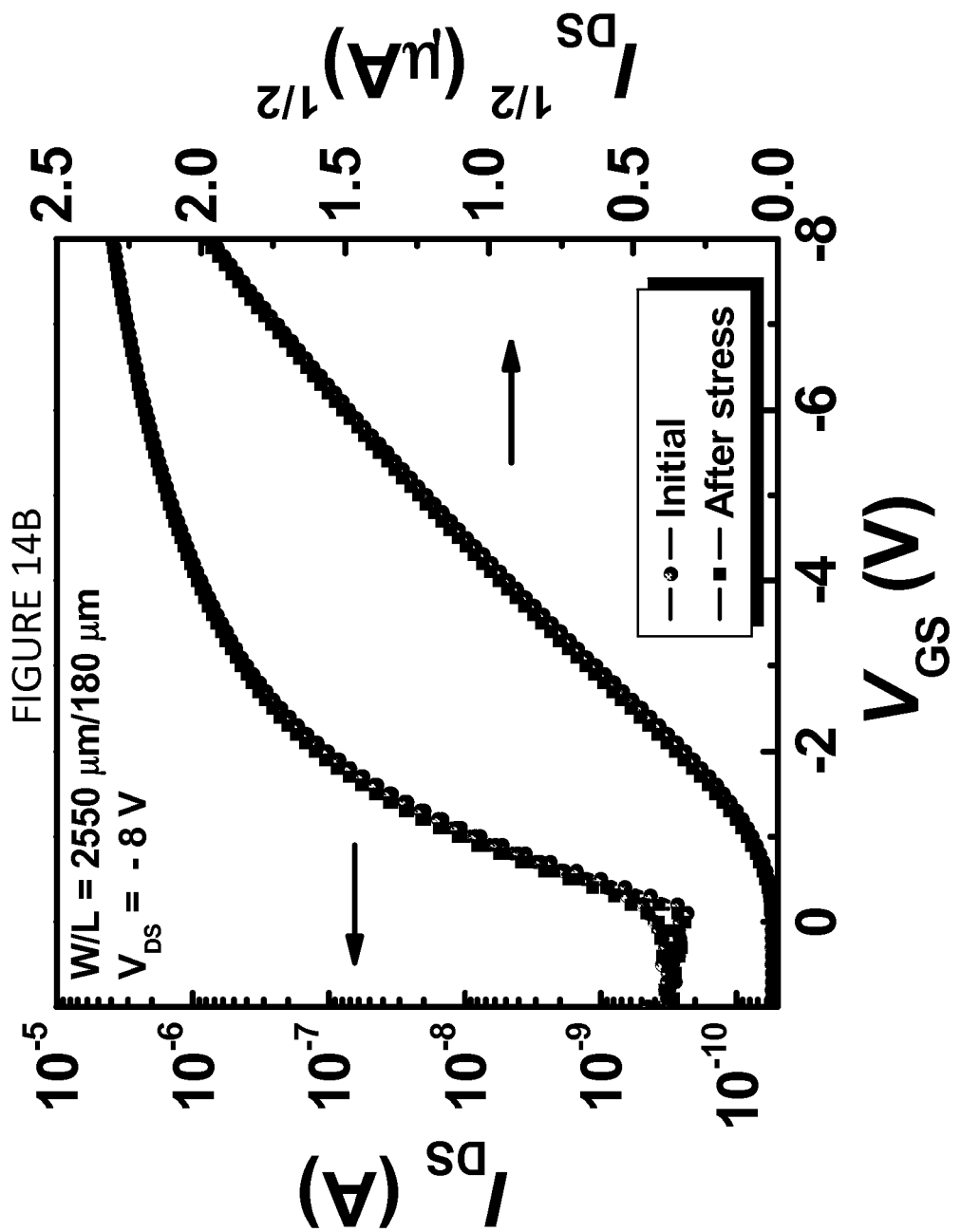

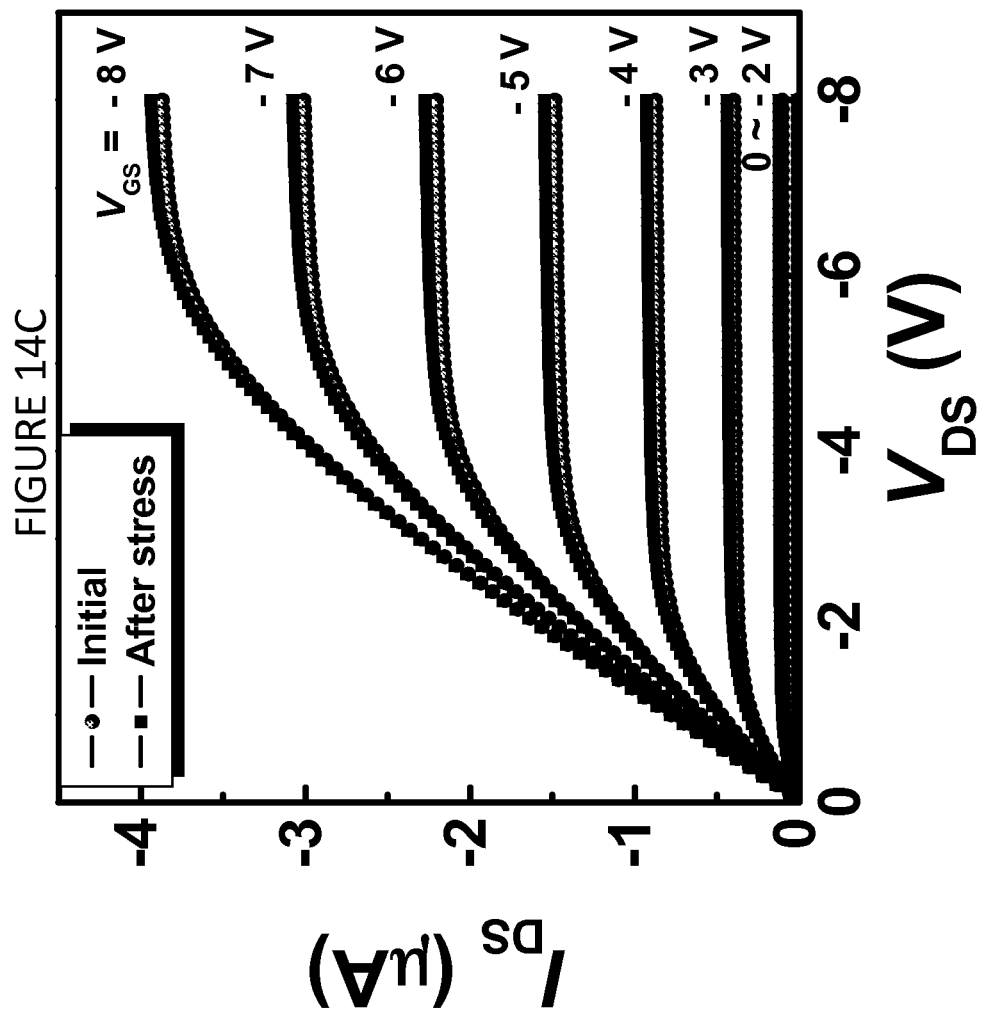

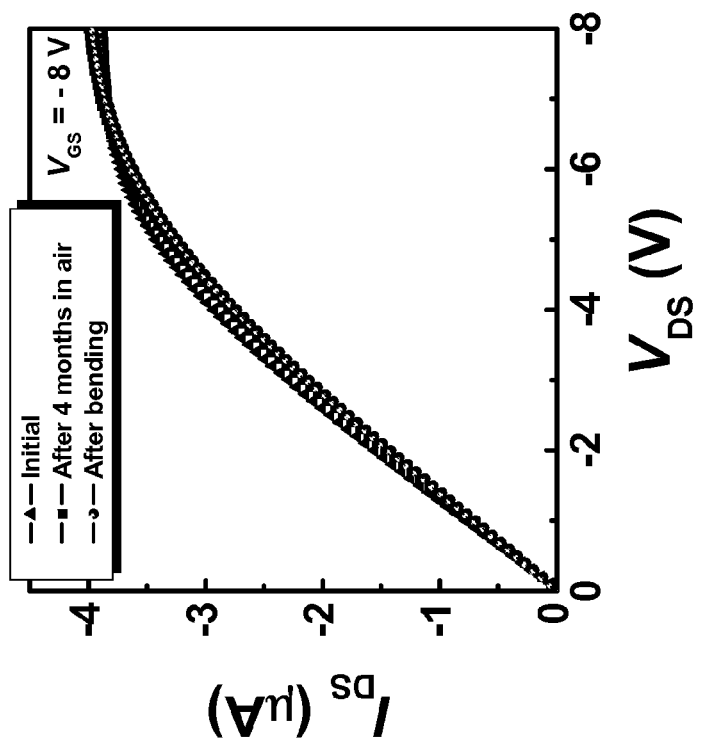
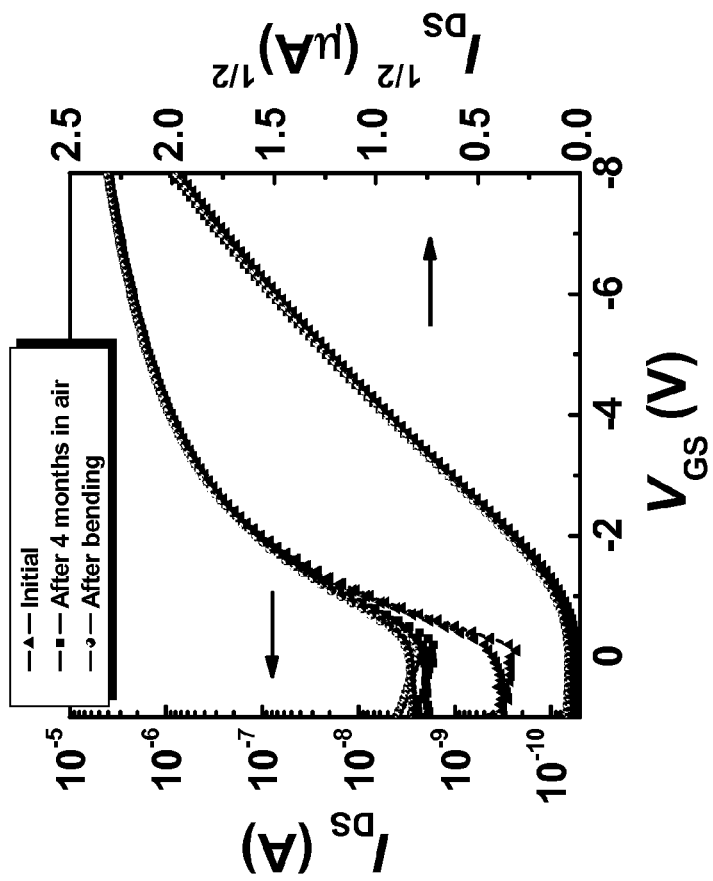

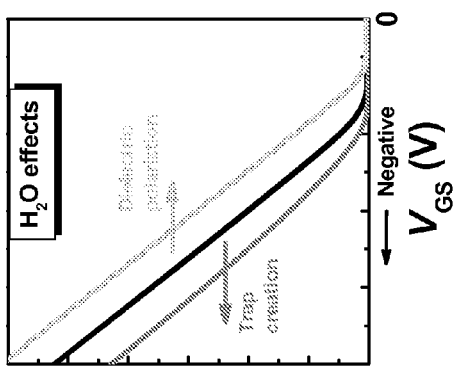
FIGURE 16A  FIGURE 16B
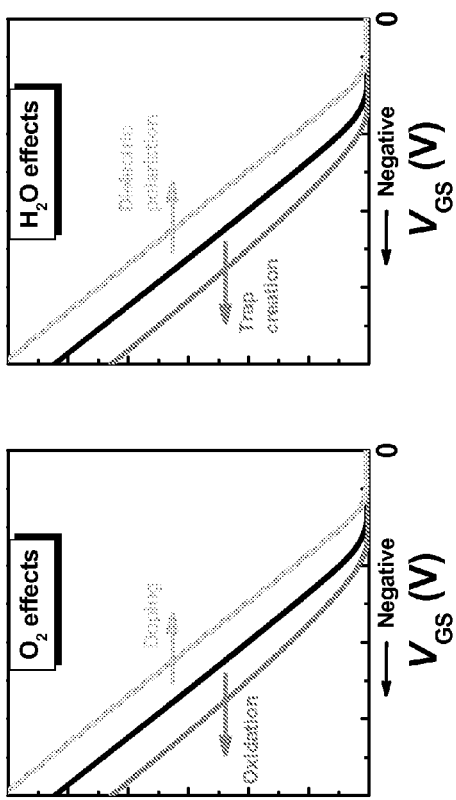
FIGURE 16C
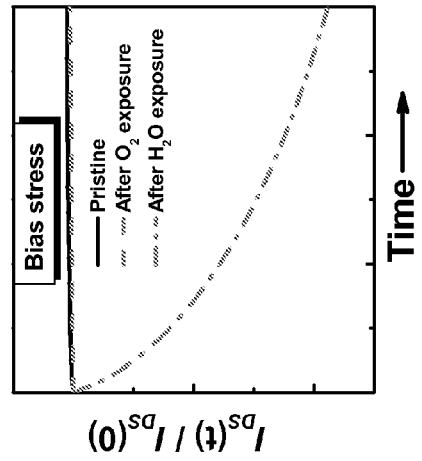

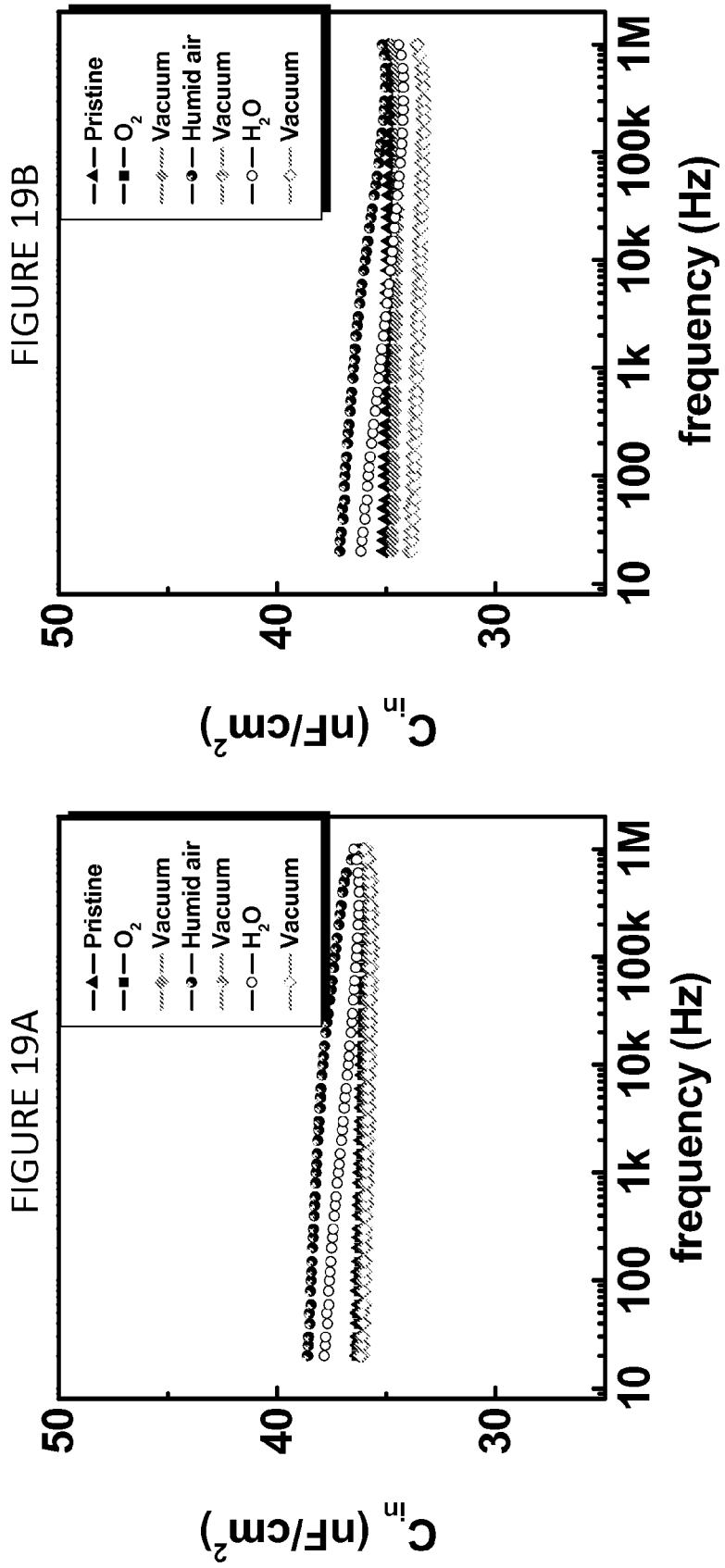

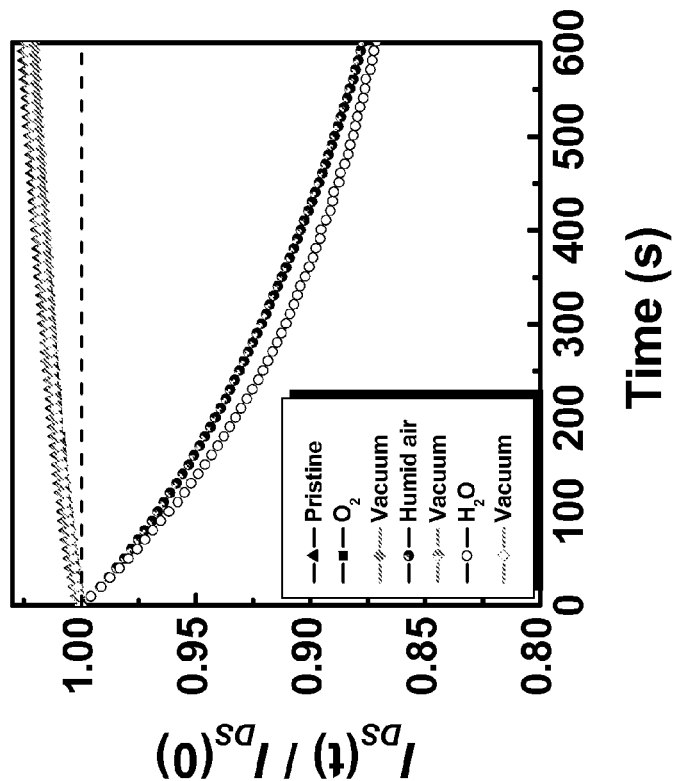
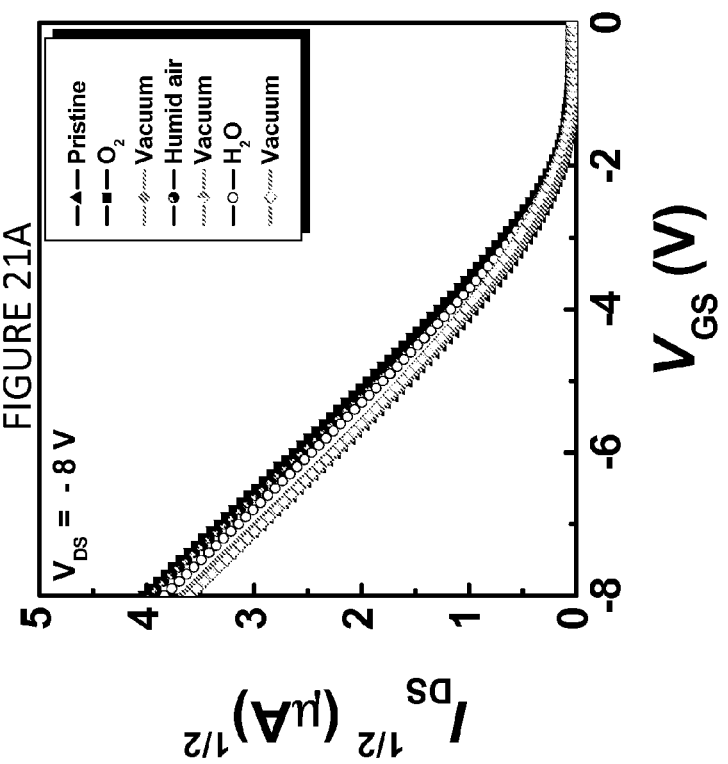

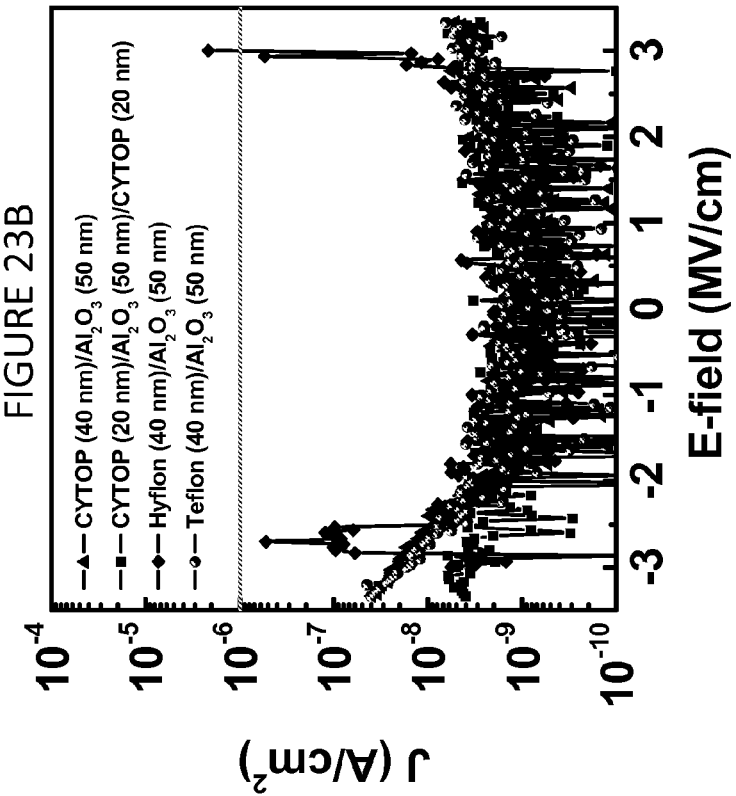
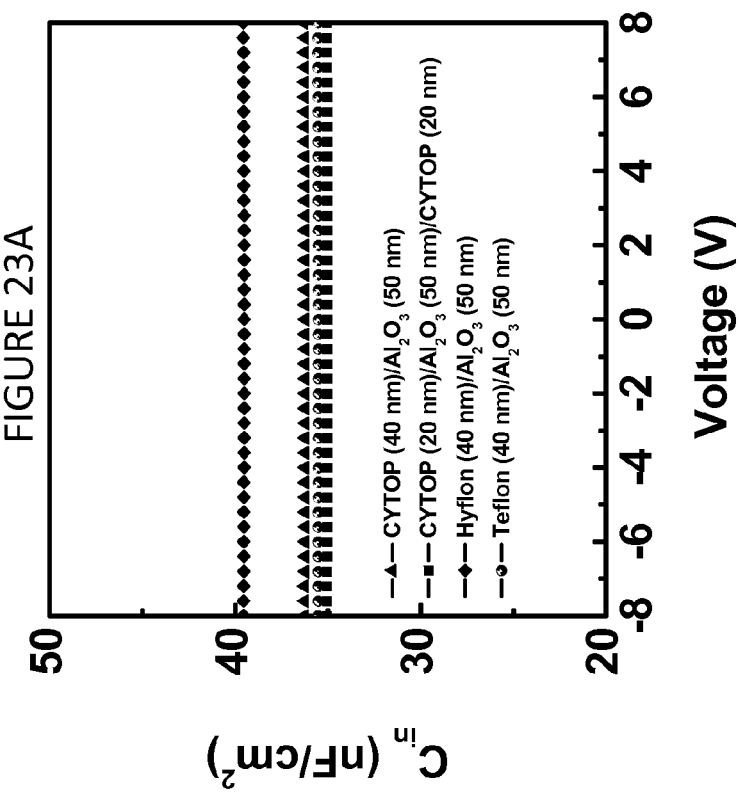

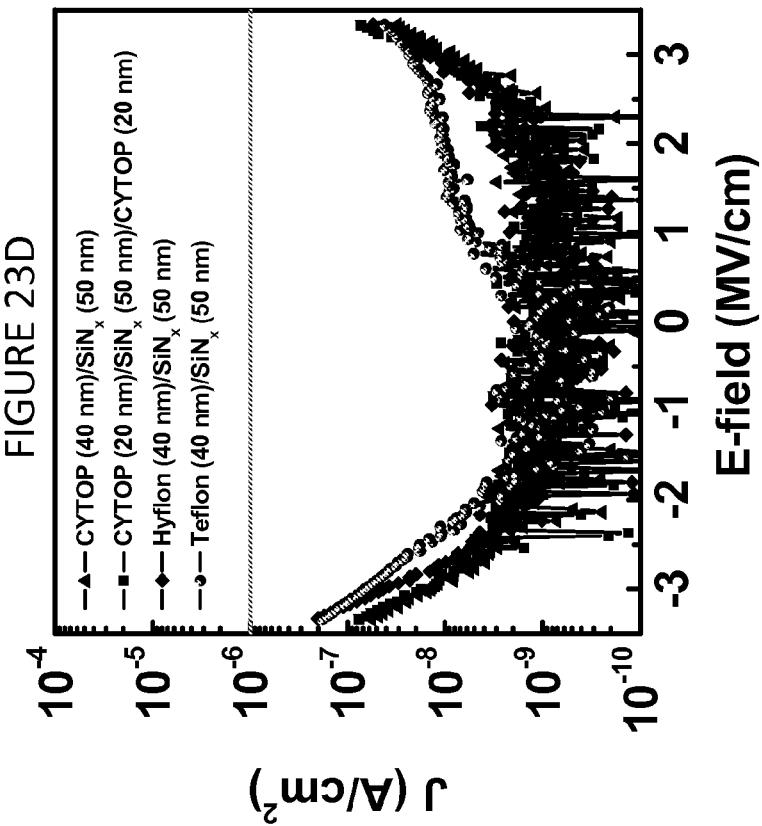
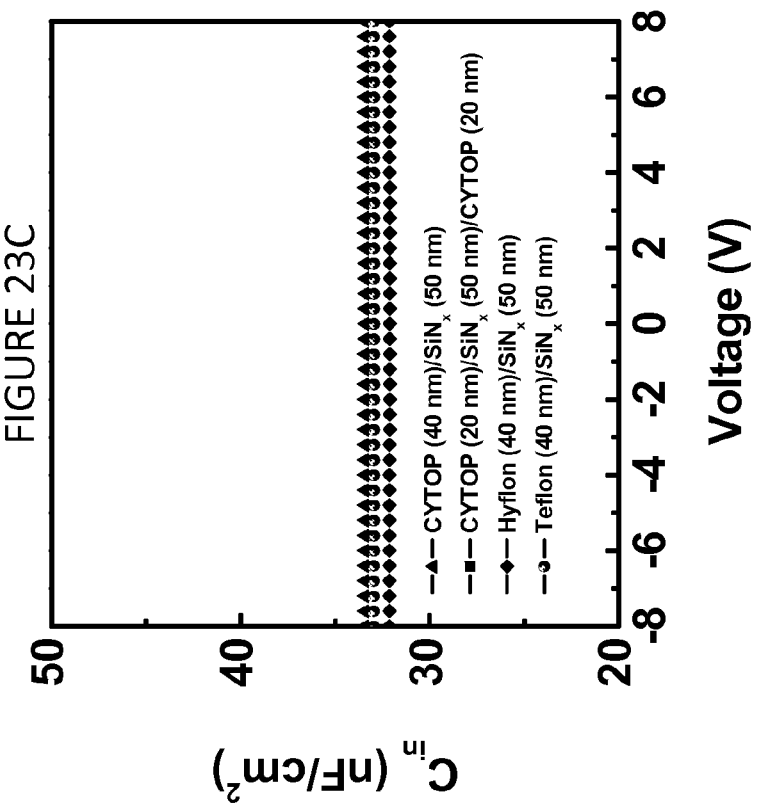

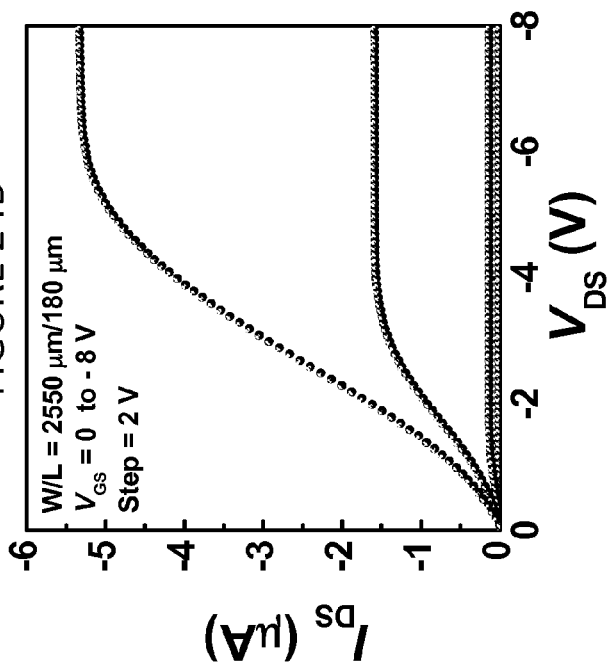
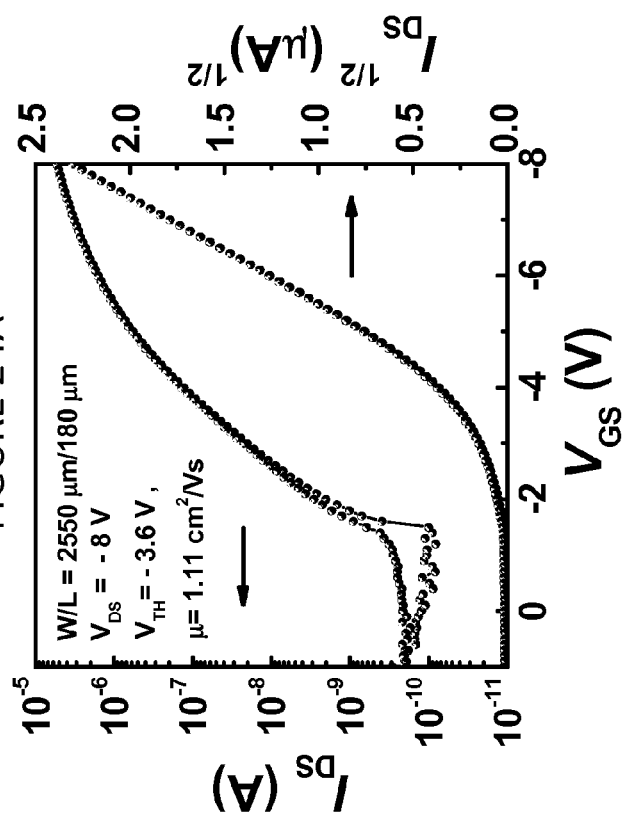

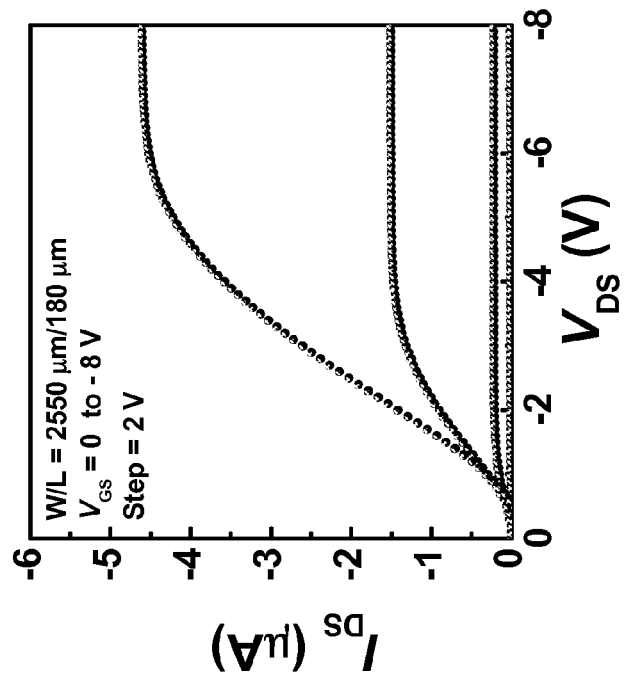
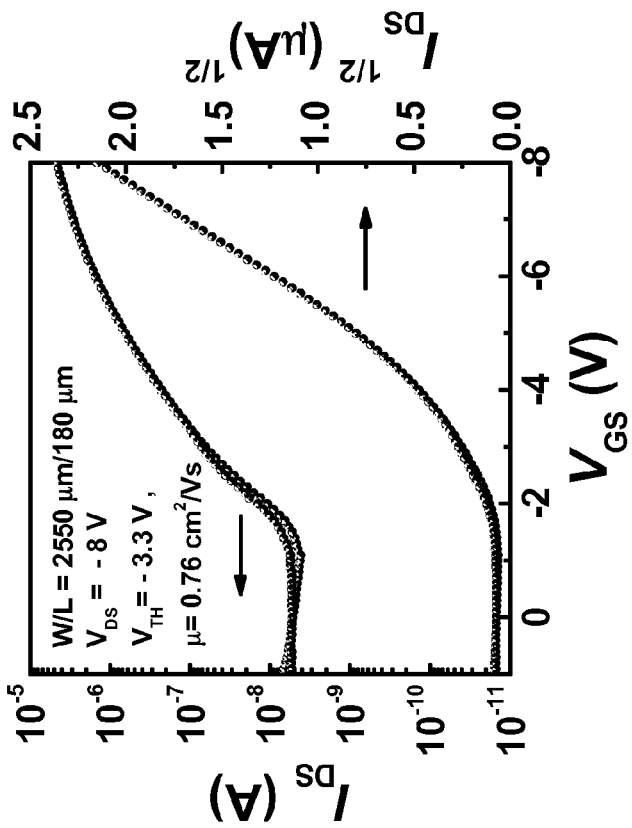

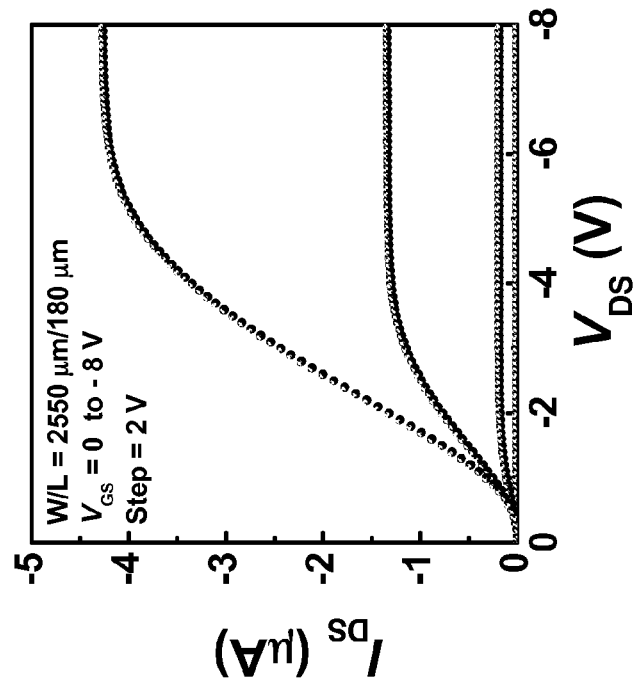
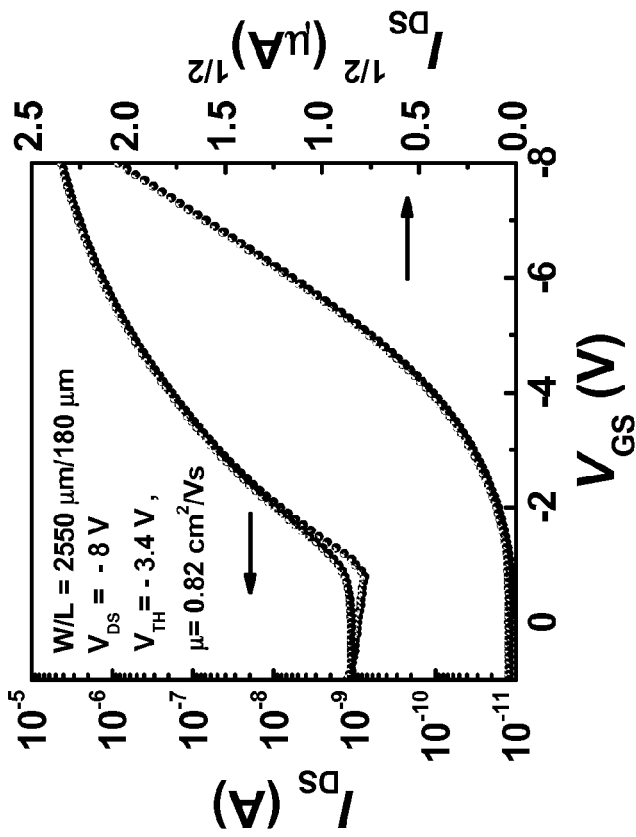
FIGURE 24F
FIGURE 24E

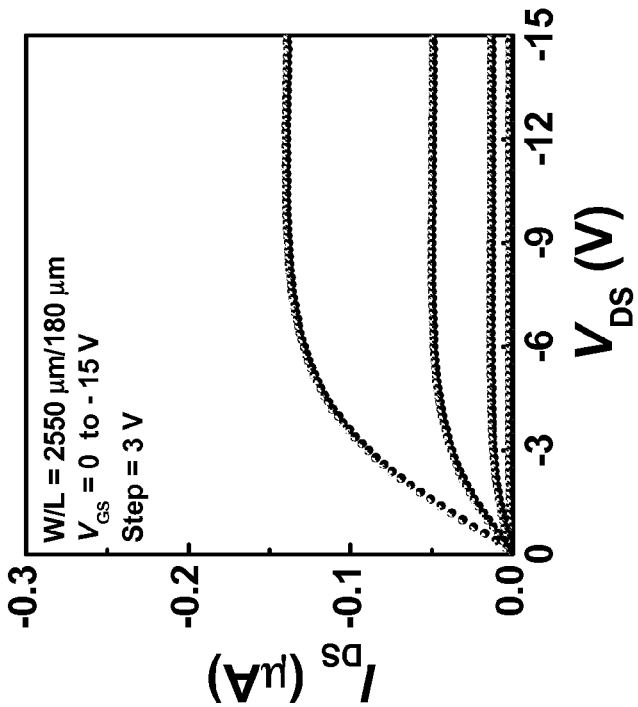
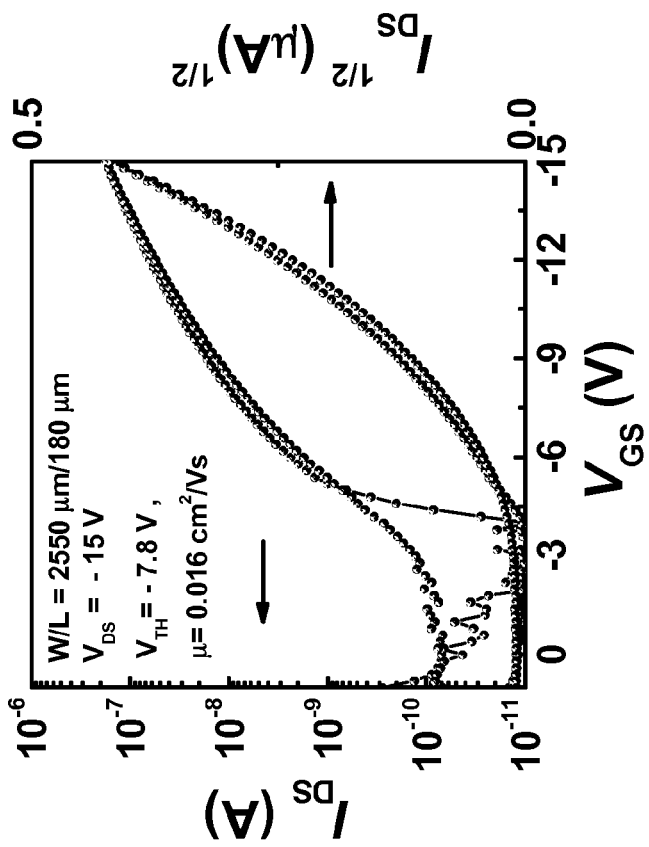

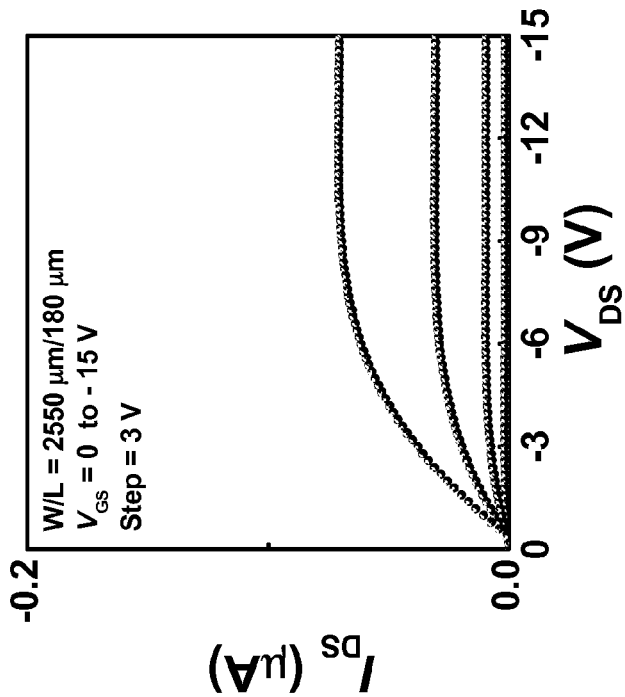
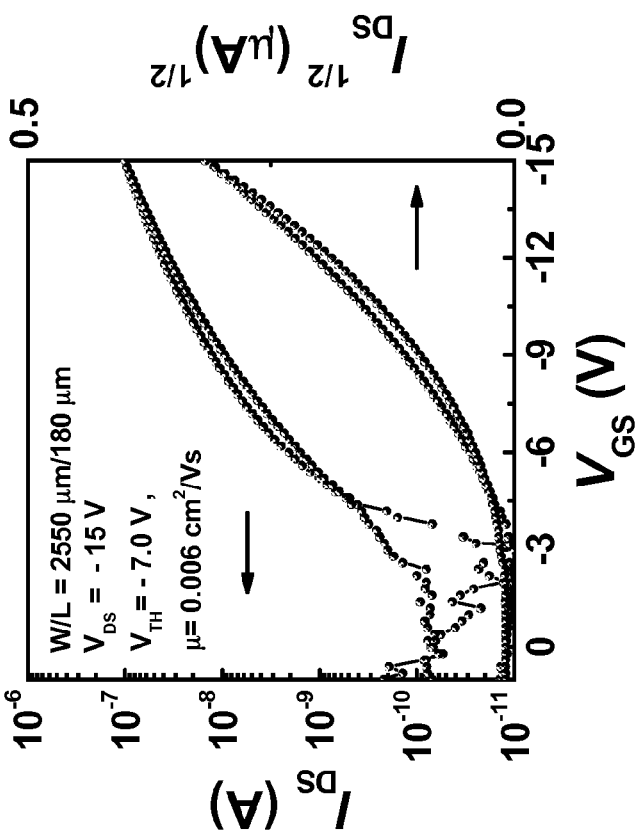

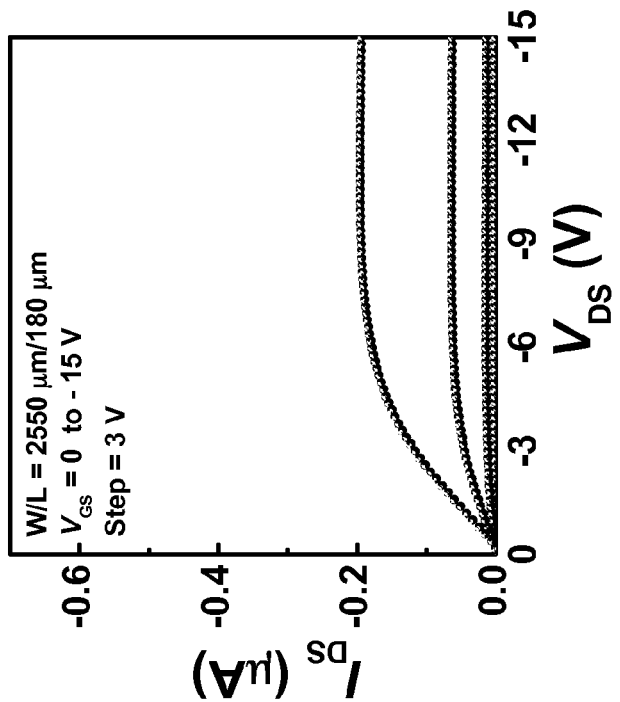
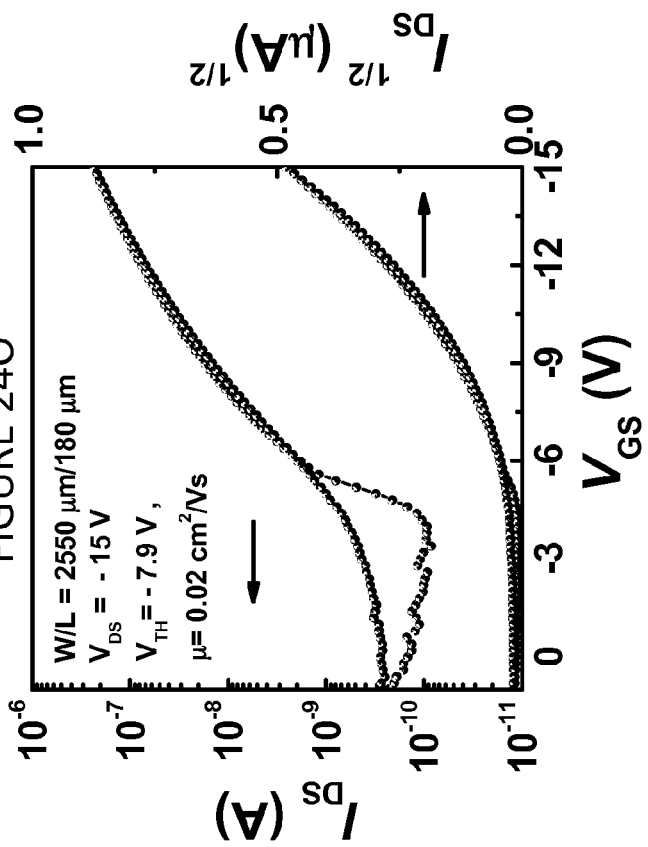

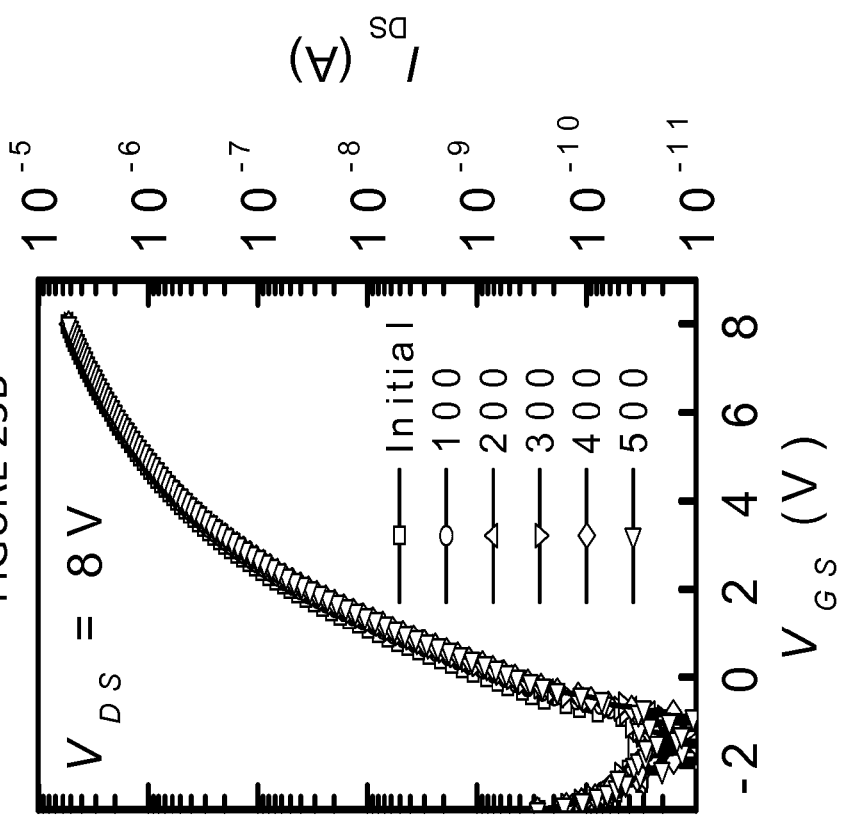
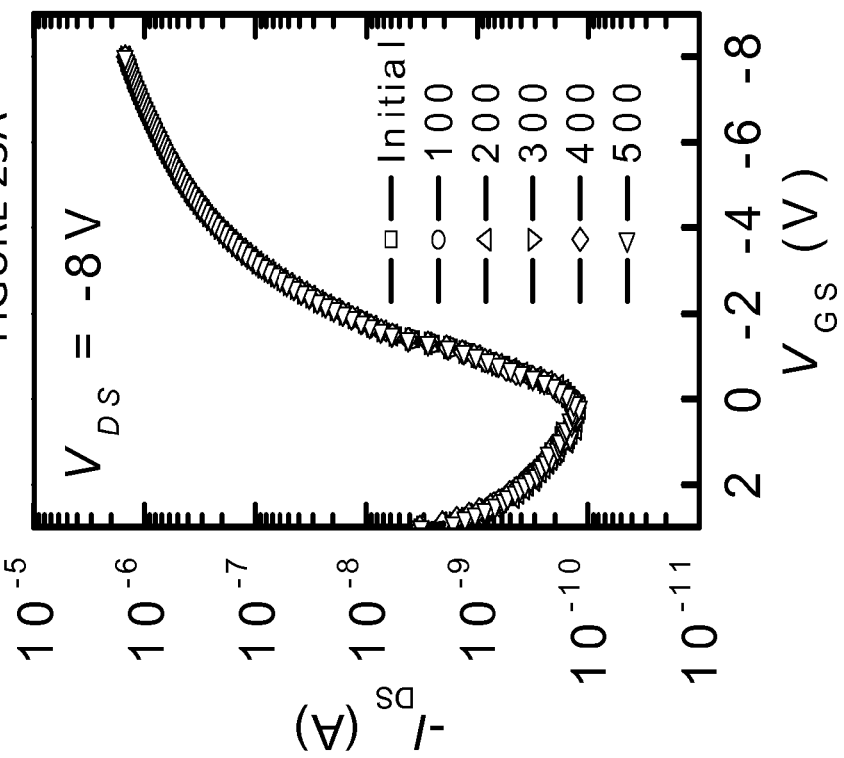

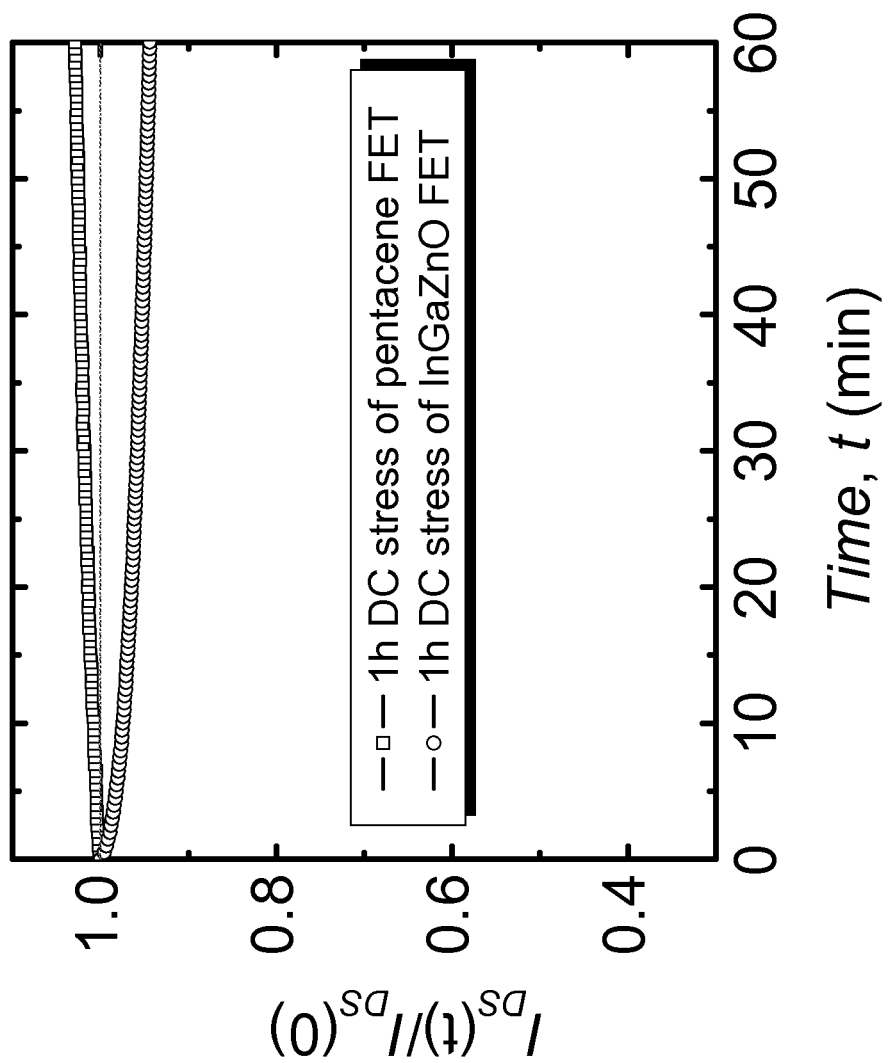

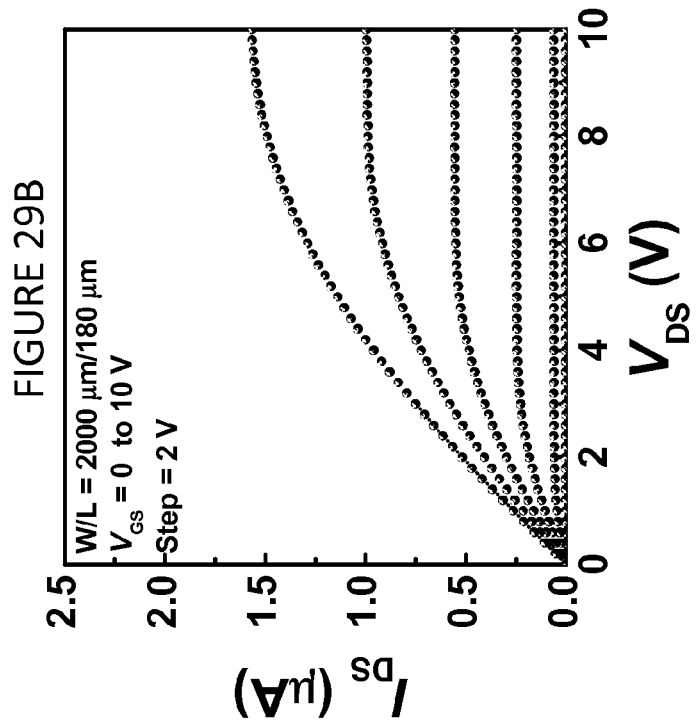
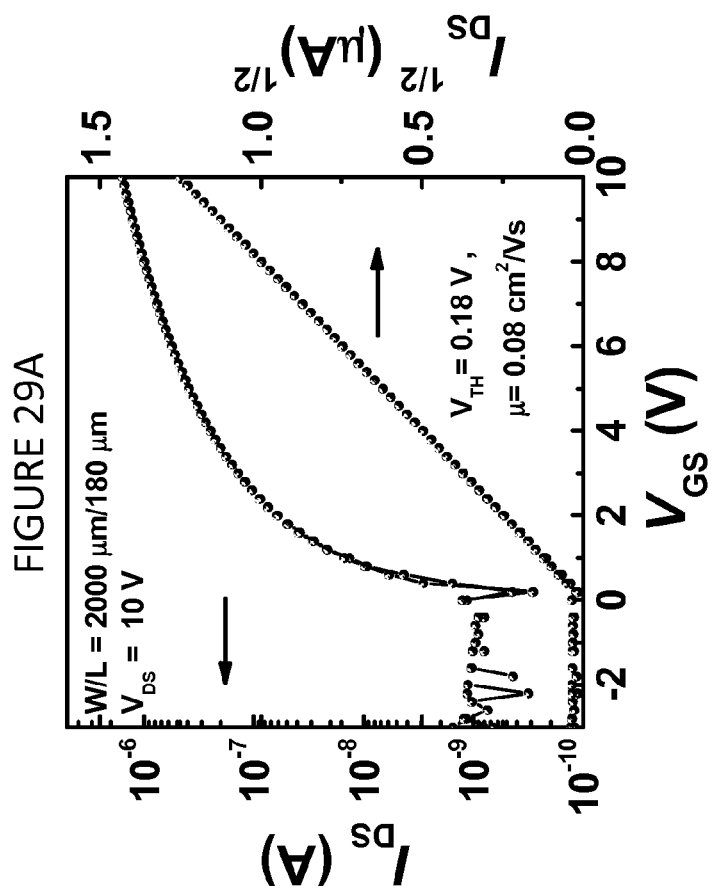

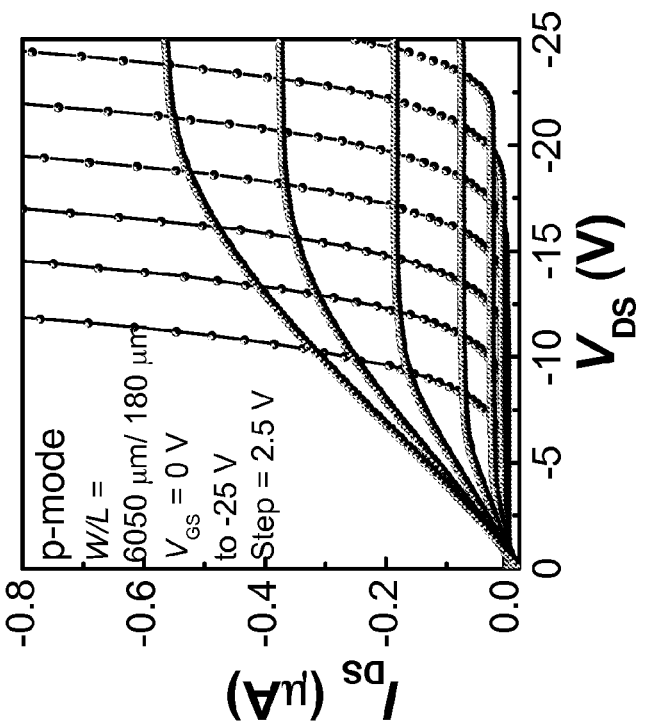
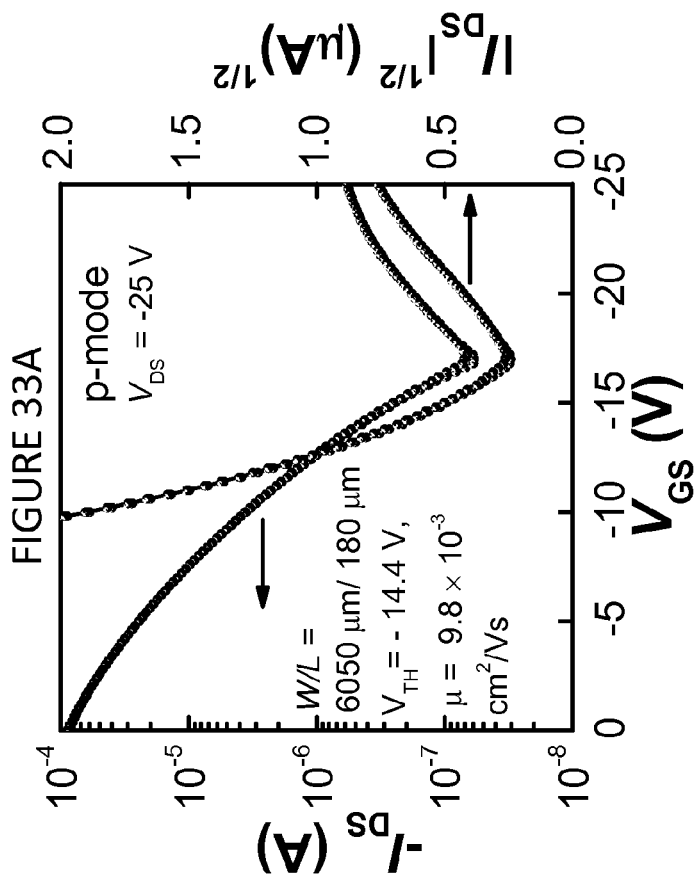
FIGURE 33B
FIGURE 33A

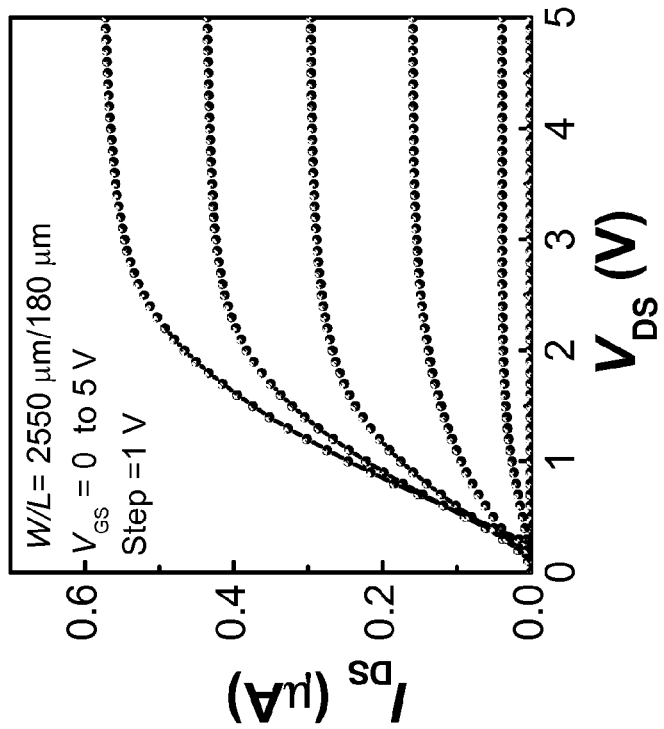
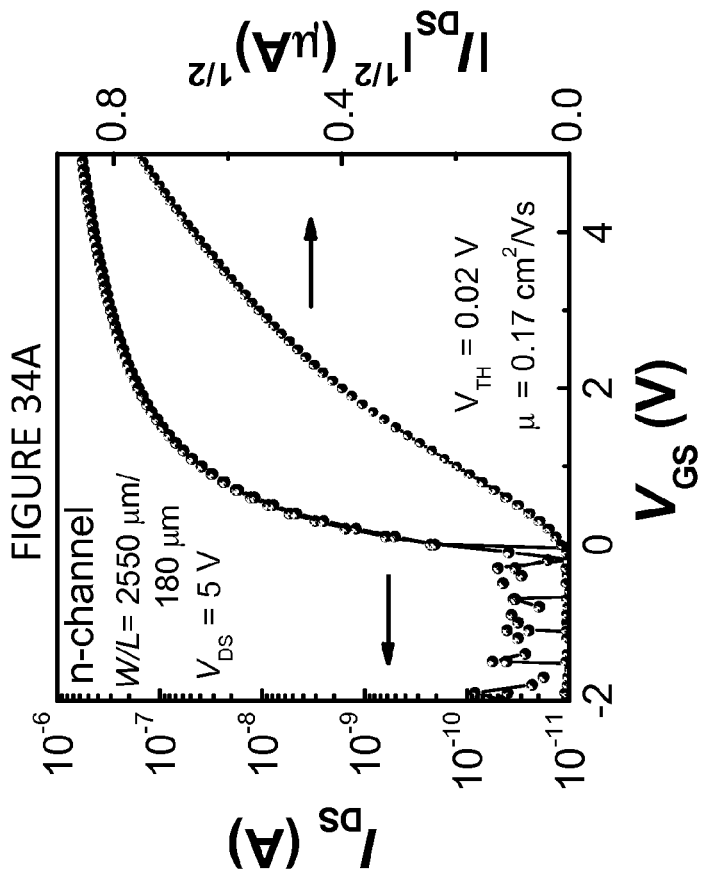

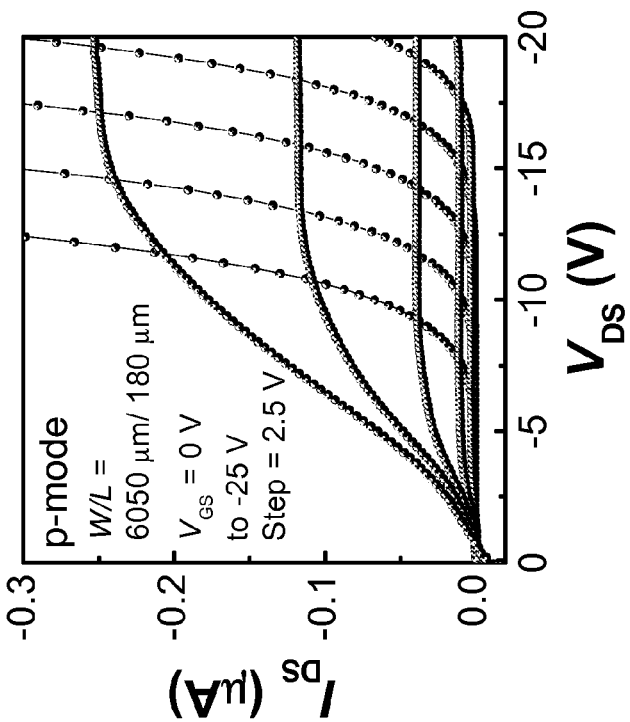
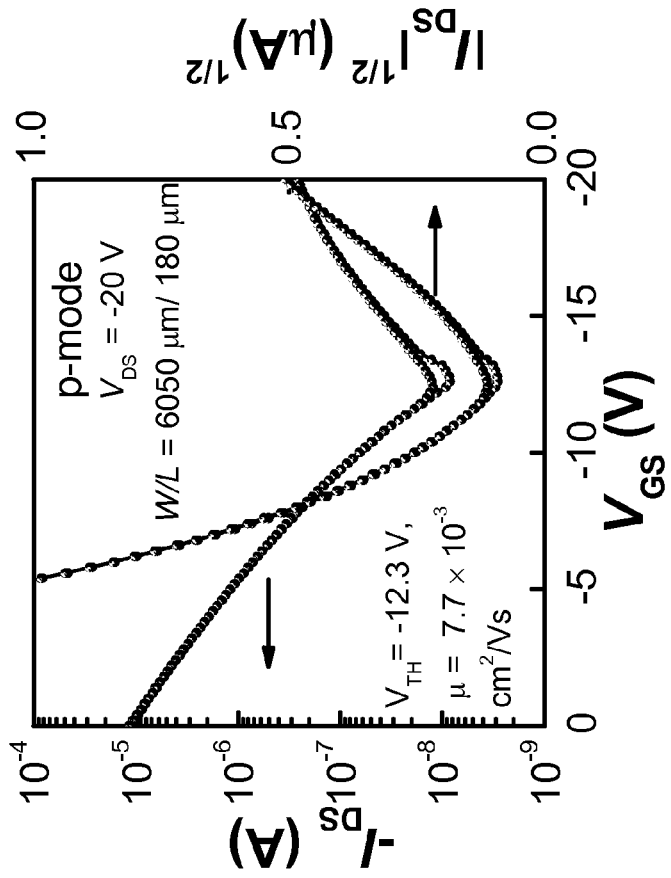
FIGURE 36A
FIGURE 36B

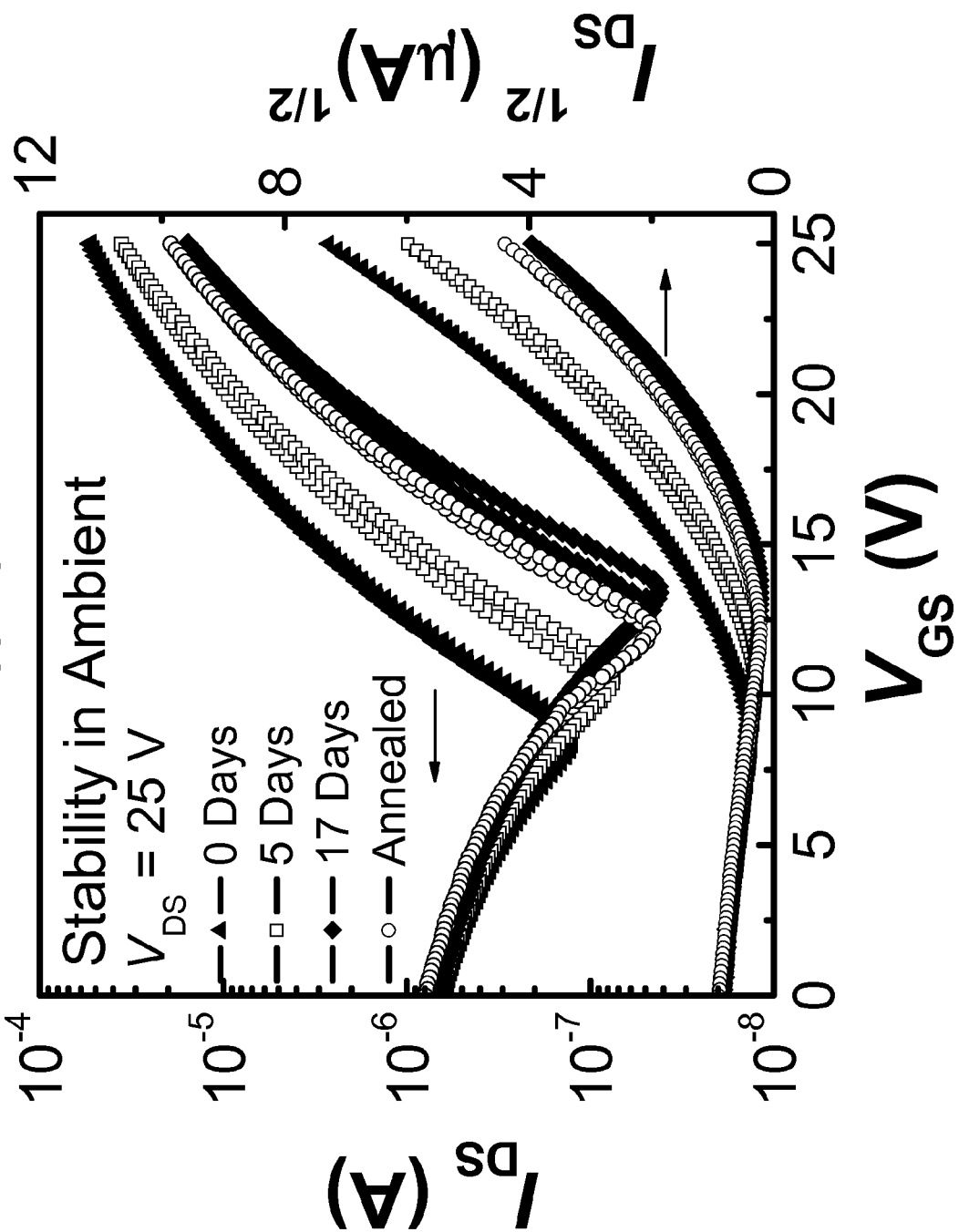

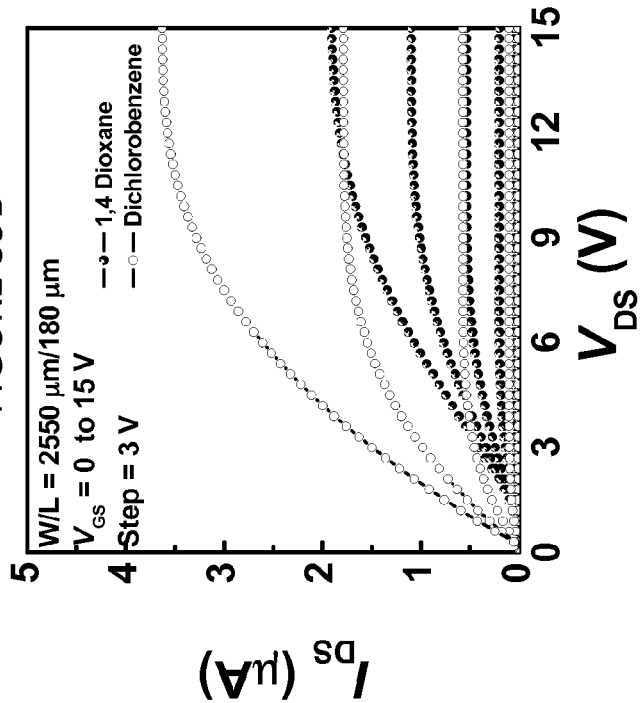
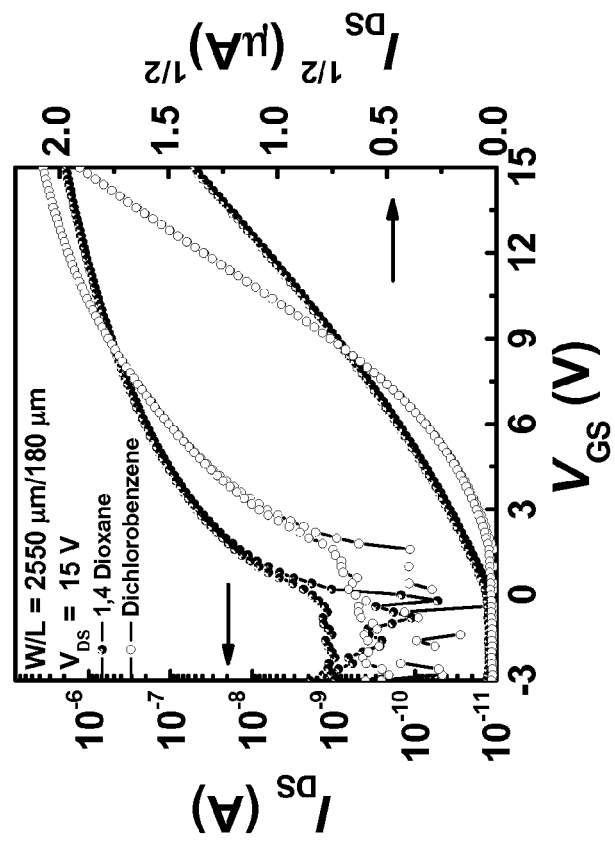
FIGURE 39A
FIGURE 39B

MULTI-LAYER GATE DIELECTRIC FIELD-EFFECT TRANSISTOR AND MANUFACTURING PROCESS THEREOF

STATEMENT OF GOVERNMENT LICENSE RIGHTS

The inventors received partial funding support through the STC Program of the National Science Foundation under Agreement Number DMR-0120967 and the Office of Naval Research through Contract Award Number N00014-04-1-0120. The Federal Government has certain license rights in this invention.

BACKGROUND

1. Field of the Invention

The present invention relates to a field-effect transistor, a manufacturing process thereof and a circuit comprising a plurality of such transistors.

2. Description of the Related Art

Over the last several years, organic and mixed transition metal oxide semiconductor channel based field-effect transistors (FETs) have been extensively studied because they can potentially lead to low-end consumer electronic applications that can be produced at a very low cost on large areas, and on flexible or free-form substrates.

Two critical aspects for the realization of these technologies relate to: 1) the environmental and electrical stability of FETs; and 2) to its low voltage operation. The most common sign of device degradation manifests itself as a threshold voltage shift upon prolonged gate bias stress. Other changes that could arise under bias stress are an increase in the sub-threshold slope, reductions of the field-effect mobility, an increase in the OFF current and/or hysteresis between subsequent measurements.

Emerging FET technologies such as those based on organic or transition metal oxide semiconductors suffer from electrical instabilities but offer some advantages over Si-based technologies in that they can be processed at lower temperatures and potentially at a lower cost. In the literature, several routes have been taken to improve the stability of FETs and can be summarized as follows: 1) passivation of gate dielectric/semiconductor interface 2) variation of gate dielectric materials; 3) annealing at high temperatures; 4) variation of source and drain metal electrodes. Among the wide variety of materials used as gate dielectric, fluoropolymers, such as CYTOP, have shown potential to produce interfaces with organic semiconductors with very low trap densities. WO03/052841 in the name of Avecia Ltd (hereby incorporated by reference in its entirety) discloses a process of manufacturing such organic field-effect transistors, where CYTOP has been used in combination with one or more further insulator layers. However, polymers have typically a very low dielectric constant. The latter in conjunction with a large thickness required to avoid large leakage currents, results in a low capacitance density. On the other hand, gate dielectrics with high capacitance can be achieved through the use of inorganic high-k dielectric materials. However, in general the performance of the known devices with a multi-layer dielectric in bias stress tests is unacceptable for many applications.

D. K. Hwang et al., "Top-Gate Organic Field-Effect Transistors with High Environmental and Operational Stability," *Adv. Mater.* 23, 1293-1298 (2011); D. K. Hwang et al., "Flexible and stable solution-processed organic field-effect transistors," *Organic Electronics*, 12, 1108 (2011); and D. K. Hwang et al., "Hysteresis mechanisms of pentacene thin-film transistors with polymer/oxide bilayer gate dielectrics," *Appl. Phys. Lett.* 92, 013304 (2008) are hereby incorporated by reference in their entireties.

SUMMARY OF THE INVENTION

The object of the invention is to provide a FET having high electrical stability that at the same time can operate at low voltages. More in particular the object of the invention is to provide a FET with an improved performance under continuous bias stress.

According to an embodiment of the invention there is provided a field-effect transistor comprising a gate, a source and a drain. A semiconductor layer extends between said source and said drain, and there is provided a gate insulator between the gate and the semiconductor layer. The gate insulator comprises a first layer and a second layer. The first layer has a first dielectric constant and a first thickness and touches the semiconductor layer along an interface. The interface comprises a plurality of traps causing a first effect on a current between the drain and the source over time under continuous bias stress. The second layer has a second dielectric constant and a second thickness and the second dielectric constant is higher than the first dielectric constant. The second layer is arranged such that said second dielectric constant increases over time under continuous bias stress causing a second effect on the current between the drain and the source over time under continuous bias stress. The first and second thickness and the first and second dielectric constant are such that said first effect compensates at least partly said second effect.

Applying a continuous bias stress means that a drain voltage and gate voltage corresponding to the normal operation of a FET are applied for a long period of time (e.g. one hour). For example for a typical DC bias stress test, the drain and gate voltage could be equal and a couple of volts higher than the threshold voltage of the FET.

According to an embodiment of the invention said first effect on the current between the drain and the source over time under continuous bias stress consists in an increase of the current over time while said second effect on the current between the drain and the source over time under continuous bias stress consists in a decrease of this current. The first and second thickness and the first and second dielectric constant are such that the increase over time compensates at least partly the decrease over time. In that way the variation of the current between the drain and the source over time under continuous bias stress remains within a limited range. Preferably said variation is less than three percent of the initial current when applying a continuous bias for 1 hour.

According to an embodiment of the invention the variation of the current between the drain and the source under continuous bias stress (wherein the drain and gate voltage with respect to the source voltage are at least 0.5V above the threshold voltage, i.e. $|V_G|$, $|V_D|>|V_{th}|+0.5V$) for 1 hour is less than 5 percent, preferably less than 3 percent. More preferably this variation is less than 5 percent, preferably less than 3 percent, for 2 hours.

According to an embodiment of the invention the first and second thickness and the first and second dielectric constant are such that the variation of the current between the source and the drain normalized to the initial current at the end of a DC bias test of one hour (wherein the drain and gate voltage with respect to the source voltage are at least 0.5V above the threshold voltage, i.e. $|V_G|$, $|V_D|>|V_{th}|+0.5V$) is less than 0.03 per hour, preferably less than 0.015 per hour.

According to a preferred embodiment of the invention the second layer comprises dipoles causing an increase of the second dielectric constant over time under continuous bias stress. In that way, by introducing dipoles in the second layer, the second effect can be influenced in order to obtain an optimal compensation of the first and second effect. In a further embodiment the dipoles produce a change of polarization which compensates for the threshold voltage shifts produced by trapping at the interface between the semiconductor layer and the first layer. The second layer can e.g. be an organic layer in which dipolar molecules have been introduced.

According to a preferred embodiment the second dielectric layer is chosen such that it changes its polarizability as the device is exposed longer to a DC electrical bias, such that it compensates the changes in threshold voltage produced by trapping at the interface between the semiconductor layer and the first layer.

It is noted that the field-effect transistor of the invention can be a top gate transistor or a bottom gate transistor. Further the transistor can be an n-channel, a p-channel or ambipolar transistor.

According to another embodiment the field-effect transistor comprises a gate, a source, a drain, a semiconductor layer between said source and said drain and a gate insulator between said gate and said semiconductor layer. The gate insulator comprises a first layer adjoining said semiconductor layer; and a second layer. The first layer having a first thickness is formed from an amorphous fluoropolymer having a first dielectric constant. The second layer has a second dielectric constant and a second thickness. The first dielectric constant is smaller than 3, and the first thickness being smaller than 200 nm. The second dielectric constant is higher than 5 and the second thickness is smaller than 500 nm. In a preferred embodiment the second thickness is smaller than 300 nm. In another embodiment, the second thickness is less than 50 nm.

According to a preferred embodiment the first layer is formed from an amorphous fluoropolymer having a glass transition temperature above 80 degrees Celsius. According to a preferred embodiment the second layer is formed from an inorganic material. With such a gate insulator high capacitance density and low leakage currents can be achieved by combining a fluoropolymer layer with an inorganic dielectric layer with a higher-k. Also, the interface between the fluoropolymer and the semiconductor layer significantly reduces the interfacial trap density, reducing polar interactions at this interface. This typically leads to negligible hysteresis effects. In a top gate geometry such a bi-layer typically also acts as a barrier coating that can significantly reduce the diffusion of oxygen and moisture into the semiconductor layers, therefore improving the overall FET stability. The combined properties offered by this multilayer gate insulator can therefore be applied to a variety of semiconductor materials. Furthermore, this multilayer gate structure serves as an efficient protection layer when the FETs are subjected to extreme conditions such as oxygen plasma, and immersion in water or common organic solvents, such as acetone. This will allow the use of a photolithography process to pattern the metal gate.

According to an embodiment the first layer is formed of a copolymer of fluorinated 1,3-dioxole and tetrafluoroethylene (TFE), having the formula:

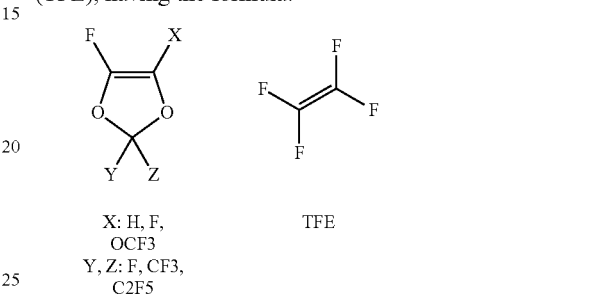

X: H, F, OCF3
Y, Z: F, CF3, C2F5

TFE

An example thereof is a copolymer of 4,5-difluoro-2,2-bis(trifluoromethyl)-1,3-dioxole (PDD) and tetrafluoroethylene (TFE) such as TEFLON AF with X: F; Y, Z: $CF_3$ and for example TEFLON AF 1600 (65% mol PDD, Tg 160° C., permittivity 1.93) or AF 2400 (87% mol PDD, Tg 240° C., permittivity 1.90). Another example is a copolymer of 2,2,4-trifluoro-5-trifluoromethoxy-1,3-dioxole (TTD) and tetrafluoroethylene (TFE), such as HYFLON AD with X: $OCF_3$; Y, Z: F, and for example HYFLON AD40 (40% mol in TDD, Tg 95° C.) or AD60 (60% mol in TDD, Tg 125° C.).

According to another embodiment the first layer is formed of an alternating copolymer of perfluorofuran (PFF) and tetrafluoroethylene (TFE); or a homo- or copolymer of perfluoro(4-vinyloxyl)-1-alkenes, as shown in the formula below:

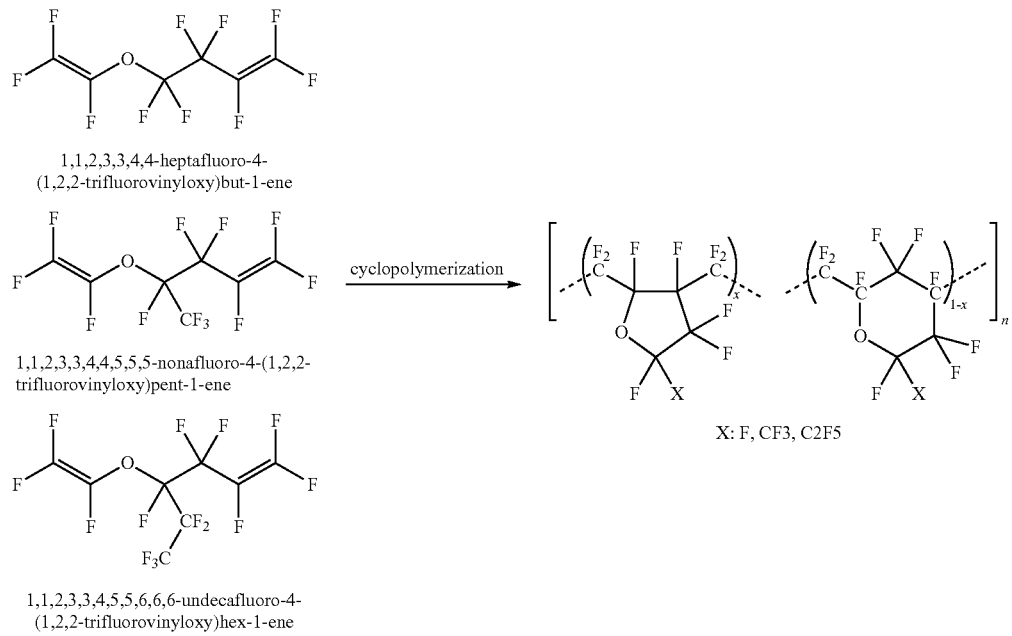

1,1,2,3,3,4,4-heptafluoro-4-(1,2,2-trifluorovinyloxy)but-1-ene 1,1,2,3,3,4,4,5,5-nonafluoro-4-(1,2,2-trifluorovinyloxy)pent-1-ene cyclopolymerization

X: F, CF3, C2F5

1,1,2,3,3,4,5,5,6,6,6-undecafluoro-4-(1,2,2-trifluorovinyloxy)hex-1-ene or a PFF derivative having the structure below:

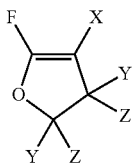

X: H, F,
OCF3
Y, Z: F,
CF3, C2F5

Suitable commercially available materials of this type can be found in the CYTOP class. An example is CYTOP grade CTL-809M supplied by Asahi Glass Corporation, Co. Ltd.

According to a preferred embodiment, the inorganic material of the second layer comprises any one of the following materials, or a combination thereof: $Al_2O_3$, $SiN_x$, $TiO_2$, $HfO_2$, $Ta_2O_5$, $SiO_2$, $Y_2O_3$, $ZrO_2$ or any other suitable material. A particularly preferred material is $Al_2O_3$. According to another embodiment the second layer is fabricated from an organic material, and for example any one of the following materials: polymers comprising a polymer matrix having a charge distribution with orientable and/or inducible dipoles or a polymer matrix doped with molecules with permanent dipoles. The presence of such permanent or inducible dipoles will cause the dielectric constant of the second layer to vary over time under continuous bias stress as a consequence of a varying electric field over the second layer. Hence, by an appropriate choice of materials with dipole behavior for the second layer, the above mentioned second effect can be reached.

According to a preferred embodiment the second layer is deposited by any one of the following techniques: atomic layer deposition (ALD), electron beam deposition, RF-sputtering, chemical vapor deposition (CVD or PECVD), pulsed-layer deposition (PLD), spin-coating, printing, lamination, doctor-blading or any other known suitable method. A particularly preferred technique is atomic layer deposition (ALD). $Al_2O_3$ has a high relative dielectric constant and ALD makes it possible to deposit a very thin layer thereof. In that way a device can be obtained with a sufficiently high capacitance density allowing low voltage operation.

According to a preferred embodiment the thickness of the first layer is less than 200 nm, preferably less than 100 nm, and more preferably less than 50 nm. According to a preferred embodiment the thickness of the second layer is less than 500 nm, preferably less than 100 nm, and more preferably less than 50 nm. Typically, it is preferred to have a small thickness, however guaranteeing a sufficiently low leakage current and an improved stability under continuous bias stress. More in particular the choice of the thickness will typically depend on the interplay between the first and second thickness, and the first and second dielectric constant and on the threshold voltage shift in function of time under continuous bias stress that is produced at the interface between the first layer and the semiconductor layer.

According to a preferred embodiment the gate insulator is a bi-layer consisting of the first and second layer.

According to a preferred embodiment the gate insulator further comprises a third layer between the second layer and the gate. In a bottom-gate FET, this third layer will typically be deposited on top of the semiconductor layer to protect it from air. Such a third layer can further improve the barrier properties. The third layer can be formed from any barrier coating material such as an amorphous fluoropolymer which functions as a passivation layer for the underlying inorganic dielectric layer. The thickness of the third layer is preferably less than 100 nm, more preferably less than 50 nm, and most preferably less than 25 nm. For very specific applications, it is possible to use more than three layers, but usually it is preferred to limit the thickness of the gate insulator.

According to a preferred embodiment the semiconductor layer is an organic semiconductor layer, wherein the material of the first layer is soluble in an orthogonal solvent. Solvent orthogonality between fluoropolymers and commonly used organic semiconducting layers makes it possible to spin coat on top of the organic channel layer in case of a top gate geometry. According to a preferred embodiment the semiconductor layer is an organic semiconductor layer selected from any one of the following materials: a pentacene layer, a blend of triisopropylsilylethynyl (TIPS)-pentacene in polytriarylamine (PTAA), or a blend of 5,11-Bis(triethylsilylethynyl) anthradithiophene (diF-TESADT) in PTAA. According to another embodiment the semiconductor layer is an inorganic semiconductor layer, such as a transition metal oxide.

According to a preferred embodiment the second relative dielectric constant is higher than 5, preferably higher than 7.

The invention further relates to a circuit, e.g. a backplane circuit for a display, an inverter circuit, a ring oscillator, a logic gate, etc, comprising a plurality of field effect transistors according to any one of the embodiments disclosed above.

A further embodiment of the invention provides a process for manufacturing a top gate field-effect transistor comprising providing a source, a drain, a gate, a semiconductor layer between the source and the drain, and a gate insulator between said gate and said semiconductor layer. The providing of the gate insulator comprises depositing a first layer having a first dielectric constant and a first thickness. The first layer defines an interface with the semiconductor layer. The depositing of the first layer and the providing of the semiconductor layer is such that the interface comprises a plurality of traps causing a first effect on the drain source current over time under continuous bias stress. The providing of the gate insulator also comprises depositing a second layer having a second dielectric constant and a second thickness, said second dielectric constant being higher than said first dielectric constant and said second dielectric constant increasing over time under continuous bias stress causing a second effect on the drain source current over time under continuous bias stress. The first and second thickness and said first and second dielectric constant are chosen in such a way that the first effect compensates at least partly the second effect.

According to a preferred embodiment of the process, the source and drain are patterned on a glass substrate and the semiconductor layer is deposited on said glass substrate burying the source and the drain.

According to a preferred embodiment of the process, the gate insulator is provided on top of a substrate and the semiconductor layer is deposited on top of the gate insulator.

According to a preferred embodiment of the process, the first layer is deposited by spin coating using a fluoro-solvent in combination with an amorphous fluoropolymer.

According to a preferred embodiment of the process, the second layer is deposited by atomic layer deposition (ALD).

According to a preferred embodiment of the process, the providing of the gate insulator further comprises depositing a third layer of an amorphous fluoropolymer on top of said second layer.

In another embodiment, a composition is provided comprising at least one electron transport semiconductor and at least one polymer matrix. In one embodiment, the electron transport organic semiconductor has a molecular weight of about 1,000 or less. In one embodiment, the polymer is a hole transporting material. In one embodiment, the polymer comprises an arylamine. In one embodiment, the polymer is an optionally substituted polystyrene, such as poly(α-methyl styrene). The amount of polymer can be, for example 10 wt. % to 90 wt. %, and the amount of semiconductor can be, for example, 10 wt. % to 90 wt. %.

BRIEF DESCRIPTION OF THE DRAWINGS

FIGS. 1A and 1B are schematic section views of a top gate field-effect transistor (FET) and of a bottom gate FET, respectively, according to a first embodiment of the invention.

FIG. 2 is a schematic section view of a FET according to a second embodiment of the invention.

FIGS. 11A, 11B and 11C shows the temporal evolution of the $I_{DS}$ measured in different OFETs normalized to the initial value before air exposure, after air exposure for 31 days and after air exposure for 31 days and $O_2$ plasma for 5 minutes, respectively; FIG. 11D shows a transfer and output characteristics before and after DC bias stress for the device of FIG. 4A; and FIG. 11E shows the temporal evolution of the $I_{DS}$ over 24 h of electrical bias stress measured in an OFET with a CYTOP (40 nm)/$Al_2O_3$ (50 nm) film under various conditions.

FIGS. 13A-13B show the transfer and output characteristics, measured from pristine devices under a nitrogen atmosphere, of OFETs (W/L=2550 μm/180 μm) using a CYTOP (40 nm)/$Al_2O_3$ (50 nm) gate dielectric and a plastic (PES) substrate.

FIG. 14A shows the temporal evolution of the $I_{DS}$ during DC bias stress measured in OFETs (W/L=2550 μm/180 μm) using a CYTOP (40 nm)/$Al_2O_3$ (50 nm) gate dielectric and a plastic (PES) substrate, normalized to the initial value. FIGS. 14B and 14C show the transfer and output characteristics of the plastic substrate OFET after being subjected to the DC bias stress.

FIGS. 15A and 15B show the transfer and output characteristics of OFETs (W/L=2550 μm/180 μm) using a CYTOP (40 nm)/$Al_2O_3$ (50 nm) gate dielectric and a plastic (PES) substrate initially, after 4 months in air, and after bending for 30 minutes (tensile stress).

FIGS. 16A-16C illustrate $O_2$ and $H_2O$ effects on threshold voltage shift in the transfer characteristics of OFETs (FIGS. 16A and 16B) and the variation of drain current under constant dc bias stress (FIG. 16C)

FIGS. 19A and 19B show the variation in capacitance for frequencies ranging from 20 Hz to 1 million Hz, for the CYTOP/$Al_2O_3$ bi-layer OFET (45 nm CYTOP; 50 nm $Al_2O_3$) (FIG. 19A) and the CYTOP/$Al_2O_3$/CYTOP tri-layer OFET (20 nm CYTOP; 50 nm $Al_2O_3$; 20 nm CYTOP) (FIG. 19B), at each stage of the exposure sequence of FIG. 17.

FIGS. 21A and 21B show the transfer characteristics and temporal evolution of the $I_{DS}$ during DC bias for a diF-TESADT and PTAA blend channel based OFET with a CYTOP/$Al_2O_3$ bi-layer (45 nm CYTOP; 50 nm $Al_2O_3$), after each stage of the exposure sequence of FIG. 17.

FIGS. 23A-23D show the capacitance and current density-electric field (J-E) characteristics of capacitors with varying fluoropolymer bi-layers.

FIGS. 24A and 24B show the transfer characteristic and output characteristics for a CYTOP (45 nm)/Al$_2$O$_3$ (50 nm) bi-layer OFET. FIGS. 24C and 24D show the transfer characteristic and output characteristics for a Hyflon (45 nm)/Al$_2$O$_3$ (50 nm) bi-layer OFET. FIGS. 24E and 24F show the transfer characteristic and output characteristics for a Teflon (45 nm)/Al$_2$O$_3$ (50 nm) bi-layer OFET. FIGS. 24K and 24L show the transfer characteristic and output characteristics for a Hyflon (45 nm)/S$_i$N$_x$ (50 nm) bi-layer OFET. FIGS. 24M and 24N show the transfer characteristic and output characteristics for a Teflon (45 nm)/S$_i$N$_x$ (50 nm) bi-layer OFET. FIGS. 24O and 24P show the transfer characteristic and output characteristics for a CYTOP (20 nm)/S$_i$N$_x$ (50 nm)/CYTOP (20 nm) tri-layer OFET.

FIGS. 25A and 25B show the drain current $I_{DS}$ with respect to gate voltage $V_{GS}$ for the pentacene and InGaZnO FETs of FIG. 4G after 500 consecutive sweeps. FIG. 25C shows the temporal evolution of the $I_{DS}$ measured in the pentacene and InGaZnO FETs, normalized to the initial value, under DC bias stress over 60 minutes.

FIGS. 29A and 29B show the transfer characteristics and output characteristics of a Polyera ActivInk N2200 based OFET with a CYTOP/Al$_2$O$_3$ bi-layer (45 nm CYTOP; 50 nm Al$_2$O$_3$) and evaporated Au source/drain electrodes, as discussed in Example 12.

FIGS. 33A and 33B show the transfer characteristics and output characteristics of an LEH-III-002a based OFET with a CYTOP/Al$_2$O$_3$ bi-layer (45 nm CYTOP; 50 nm Al$_2$O$_3$) and Au bottom contact source/drain electrodes in p-mode operation.

FIGS. 34A and 34B show the transfer characteristics and output characteristics of an LEH-III-085g based OFET with a CYTOP/Al$_2$O$_3$ bi-layer (45 nm CYTOP; 50 nm Al$_2$O$_3$) and Al bottom contact source/drain electrodes.

FIGS. 36A and 36B show the transfer characteristics and output characteristics of an LEH-III-085g:PαMS based OFET with a CYTOP/Al$_2$O$_3$ bi-layer (45 nm CYTOP; 50 nm Al$_2$O$_3$) and Ag bottom contact source/drain electrodes in p-mode operation.

FIGS. 37A and 37B show the results of an ambient exposure study on the LEH-III-119a based OFET with a CYTOP/Al$_2$O$_3$ bi-layer (45 nm CYTOP; 50 nm Al$_2$O$_3$) and Au bottom contact source/drain electrodes.

FIGS. 39A and 39B show the transfer characteristics and output characteristics of a DRR-IV-209n based OFET with a CYTOP/Al$_2$O$_3$ bi-layer (45 nm CYTOP; 50 nm Al$_2$O$_3$).

DETAILED DESCRIPTION OF PREFERRED EMBODIMENTS

Figure 4A:
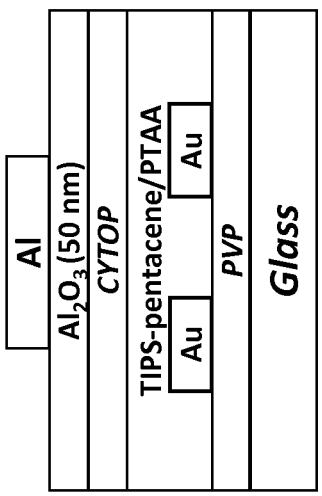
FIG. 4A shows a section view of a field-effect transistor with a CYTOP/$Al_2O_3$ dielectric.

FIG. 1A illustrates a first embodiment of a top gate field-effect transistor (FET) according to the invention. The illustrated FET embodiment comprises a substrate 101, a semiconductor layer 102, a source and a drain 109 buried or in contact with in the semiconductor layer, a gate insulator 103, 104 on top of the semiconductor layer 102, and a gate 110 on top of the gate insulator. The gate insulator comprises a first layer 103 formed from a first material, e.g. an amorphous fluoropolymer and a second layer 104 formed from a second dielectric material, typically a high-k dielectric. The source and drain electrode 109 are typically patterned on the substrate 101, and the layer of semiconductor material 102 is deposited over the source and drain electrodes 109. Note that the top gate structure could be staggered (as illustrated in FIG. 1A) or coplanar where the source and drain 109 touch the gate insulator layer 103. The top gate metal electrode 110 is typically patterned on the second layer 104. FIG. 1B illustrates a similar embodiment for a bottom gate FET with a substrate 101', a gate 110', a bi-layer gate dielectric 103',104', a semiconductor layer 102' and a drain and source 109'.

The thickness of the first layer 103, 103' is preferably less than 200 nm, more preferably less than 100 nm, and most preferably less than 50 nm. Further, preferably the thickness of the second layer 104, 104' is less than 500 nm, more preferably less than 100 nm, and most preferably less than 50 nm.

The use of an amorphous fluoropolymer/high-k oxide bi-layer combines the good chemical properties of amorphous fluoropolymer with the high film quality and large capacitance density of high-k oxides. In addition, for the top gate geometry, this bi-layer gate dielectric also has better encapsulation properties against environmental exposure than a single layer amorphous fluoropolymer.

The material of the first layer can e.g. be any one of the following materials: a copolymer of fluorinated 1,3-dioxole and tetrafluoroethylene (TFE), such as a copolymer of 4,5- difluoro-2,2-bis(trifluoromethyl)-1,3-dioxole (PDD) and tetrafluoroethylene (TFE) or a copolymer of 2,2,4-trifluoro-5-trifluoromethoxy-1,3-dioxole (TTD) and tetrafluoroethylene (TFE); a copolymer of perfluorofuran (PFF) and tetrafluoroethylene (TFE); a homo- or copolymer of perfluoro(4-vinyloxyl)-1-alkenes. The first layer can e.g. be deposited from a formulation with the fluoropolymer and one or more fluorosolvents by any one of the following printing or coating techniques: spin coating, doctor blading, wire bar coating, spray or dip coating, ink jet printing, gravure printing, flexo printing, or any other known suitable method.

The dielectric material of the second layer is preferably a high-k inorganic dielectric, and can e.g. be any one of the following materials: $Al_2O_3$, $SiN_x$, $TiO_2$, $HfO_2$, $Ta_2O_5$, $SiO_2$, $Y_2O_3$, $ZrO_2$, any other suitable materials. Alternatively the second layer can be formed from an organic material, and for example any one of the following materials: polymers comprising orientable and/or inducible dipoles or a polymer matrix doped with molecules with permanent dipoles. The second layer can e.g. be deposited by any one of the following techniques: atomic layer deposition (ALD), electron beam deposition, RF-sputtering or plasma-enhanced chemical vapor deposition, pulsed laser deposition (PLD), or any other known suitable technique. According to a preferred embodiment the second layer is an $Al_2O_3$ layer deposited by ALD.

The semiconductor layer can be either an organic or an inorganic semiconductor layer. An example of an organic layer is a TIPS-pentacene and Poly (triarylamine) (PTAA) layer, a pentacene layer, a rubrene layer, a TIPS-pentacene and $PCBMC_{60}$ layer. Such a layer may e.g. be applied by spin-coating or any suitable printing or coating technique, by physical vapor deposition, by organic vapor phase deposition, or any other known vacuum deposition method. An example of an inorganic layer is a transition metal oxide such as an InGaZnO, ZnO, InZnO, GaZnO, $In_2O_3$, or any other know suitable semiconductor including amorphous silicon and poly-silicon.

The substrate 101 is typically a rigid or flexible substrate such as rigid glass, flexible glass, Si wafer, PET, PES, PEN, Polyimide, metal foil substrates.

Figure 3:
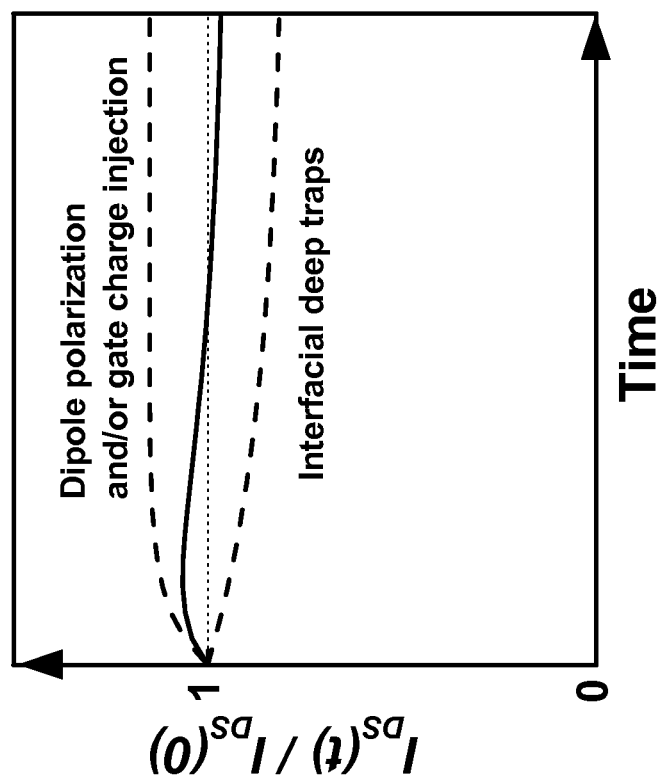
FIG. 3 illustrate the first, second, and third effects influencing the drain current under continuous bias stress in an embodiment of a FET according to the invention.

Such a gate dielectric is intended to provide a change of polarizability under a continuous DC bias that compensates the change in the threshold voltage produced by trapping at the semiconductor layer 102, 102' or at the interface between the semiconductor layer and the first layer 103, 103', improving the electrical stability. This is illustrated in FIG. 3. The instability mechanisms that influence the drain source current in a FET with a bi-layer dielectric are amongst others:
- the interfacial (shallow or deep) traps at the interface between the semiconductor layer and the first layer;
- gate charge injection at the interface between the gate electrode and the gate dielectric;
- dipole polarization or mobile impurity moving in the second layer;
- the bulk traps inside the semiconductor layer.

The interfacial traps (first effect), gate charge injection (second effect), and dipole polarization (third effect) play a major role on the drain source current in function of time under continuous bias stress, see FIG. 3. The first effect causes a decrease of the current while the second and third effects cause an increase of the current. According to an embodiment of the invention the thicknesses t1 and t2 of the first and second layer and the dielectric constants k1 and k2 are chosen such that those effects at least partially compensate each other, see the current curve drawn in a full line in FIG. 3.

FIG. 2 illustrates a second embodiment of a FET according to the invention which is similar to the first embodiment (the elements 101-104, 109, 110 correspond with the elements 201-204, 209, 210) with this difference that a third layer 205 is added above the second layer. The third layer 205 is preferably formed of an amorphous fluoropolymer. Such a third layer forms a passivation layer for the underlying inorganic dielectric layer 204 which can lead to a better long term stability. The thickness of the third layer 205 is preferably less than 100 nm, more preferably less than 50 nm, and most preferably less than 25 nm. This thickness can be further optimized to further improve the above described compensation effect. Note however that it is usually preferred to keep the gate insulator as thin as possible, and the stability of the bi-layer gate insulator illustrated in FIG. 1A will typically provide sufficient stability.

EXAMPLE 1

TIPS-Pentacene and Poly (Triarylamine) (PTAA) Blend Channel Based OFET with CYTOP/$Al_2O_3$ Bi-Layer Using Glass Substrate (40 nm CYTOP; 50 nm $Al_2O_3$)

Figure 4C:
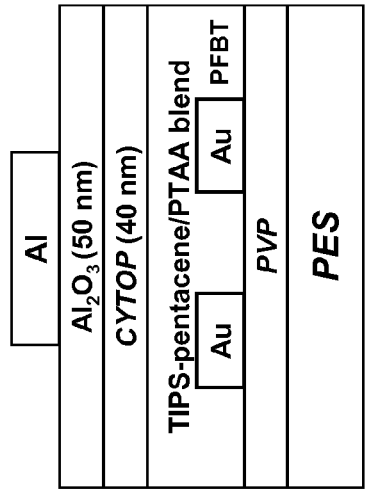
FIG. 4C shows a section view of a TIPS-pentacene and PTAA blend channel based OFET with a CYTOP/$Al_2O_3$ bi-layer using a plastic substrate.

OFETs with a bottom-contact and top-gate structure were fabricated on glass substrates (Corning 1737). Poly-4-vinylphenol (PVP) buffer layers were prepared from 2 wt. % solutions of PVP ($M_w$~20,000) and poly (melamine-co-formaldehyde), as a cross-linking agent, in propylene glycol monomethyl ether acetate (PGMEA), which were deposited by spin coating at 3000 rpm for 40 sec and subsequently cross-linked at 175° C. on a hot plate for 1 h in a $N_2$-filled glove box. Au (50 nm) bottom-contact source/drain electrodes were deposited by thermal evaporation through a shadow mask. A self-assembled monolayer of pentafluorobenzenethiol (PFBT) was formed on the Au electrodes by immersion in a 10 mmol PFBT solution in ethanol for 15 min in a $N_2$-filled dry box, rinsing with pure ethanol, and drying. The TIPS-pentacene and PTAA blend solution was prepared as follows: TIPS-pentacene and PTAA were individually dissolved in 1,2,3,4-Tetrahydronaphthalene anhydrous, 99%, (Sigma Aldrich) for a concentration of 30 mg/mL and the two individual solutions were mixed to yield a weight ratio of 1:1. TIPS-pentacene and PTAA blend active layers were deposited by spin coating at 500 rpm for 10 sec and at 2000 rpm for 20 sec. Then, samples were dried at room temperature for 5 min and annealed at 40° C. for 16 h and at 100° C. for 15 min in a $N_2$-filled dry box. CYTOP (40 nm)/$Al_2O_3$ (50 nm) layers were used as top-gate dielectrics. CYTOP solution (CTL-809M) was purchased from Asahi Glass with a concentration of 9 wt. %. To deposit the 40 nm-thick CYTOP layers, the original solution diluted with their solvents (CT-solv. 180) to have solution:solvent ratios of 1:3.5. The 40 nm-thick CYTOP layers were deposited by spin casting at 3000 rpm for 60 sec. The CYTOP (40 nm) films were annealed at 100° C. for 20 min. All spin coating and annealing processes were carried out in a $N_2$-filled dry box. Then, the $Al_2O_3$ dielectric films (50 nm) were deposited on top of the CYTOP layer using a Savannah 100 ALD system from Cambridge Nanotech Inc. Films were grown at 110° C. using alternating exposures of trimethyl aluminum [$Al(CH_3)_3$] and $H_2O$ vapor at a deposition rate of approximately 0.1 nm per cycle. Finally, Al (150 nm) gate electrodes were deposited by thermal evaporation through a shadow mask. The resulting OFET is depicted in FIG. 4B.

EXAMPLE 2

Pentacene Channel Based OFET

The top gate pentacene OFETs were fabricated with a geometry incorporating a bottom source/drain electrodes. Au (80 nm) bottom contact source/drain electrodes were deposited by electron-beam (e-beam) at room temperature on a glass substrate through a shadow mask. A pentacene active layer (50 nm) was then deposited by thermal evaporation at room temperature through a shadow mask. CYTOP (40 nm)/ $Al_2O_3$ (50 nm) layers were used as a top gate dielectric. CYTOP (40 nm) layers were coated by spin casting at 3000 rpm for 60 seconds. The CYTOP films were annealed at 100° C. for 20 min. $Al_2O_3$ dielectric films were grown at 110° C. using alternating exposures of trimethyl aluminum [Al $(CH_3)_3$] and $H_2O$ vapor at a deposition rate of approximately 0.1 nm per cycle. Then, Al electrode was sequentially deposited by e-beam to form the gate electrode.

EXAMPLE 3

InGaZnO Channel Based Oxide FET

The top gate amorphous InGaZnO FET was fabricated with a geometry incorporating a bottom source/drain electrodes. First, a tri-layer of Ti (6 nm)/Au (50 nm)/Ti (6 nm) was deposited using electron-beam (e-beam) at room temperature on a glass substrate (Corning 1737) and patterned by photolithography followed by a lift-off process. A 40 nm-thick a-IGZO ($Ga_2O_3$:$In_2O_3$:ZnO=1:1:2 mol %) active layer was then deposited by radio frequency (RF) sputtering. After deposition of the a-IGZO layer, the device was annealed. To define the channel, the a-IGZO layer was patterned by a wet-etching process using hydrochloric acid (HCl:$H_2O$=1: 100) diluted in DI water. CYTOP (40 nm)/$Al_2O_3$ (50 nm) layers were used as top gate dielectrics. $Al_2O_3$ dielectric films were grown at 110° C. using alternating exposures of trimethyl aluminum [Al$(CH_3)_3$] and $H_2O$ vapor. For 40 nm CYTOP layer, a 2 wt % solution was used, which was diluted with solvent. CYTOP (40 nm) layers were coated by spin casting at 3000 rpm for 60 seconds. The CYTOP films were annealed at 100° C. for 20 min. Then, Ti (6 nm) and Au (120 nm) were sequentially deposited by e-beam and patterned by photolithography and lift-off process to form the gate electrode.

EXAMPLE 4

TIPS-Pentacene and PTAA OFET with CYTOP/$SiN_x$ Bi-Layer

Example 4 is identical to example 1, with this difference that, instead of depositing $Al_2O_3$ using an ALD process, an $SiN_X$ material is deposited by plasma-enhanced chemical vapor deposition (PECVD) at a process temperature of 110° C. Note that it is also possible to work at a higher temperature depending on the glass transition temperature of the fluoropolymer and semiconductor layer in the case of an amorphous semiconductor layer.

EXAMPLE 5

TIPS-Pentacene and PTAA OFET with Hyflon/$Al_2O_3$ Bi-Layer

Example 5 is identical to example 1, with this difference that, instead of depositing CYTOP, a 40 nm layer of Hyflon AD 40X material is deposited.

EXAMPLE 6

TIPS-Pentacene and PTAA OFET with Teflon/$Al_2O_3$ Bi-Layer

Example 6 is identical to example 1, with this difference that, instead of depositing CYTOP, a 40 nm layer of Teflon material is deposited.

Although the examples above relate to top gate FETs, the skilled person will understand that bottom gate FETs can be fabricated in a more or less similar way.

EXAMPLE 7

TIPS-Pentacene and Poly (Triarylamine) (PTAA) Blend Channel Based OFET with CYTOP/$Al_2O_3$ Bi-Layer Using Plastic Substrate OFETs with a bottom-contact and top-gate structure were fabricated on a flexible polyethersulfone (PES) substrate. Poly-4-vinylphenol (PVP) buffer layers were prepared from 2 wt. % solutions of PVP ($M_w$~20,000) and poly (melamine-co-formaldehyde), as a cross-linking agent, in propylene glycol monomethyl ether acetate (PGMEA), which were deposited by spin coating at 3000 rpm for 40 sec and subsequently cross-linked at 175° C. on a hot plate for 1 h in a $N_2$-filled glove box. Au (50 nm) bottom-contact source/drain electrodes were deposited by thermal evaporation through a shadow mask. A self-assembled monolayer of pentafluorobenzenethiol (PFBT) was formed on the Au electrodes by immersion in a 10 mmol PFBT solution in ethanol for 15 min in a $N_2$-filled dry box, rinsing with pure ethanol, and drying. The TIPS-pentacene and PTAA blend solution was prepared as follows: TIPS-pentacene and PTAA were individually dissolved in 1,2,3,4-Tetrahydronaphthalene anhydrous, 99%, (Sigma Aldrich) for a concentration of 30 mg/mL and the two individual solutions were mixed to yield a weight ratio of 1:1. TIPS-pentacene and PTAA blend active layers were deposited by spin coating at 500 rpm for 10 sec and at 2000 rpm for 20 sec. Then, samples were annealed at 100° C. for 15 min in a $N_2$-filled dry box. CYTOP (40 nm)/$Al_2O_3$ (50 nm) layers were used as top-gate dielectrics. CYTOP solution (CTL-809M) was purchased from Asahi Glass with a concentration of 9 wt. %. To deposit the 40 nm-thick CYTOP layers, the original solution diluted with their solvents (CT-solv. 180) to have solution:solvent ratios of 1:3.5. The 40 nm-thick CYTOP layers were deposited by spin casting at 3000 rpm for 60 sec. The CYTOP (40 nm) films were annealed at 100° C. for 20 min. All spin coating and annealing processes were carried out in a $N_2$-filled dry box. Then, the $Al_2O_3$ dielectric films (50 nm) were deposited on top of the CYTOP layer using a Savannah 100 ALD system from Cambridge Nanotech Inc. Films were grown at 110° C. using alternating exposures of trimethyl aluminum [Al$(CH_3)_3$] and $H_2O$ vapor at a deposition rate of approximately 0.1 nm per cycle. Finally, Al (150 nm) gate electrodes were deposited by thermal evaporation through a shadow mask. The resulting OFET is depicted in FIG. 4C.

EXAMPLE 8

TIPS-Pentacene and Poly (Triarylamine) (PTAA) Blend Channel Based OFET with CYTOP/$Al_2O_3$ Bi-Layer (45 nm CYTOP; 50 nm $Al_2O_3$)

OFETs with a bottom-contact and top-gate structure were fabricated on glass substrates (Corning, Eagle 2000). Au (50 nm) bottom-contact source/drain electrodes were deposited by thermal evaporation through a shadow mask. A self-assembled monolayer of pentafluorobenzenethiol (PFBT) was formed on the Au electrodes by immersion in a 10 mmol PFBT solution in ethanol for 15 min in a $N_2$-filled dry box, rinsing with pure ethanol, and drying. The TIPS-pentacene and PTAA blend solution was prepared as follows: TIPS-pentacene and PTAA were individually dissolved in 1,2,3,4-

Tetrahydronaphthalene anhydrous, 99%, (Sigma Aldrich) for a concentration of 30 mg/mL and the two individual solutions were mixed to yield a weight ratio of 1:1. TIPS-pentacene and PTAA blend active layers were deposited by spin coating at 500 rpm for 10 sec and at 2000 rpm for 20 sec. Then, samples were annealed at 100° C. for 15 min in a $N_2$-filled dry box. CYTOP (45 nm)/$Al_2O_3$ (50 nm) layers were used as top-gate dielectrics. CYTOP solution (CTL-809M) was purchased from Asahi Glass with a concentration of 9 wt. %. To deposit the 45 nm-thick CYTOP layers, the original solution diluted with their solvents (CT-solv. 180) to have solution:solvent ratios of 1:3.5. The 45 nm-thick CYTOP layers were deposited by spin casting at 3000 rpm for 60 sec. The CYTOP (45 nm) films were annealed at 100° C. for 20 min. All spin coating and annealing processes were carried out in a $N_2$-filled dry box. Then, the $Al_2O_3$ dielectric films (50 nm) were deposited on top of the CYTOP layer using a Savannah 100 ALD system from Cambridge Nanotech Inc. Films were grown at 110° C. using alternating exposures of trimethyl aluminum [$Al(CH_3)_3$] and $H_2O$ vapor at a deposition rate of approximately 0.1 nm per cycle. Finally, Al (150 nm) gate electrodes were deposited by thermal evaporation through a shadow mask. The resulting OFET is depicted in FIG. 4D.

EXAMPLE 9 diF-TESADT and Poly (Triarylamine) (PTAA) Blend Channel Based OFET with CYTOP/$Al_2O_3$ Bi-Layer (45 nm CYTOP; 50 nm $Al_2O_3$)

Example 9 is identical to example 8, except 2,8-difluoro-5,11-bis(triethylsilylethynyl) anthradithiophene (diF-TESADT) was used rather than TIPS-pentacene. The structure of diF-TESADT is shown below:

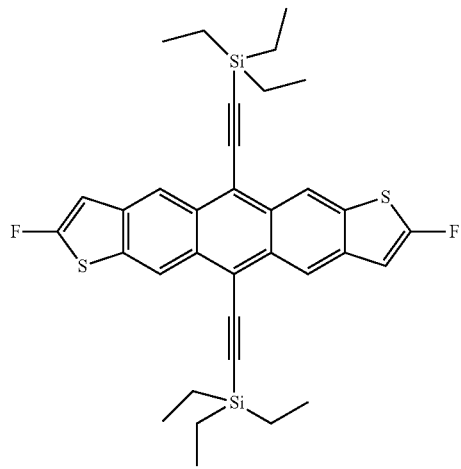 [SMILES: CC[Si](C#Cc1c2cc3cc(F)sc3cc2c(C#C[Si](CC)(CC)CC)c2cc3cc(F)sc3cc12)(CC)CC]

Figure 4E:
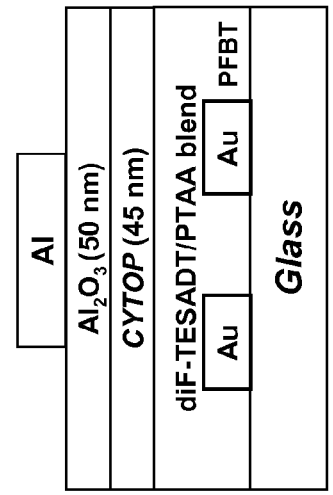
FIG. 4E shows a section view of a diF-TESADT and PTAA blend channel based OFET with a CYTOP/$Al_2O_3$ bi-layer (45 nm CYTOP; 50 nm $Al_2O_3$)
Figure 4B:
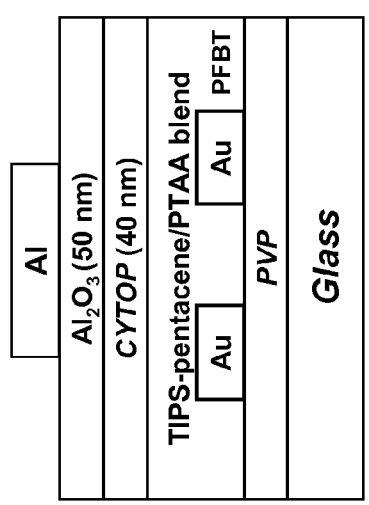
FIG. 4B shows a section view of a TIPS-pentacene and Poly (triarylamine) (PTAA) blend channel based OFET with a CYTOP/$Al_2O_3$ bi-layer (40 nm CYTOP; 50 nm $Al_2O_3$) using a glass substrate.
Figure 4D:
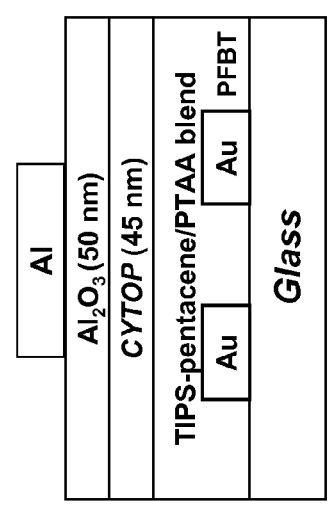
FIG. 4D shows a section view of a TIPS-pentacene and PTAA blend channel based OFET with CYTOP/$Al_2O_3$ bi-layer (45 nm CYTOP; 50 nm $Al_2O_3$)

The resulting OFET is depicted in FIG. 4E.

EXAMPLE 10

TIPS-Pentacene and Poly (Triarylamine) (PTAA) Blend Channel Based OFET with CYTOP/$Al_2O_3$/CYTOP Tri-Layer (20 nm CYTOP; 50 nm $Al_2O_3$; 20 nm CYTOP)

Figure 4F:
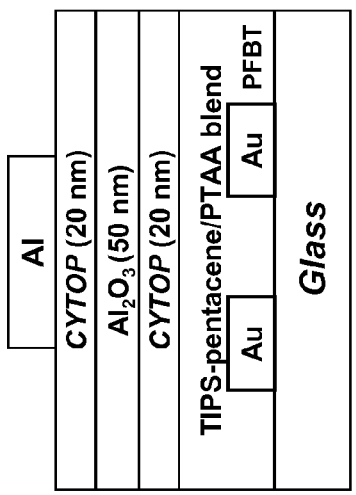
FIG. 4F shows a section view of a TIPS-pentacene and Poly PTAA blend channel based OFET with a CYTOP/$Al_2O_3$/CYTOP tri-layer (20 nm CYTOP; 50 nm $Al_2O_3$; 20 nm CYTOP)

OFETs with a bottom-contact and top-gate structure were fabricated on glass substrates (Corning, Eagle 2000). Au (50 nm) bottom-contact source/drain electrodes were deposited by thermal evaporation through a shadow mask. A self-assembled monolayer of pentafluorobenzenethiol (PFBT) was formed on the Au electrodes by immersion in a 10 mmol PFBT solution in ethanol for 15 min in a $N_2$-filled dry box, rinsing with pure ethanol, and drying. The TIPS-pentacene and PTAA blend solution was prepared as follows: TIPS-pentacene and PTAA were individually dissolved in 1,2,3,4-Tetrahydronaphthalene anhydrous, 99%, (Sigma Aldrich) for a concentration of 30 mg/mL and the two individual solutions were mixed to yield a weight ratio of 1:1. TIPS-pentacene and PTAA blend active layers were deposited by spin coating at 500 rpm for 10 sec and at 2000 rpm for 20 sec. Then, samples were annealed at 100° C. for 15 min in a $N_2$-filled dry box. CYTOP (45 nm)/$Al_2O_3$ (50 nm) layers were used as top-gate dielectrics. CYTOP solution (CTL-809M) was purchased from Asahi Glass with a concentration of 9 wt. %. To deposit the 20 nm-thick CYTOP layers, the original solution diluted with their solvents (CT-solv. 180) to have solution:solvent ratios of 1:7. The 20 nm-thick CYTOP first layers were deposited by spin casting at 3000 rpm for 60 sec. The CYTOP (20 nm) films were annealed at 100° C. for 20 min. Then, the $Al_2O_3$ dielectric films (50 nm) were deposited on top of the CYTOP layer using a Savannah 100 ALD system from Cambridge Nanotech Inc. Films were grown at 110° C. using alternating exposures of trimethyl aluminum [$Al(CH_3)_3$] and $H_2O$ vapor at a deposition rate of approximately 0.1 nm per cycle. The 20 nm-thick CYTOP third layers were deposited on the top of $Al_2O_3$ second layers. The CYTOP (20 nm) films were annealed at 100° C. for 20 min. All spin coating and annealing processes were carried out in a $N_2$-filled dry box. Finally, Al (150 nm) gate electrodes were deposited by thermal evaporation through a shadow mask. The resulting OFET is depicted in FIG. 4F.

EXAMPLE 11

Pentacene and InGaZnO Based FETs and Inverters

Figure 4G:
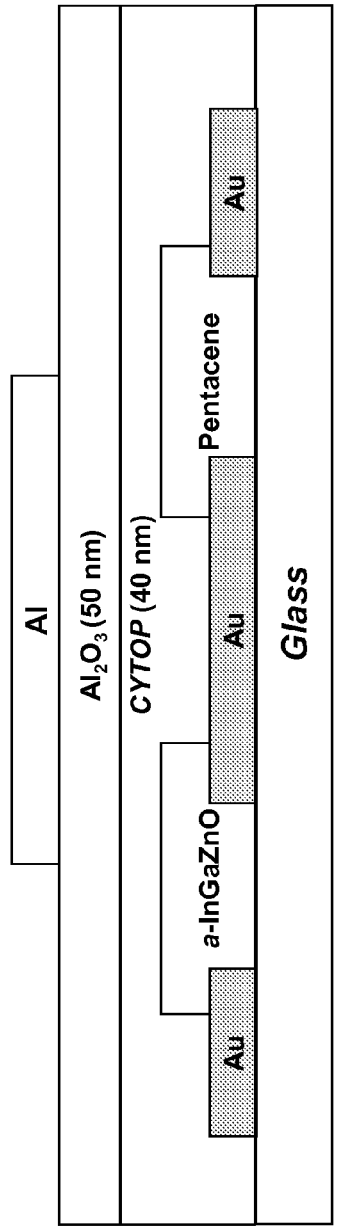
FIG. 4G shows a section view of a Pentacene and InGaZnO based inverters.

Organic-inorganic hybrid complementary inverters were fabricated with a top gate and bottom-contact source and drain electrode geometry. First, Ti/Au (6 nm/50 nm) electrodes were deposited using electron-beam (e-beam) at room temperature on a glass substrate through a shadow mask to define the source and drain electrodes. Non-overlapping pentacene (hole transport) and a-IGZO (electron transport) channels horizontally distributed with different aspect ratios were fabricated on top of the source/drain electrodes. A 30 nm-thick a-IGZO ($Ga_2O_3$:$In_2O_3$:ZnO=1:1:1 mol %) active layer was deposited at room temperature by rf-sputtering through a shadow mask using a power of 125 W at a working pressure of 3 mTorr in an $O_2$/Ar (2%/98%) atmosphere. These structures were annealed at 300° C. for 30 minutes in air. Then, a 50 nm-thick layer of pentacene was deposited through a shadow mask using thermal evaporation with a substrate temperature of 25° C. and an initial pressure of $2 \times 10^{-8}$ Torr. Prior to thermal evaporation, pentacene was purified using gradient zone sublimation. CYTOP (40 nm)/$Al_2O_3$ (50 nm) layers were used as top-gate dielectrics. CYTOP solution (CTL-809M) was purchased from Asahi Glass with a concentration of 9 wt. %. To deposit the 45 nm-thick CYTOP layers, the original solution diluted with their solvents (CT-solv. 180) to have solution:solvent ratios of 1:3.5. The 45 nm-thick CYTOP layers were deposited by spin casting at 3000 rpm for 60 sec. The CYTOP (45 nm) films were annealed at 100° C. for 20 min. All spin coating and annealing processes were carried out in a $N_2$-filled dry box. Then, the $Al_2O_3$ dielectric films (50 nm) were deposited on top of the CYTOP layer using a Savannah 100 ALD system from Cambridge Nanotech Inc. Films were grown at 110° C. using alternating exposures of trimethyl aluminum [Al(CH$_3$)$_3$] and H$_2$O vapor at a deposition rate of approximately 0.1 nm per cycle. Finally, Al (50 nm) gate electrodes were deposited by thermal evaporation through a shadow mask. The resulting inverter is depicted in FIG. 4G.

EXAMPLE 12

Polyera ActivInk N2200 Based OFET with CYTOP/Al$_2$O$_3$ Bi-Layer (45 Nm CYTOP; 50 nm Al$_2$O$_3$) and Evaporated Au Source/Drain Electrodes OFETs with a bottom-contact and top-gate structure were fabricated on glass substrates (Corning, Eagle 2000). Au (50 nm) bottom-contact source/drain electrodes were deposited by thermal evaporation through a shadow mask Inkjet printing semiconductor formulations are based on NDI polymer poly{[N,N9-bis(2-octyldodecyl)-naphthalene-1,4,5,8-bis(dicarboximide)-2,6-diyl]-alt-5,59-(2,29-bithiophene)}, (P(NDI2OD-T2), Polyera ActivInk N2200. P(NDI2OD-T2) ink was prepared as follows: NDI polymer was dissolved in mixture of 1,2,3,4-Tetrahydronaphthalene anhydrous, 99% (Sigma Aldrich) and mesitylene, 99% (Sigma Aldrich) with a ratio of 1:1 in volume in order to reach 0.5% concentration in active material. Formulation was stirred over night in ambient. The structure of Polyera ActivInk N2200 is shown below:

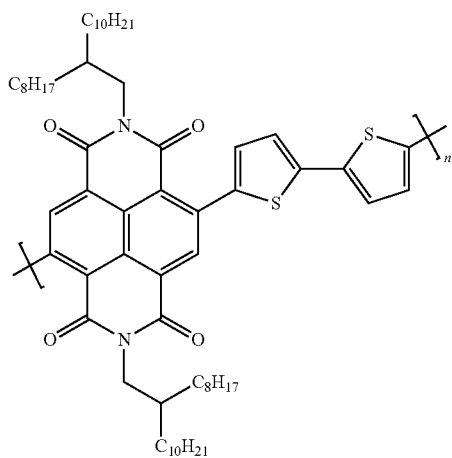

Figure 4H:
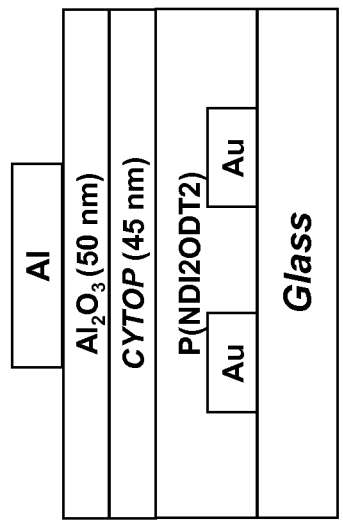
FIG. 4H shows a section view of a Polyera ActivInk N2200 based OFET with a CYTOP/$Al_2O_3$ bi-layer (45 nm CYTOP; 50 nm $Al_2O_3$) and evaporated Ag source/drain electrodes.

A Dimatix DMP 2831 inkjet printing system was used to pattern semiconductor layers. Around 150 nm thick layer of active material was printing in air at room temperature. CYTOP (45 nm)/Al$_2$O$_3$ (50 nm) layers were used as top-gate dielectrics. CYTOP solution (CTL-809M) was purchased from Asahi Glass with a concentration of 9 wt. %. To deposit the 45 nm-thick CYTOP layers, the original solution diluted with their solvents (CT-solv. 180) to have solution:solvent ratios of 1:3.5. The 45 nm-thick CYTOP layers were deposited by spin casting at 3000 rpm for 60 sec. The CYTOP (45 nm) films were annealed at 100° C. for 20 min. All spin coating and annealing processes were carried out in a N$_2$-filled dry box. Then, the Al$_2$O$_3$ dielectric films (50 nm) were deposited on top of the CYTOP layer using a Savannah 100 ALD system from Cambridge Nanotech Inc. Films were grown at 110° C. using alternating exposures of trimethyl aluminum [Al(CH$_3$)$_3$] and H$_2$O vapor at a deposition rate of approximately 0.1 nm per cycle. Finally, Al (100 nm) gate electrodes were deposited by thermal evaporation through a shadow mask. The resulting OEFT is depicted in FIG. 4H.

EXAMPLE 13

Polyera ActivInk N2200 Based OFET with CYTOP/Al$_2$O$_3$ Bi-Layer (45 Nm CYTOP; 50 nm Al$_2$O$_3$) and Evaporated Ag Source/Drain Electrodes Example 13 is identical to example 12, except that Ag was used instead of Au in the bottom-contact source/drain electrodes.

EXAMPLE 14

Polyera ActivInk N2200 Based OFET with CYTOP/Al$_2$O$_3$ Bi-Layer (45 Nm CYTOP; 50 nm Al$_2$O$_3$) and Printed Ag Source/Drain Electrodes Example 14 is identical to example 14, except that the Ag bottom-contact source/drain electrodes were patterned by a Dimatix DMP 2831 inkjet printer.

EXAMPLE 15

LEH-III-002a Based OFET with CYTOP/Al$_2$O$_3$ Bi-Layer (45 nm CYTOP; 50 nm Al$_2$O$_3$)

OFETs with bottom contact and top gate structure were fabricated on glass substrates (Corning, Eagle 2000). Au (50 nm), Al (50 nm), and Ag (50 nm) bottom contact source/drain electrodes were deposited by thermal evaporation through a shadow mask. Thin films of organic semiconductors of LEH-III-002a (LEH-III085g, LEH-119a) were deposited by spin coating with a 30 mg/ml solution prepared from dichlorobenzene at 500 rpm for 10 second followed by 2000 rpm for 20 seconds. LEH-III-002a (LEH-III-085g, LEH-III-119a) is shown in the formula below:

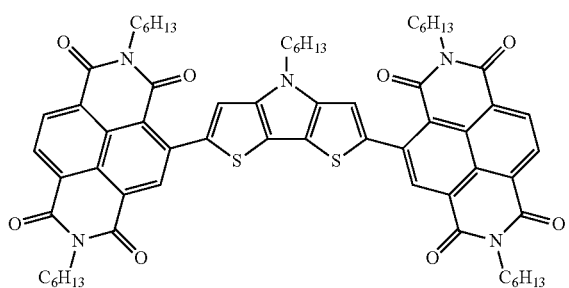

The blend for polymer matrix with poly(α-methyl styrene) (PαMS) (M$_w$ 100,000) was prepared from mixing separate 30 mg/ml solutions of LEH-III-119a (LEH-III-085g) and PαMS. Poly(α-methyl styrene) (PαMS) (M$_w$ 100,000) is shown in the formula below:

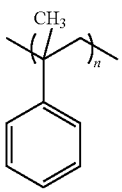

The blend films were deposited by spin coating at 500 rpm for 10 second followed by at 2000 rpm for 20 seconds. The sole and blend films were annealed at 100° C. for 15 min. CYTOP (45 nm)/Al$_2$O$_3$ (50 nm) layers were used as top-gate dielectrics. CYTOP solution (CTL-809M) was purchased from Asahi Glass with a concentration of 9 wt. %. To deposit the 45 nm-thick CYTOP layers, the original solution diluted with their solvents (CT-solv. 180) to have solution:solvent ratios of 1:3.5. The 45 nm-thick CYTOP layers were deposited by spin casting at 3000 rpm for 60 sec. The CYTOP (45 nm) films were annealed at 100° C. for 20 min. All spin coating and annealing processes were carried out in a N$_2$-filled dry box. Then, the Al$_2$O$_3$ dielectric films (50 nm) were deposited on top of the CYTOP layer using a Savannah 100 ALD system from Cambridge Nanotech Inc. Films were grown at 110° C. using alternating exposures of trimethyl aluminum [Al(CH$_3$)$_3$] and H$_2$O vapor at a deposition rate of approximately 0.1 nm per cycle. Finally, Al (150 nm) gate electrodes were deposited by thermal evaporation through a shadow mask.

EXAMPLE 16

DRR-IV-209n Based OFET with CYTOP/Al$_2$O$_3$ Bi-Layer (45 nm CYTOP; 50 nm Al$_2$O$_3$)

OFETs with bottom contact and top gate structure were fabricated on glass substrates (Corning, Eagle 2000). Au (50 nm) bottom contact source/drain electrodes were deposited by thermal evaporation through a shadow mask. Organic semiconductor layers of DRR-IV-209n were formed on the substrates by spin coating with a solution prepared from 1,4-dioxane (20 mg/mL) and dichlorobenzene (20 mg/mL) at 500 rpm for 10 sec and at 2,000 rpm for 20 sec. DRR-IV-209n is shown in the formula below:

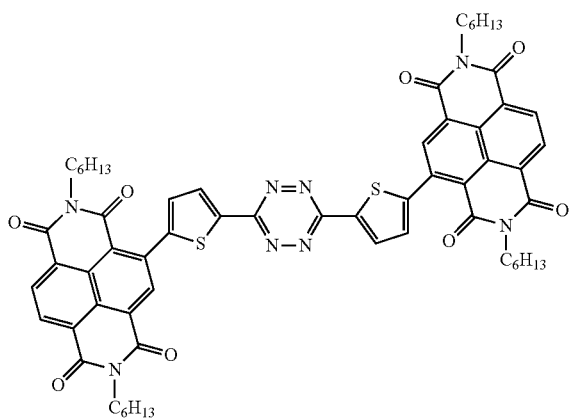

Then, samples were annealed at 100° C. (1,4-dioxane sample) and 120° C. (dichlorobenzene sample) for 10 min in a N$_2$-filled dry box. CYTOP (45 nm)/Al$_2$O$_3$ (50 nm) layers were used as top-gate dielectrics. CYTOP solution (CTL-809M) was purchased from Asahi Glass with a concentration of 9 wt. %. To deposit the 45 nm-thick CYTOP layers, the original solution diluted with their solvents (CT-solv. 180) to have solution:solvent ratios of 1:3.5. The 45 nm-thick CYTOP layers were deposited by spin casting at 3000 rpm for 60 sec. The CYTOP (45 nm) films were annealed at 100° C. for 20 min. All spin coating and annealing processes were carried out in a N$_2$-filled dry box. Then, the Al$_2$O$_3$ dielectric films (50 nm) were deposited on top of the CYTOP layer using a Savannah 100 ALD system from Cambridge Nanotech Inc. Films were grown at 110° C. using alternating exposures of trimethyl aluminum [Al(CH$_3$)$_3$] and H$_2$O vapor at a deposition rate of approximately 0.1 nm per cycle. Finally, Al (150 nm) gate electrodes were deposited by thermal evaporation through a shadow mask.

Comparative Study of OFETs with Different CYTOP Layer/Al$_2$O$_3$ Layer Thicknesses For illustrating the advantages of the embodiments of the invention, the following study has been made of the OFET structure of FIG. 4A. Five OFETs with different CYTOP layer/Al$_2$O$_3$ layer thicknesses have been compared:
CYTOP (25 nm)/Al$_2$O$_3$ (50 nm);
CYTOP (40 nm)/Al$_2$O$_3$ (50 nm);
CYTOP (530 nm)/Al$_2$O$_3$ (50 nm);
Al$_2$O$_3$ (100 nm) layer as gate dielectric;
CYTOP (780 nm) layer as gate dielectric.

In all studied OFETs the substrate 301 is a Poly-4-vinylphenol (PVP)-coated glass substrate and the semiconductor material 302 is a TIPS-pentacene and PTAA blend, spin-coated on the substrate. After deposition, the blended films of TIPS-pentacene and PTAA were annealed to induce vertical-phase segregation. Gold (50 nm) and aluminum (150 nm) were used as bottom-contact source/drain electrodes and top-gate electrode, respectively. Prior to the deposition of the semiconductor layer, the surface of the gold electrodes was treated with a self-assembled monolayer of pentafluorobenzenethiol (PFBT) to improve contact between the metal and organic interface.

Figure 6A:
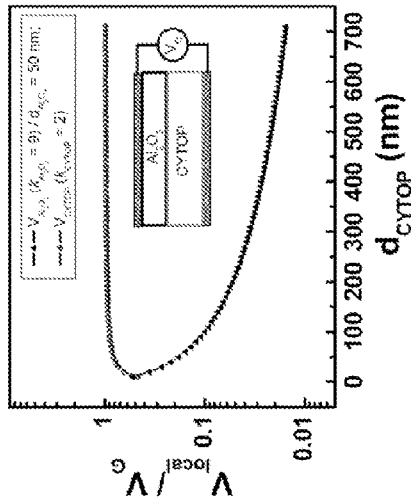
FIGS. 6A and 6B illustrate the influence of the CYTOP layer thickness $t_{CYTOP}$ and of the $Al_2O_3$ dielectric constant $k_{Al2O3}$ on the voltage $V_{CYTOP}$ over the CYTOP layer and on the voltage $V_{Al2O3}$ over the $Al_2O_3$ layer.
Figure 5:
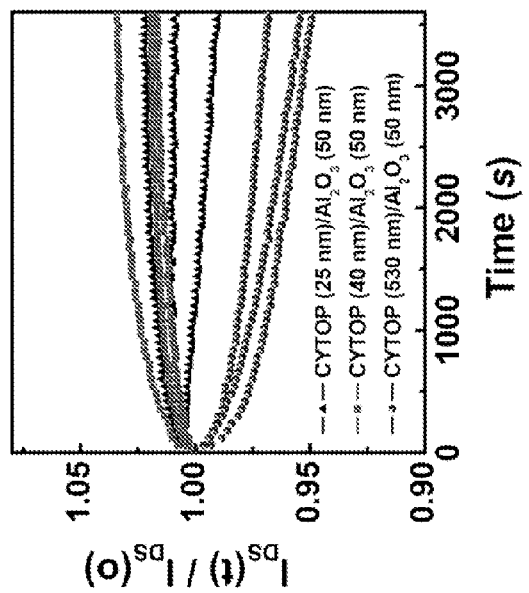
FIG. 5 illustrates the ratio of the drain current $I_{DS}$ with respect to the initial drain current $I_{DS0}$ in function of the time under continuous bias stress in the OFET of FIG. 4A for three different CYTOP layer thicknesses.

FIG. 5 compares the ratio of the drain-source current $I_{DS}$ with respect to the initial drain current $I_{DS0}$ in function of time under continuous bias stress in the OFET of FIG. 4A for three different CYTOP layer thicknesses ($V_G$=$V_D$=−6V, −8V, −25V for $t_{CYTOP}$=25, 40, 530 nm, respectively). Those measurements show that by choosing an appropriate CYTOP layer thickness, the evolution of the drain current in function of time under continuous bias stress can be influenced. In this example the CYTOP layer thickness of 40 nm gives the best results. Note that the optimal value for this CYTOP layer thickness will be influenced by the thickness of the Al$_2$O$_3$ layer and the dielectric constants. This can be better understood by considering FIGS. 6A and 6B.

Figure 6B:
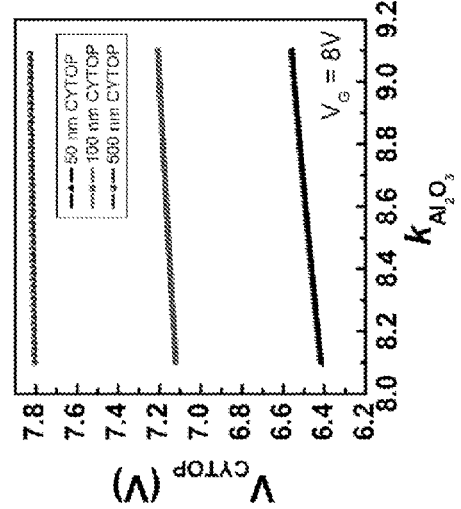

As shown in FIG. 6B the effects on the change in voltage over the CYTOP layer in function of a change in dielectric constant of the Al2O3 layer is larger for smaller values of the CYTOP layer thickness. Such a slope is necessary in order to obtain the above described compensation effect. For thick CYTOP layers, e.g. the 500 nm curve in FIG. 6B, the curve is almost flat indicating that compensation will not be reached (wherein it is assumed that the other dielectric constants remain the same).

Figure 7A:
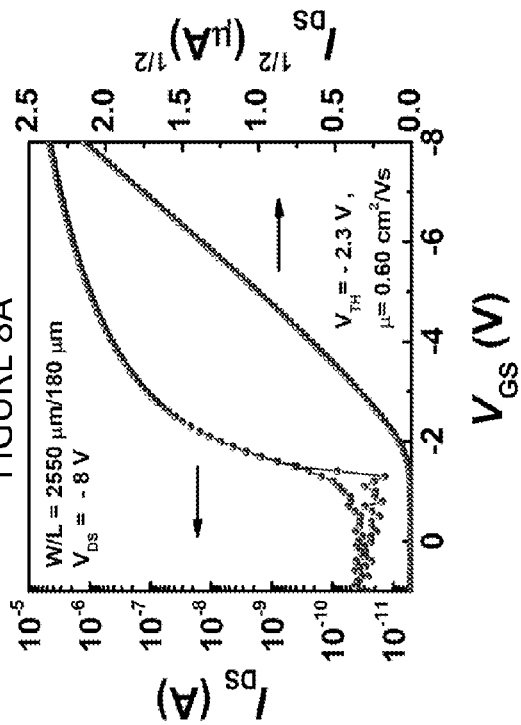
FIGS. 7A and 7B show the capacitance density-electric field (C-E) and current density-electric field (J-E) characteristics of $Al_2O_3$ (100 nm), CYTOP (780 nm), and CYTOP (40 nm)/$Al_2O_3$ (50 nm) films, respectively.
Figure 7B:
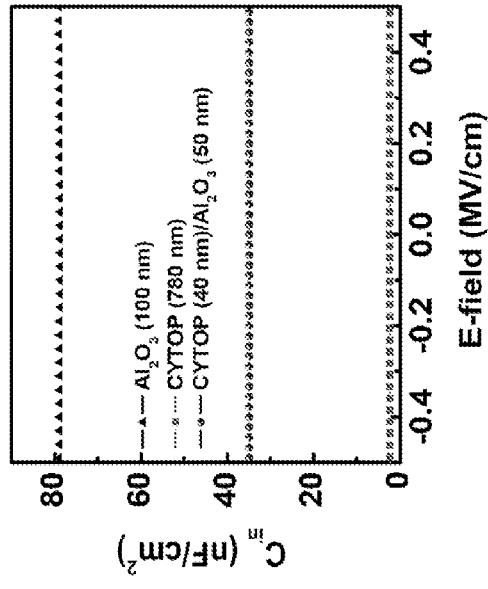

FIGS. 7A and 7B show the capacitance density-electric field (C-E) and current density-electric field (J-E) characteristics of Al$_2$O$_3$ (100 nm), CYTOP (780 nm), and CYTOP (40 nm)/Al$_2$O$_3$ (50 nm) films, respectively. The dielectric properties of all films were characterized using a parallel-plate capacitor geometry of gold (100 nm)/dielectric/indium thin oxide (ITO) coated glass with various areas ranging from 3.1×10-4 cm$^2$ to 2.4×10-1 cm$^2$. The measured capacitance densities ($C_{in}$) of the Al$_2$O$_3$ and CYTOP films at a frequency of 1 kHz were 78.6 and 2.3 nF/cm$^2$, respectively. The extracted dielectric constant (k) values are 8.9 for $Al_2O_3$ and 2.0 for CYTOP. The CYTOP/$Al_2O_3$ bi-layer exhibited a $C_m$ of 34.8 nF/cm$^2$ at a frequency of 1 kHz, which is close to the theoretical value (34.6 nF/cm$^2$) estimated from a series-connected capacitor of CYTOP and $Al_2O_3$. As shown in FIG. 7B, the leakage current densities of the $Al_2O_3$ and CYTOP/$Al_2O_3$ films remained below $3 \times 10^{-7}$ A/cm$^2$ at applied fields with a magnitude up to 3 MV/cm. In contrast, the leakage current of a 780-nm-thick CYTOP film reached a value of $2 \times 10^{-7}$ A/cm$^2$ at an applied field of 1.2 MV/cm.

Figure 8A:
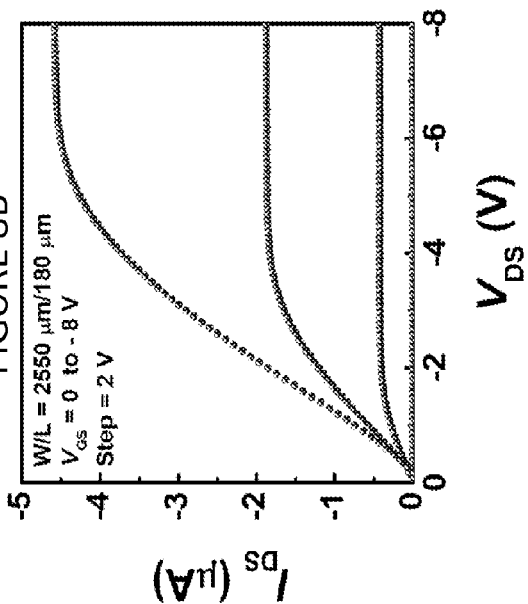
FIGS. 8A and 8B show the transfer and output characteristics, measured for an OFET (W/L=2550 μm/180 μm) using a CYTOP (40 nm)/$Al_2O_3$ (50 nm) gate dielectric, respectively.
Figure 8B:
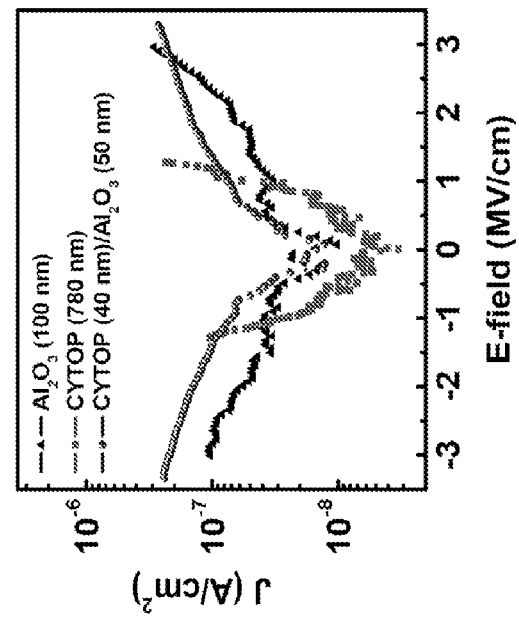

FIGS. 8A-8B show the transfer and output characteristics, measured from pristine devices under a nitrogen atmosphere, of OFETs (W/L=2550 µm/180 µm) using a CYTOP (40 nm)/$Al_2O_3$ (50 nm) gate dielectric. The OFETs showed no hysteresis and achieved a maximum value of µ=0.6 cm$^2$/Vs at a low voltage of 8 V due to the relatively high $C_{in}$ of the bi-layer gate dielectric. Average values of the mobility µ=0.46±0.08 cm$^2$/Vs, the threshold voltage $V_{th}$=−2.4±0.1 V, $I_{on}/I_{off}$=10$^5$, the sub-threshold slope SS=0.20±0.06 V/decade and a maximum interfacial trap density of $5 \times 10^{11}$ cm$^{-2}$ were measured in these bi-layer devices. Compared with OFETs using the CYTOP single layer, OFETs using the bi-layer show similar values of µ but smaller values of $V_{th}$ and SS and higher values of $I_{on}/I_{off}$ at low operating voltages due to the high $C_{in}$.

Figure 9A:
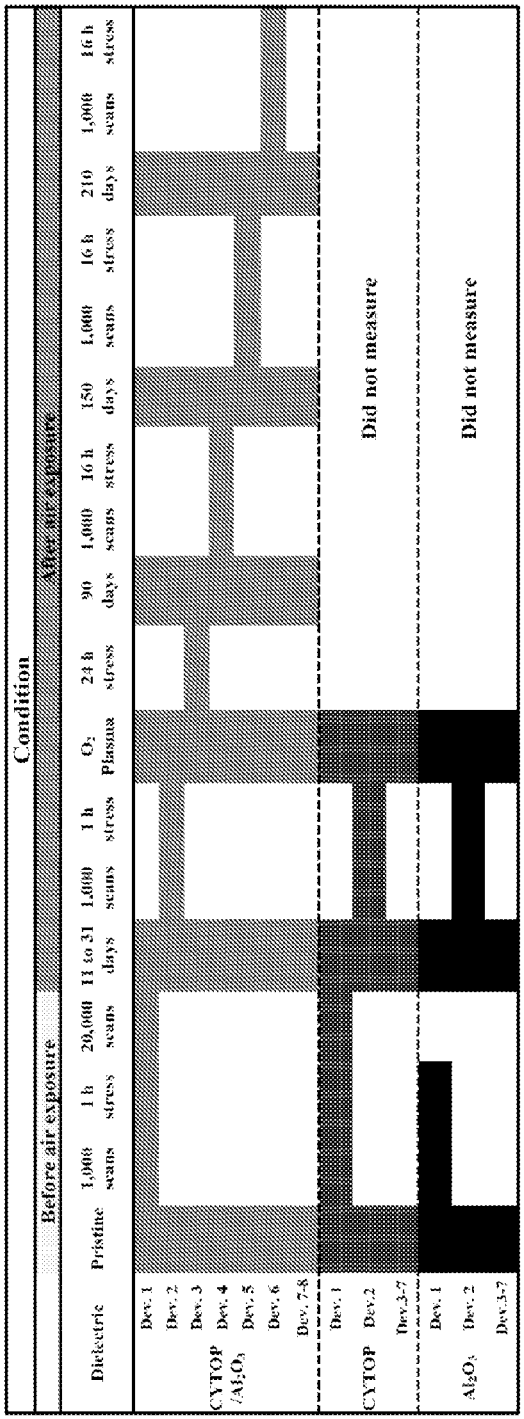
FIG. 9A shows a table that summarizes the different conditions of environmental exposure and electrical stress to which sets of OFETs were subjected.

FIG. 9A shows a table that summarizes the different conditions of environmental exposure and electrical stress to which each set of OFETs was subjected to study their long-term environmental and operational stabilities. To study their environmental stability, all OFETs were exposed to a normal ambient condition at a relative humidity between 30 and 50%. Variations of µ and $V_{th}$ were monitored at discrete intervals. At each interval, each substrate was transferred back into a $N_2$-filled glove box for electrical measurements and operational stability tests.

Figure 9B:
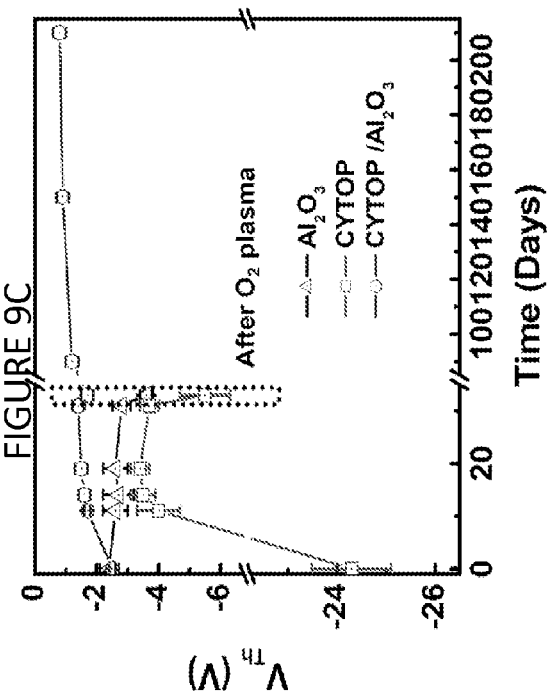
FIGS. 9B and 9C show the variations of the mobility and the threshold voltage $V_{th}$ in time, respectively, for OFETs with $Al_2O_3$ (100 nm), CYTOP (780 nm), and CYTOP (40 nm)/$Al_2O_3$ (50 nm) films.
Figure 9C:
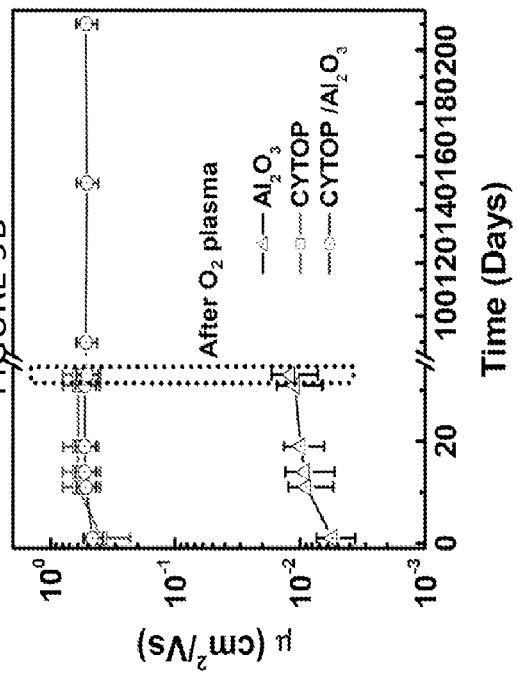

FIG. 9B shows that, in the different types of OFETs, no significant change in µ was observed after up to 31 days of exposure to air. As will be shown, the good air stability of TIPS-pentacene also contributes to the environmental stability of these OFETs. In OFETs with the $Al_2O_3$ gate dielectric, a gradual increase of the average value of µ from 5.5 (±2.0)× $10^{-3}$ cm$^2$/V up to 1.1 (±0.4)×$10^{-2}$ cm$^2$/Vs was observed. In the other OFETs, after an initial increase within the first eleven days, µ remained unchanged with average values of 0.60±0.20 cm$^2$/Vs for OFETs with the CYTOP gate dielectric and 0.52±0.09 cm$^2$/Vs for OFETs with the CYTOP/$Al_2O_3$ gate dielectric. On the other hand, the variations of $V_{th}$ for the devices with different gate dielectrics are shown in FIG. 9C. In OFETs with the $Al_2O_3$ gate dielectric, the average value of $V_{th}$, measured from sweeps of $V_{GS}$ from off-to-on regime, varied from −2.4±0.3 V to −2.8±0.3 V after 31 days in air. Despite this seemingly small change, strong hysteresis and large device-to-device variation of the magnitude and sign of $V_{th}$ were observed in these devices. In contrast, in hysteresis-free OFETs with the CYTOP gate dielectric, a large positive shift in $V_{th}$ from −24.3±0.8 V to −4.0±0.7 V was observed after 11 days in air. After this initial variation, no serious shift in $V_{th}$ was observed, reaching a value of −3.7±0.3 V after 31 days in air. Similar changes, albeit of a smaller magnitude, were observed in hysteresis-free OFETs with the CYTOP/$Al_2O_3$ bi-layer. After 31 days in air, only a minor shift in $V_{th}$ from −2.5±0.1 V to −1.4±0.1 V was measured. As in devices with the CYTOP gate dielectric, most of these changes happened within the first 11 days.

Figure 9D:
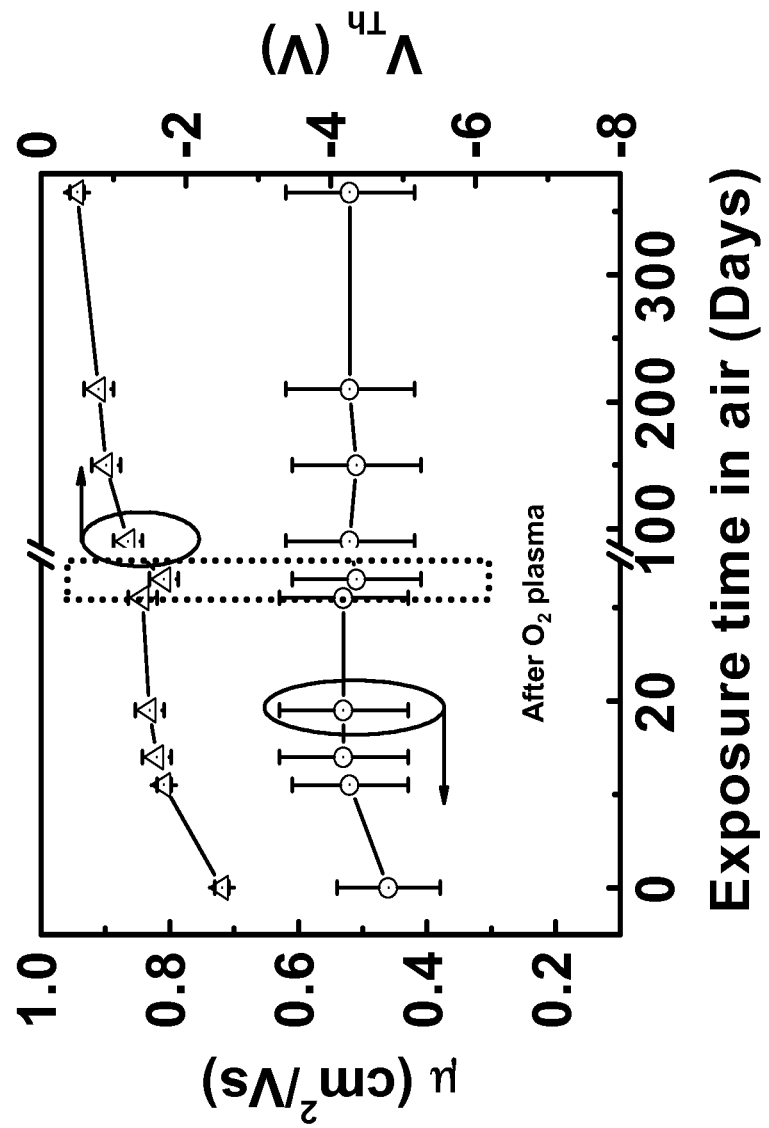
FIG. 9D shows the variations of the mobility and the threshold voltage $V_{th}$ For an OFET with a CYTOP (40 nm)/$Al_2O_3$ (50 nm) film.

FIG. 9D shows the variations of the mobility and the threshold voltage $V_{th}$ For an OFET with a CYTOP (40 nm)/$Al_2O_3$ (50 nm) film.

To study the encapsulation properties of our top-gate dielectrics, Ca thin-film optical transmission tests were carried out. It was found that Ca films protected with a CYTOP single layer rapidly oxidized within an hour of being exposed to air, while Ca films protected with either a CYTOP/$Al_2O_3$ bi-layer or an $Al_2O_3$ single layer started degradation only after being exposed to air for more than a day. From these experiments, it is expected that CYTOP is a protective barrier for $H_2O$ diffusion due to its hydrophobic nature, so $O_2$ diffusion should be responsible for the degradation of the Ca layers. OFETs using the bi-layer gate dielectric showed superior environmental stability compared with those using single-layer gate dielectrics.

The encapsulation properties of the dielectrics used in the top-gate OFETs were further tested, after 31 days in air, by exposing them to an $O_2$ plasma for 5 min at a power of 750 W, a condition which is more severe than air exposure due to the high reactivity of the $O_2$ plasma, known to remove organic residues and other contaminants from surfaces. FIGS. 9B and 9C show that, after $O_2$ plasma treatment, no serious changes in µ or $V_{th}$ were observed for all three types of OFETs. A significant change observed in the electrical characteristics of the different OFETs was a severe increase of $I_{off}$ in the OFETs with a single CYTOP layer. On the other hand, $Al_2O_3$ acts as a protective layer to the energetic $O_2$ plasma, so no significant changes in the $I_{on}/I_{off}$ ratios were observed in the devices with $Al_2O_3$ and CYTOP/$Al_2O_3$ gate dielectrics. As described in FIG. 9A, after $O_2$ plasma treatment, the electrical properties of the OFETs with a CYTOP/$Al_2O_3$ bi-layer were tested after an accumulated air exposure up to 210 days (7 months). FIGS. 9B and 9C show that the average values of µ and $V_{th}$ remain practically unchanged.

In addition to the environmental stability, the operational stability is of critical importance for circuit design and overall device lifetime. The mechanisms of degradation under continuous operation are related to charge trapping and de-trapping events at all of the critical interfaces in an OFET and in the bulk of the semiconductor and gate dielectric. The degradation of the performance of an OFET during operation is reflected in changes of µ and $V_{th}$. Because the trap dynamics depend on the density of carriers flowing through the channel, a more severe degradation is expected when transistors are operated at higher powers. Other mechanisms like the diffusion of mobile impurities or the polarization of the gate dielectric could also contribute to the degradation of the performance. For these reasons, the operational stability of all OFETs was evaluated in two ways: 1) by multiple continuous scans of the transfer characteristic and 2) by applying a constant direct current (DC) bias stress, a more severe condition due to the higher current densities flowing through the channel.

Figure 10B:
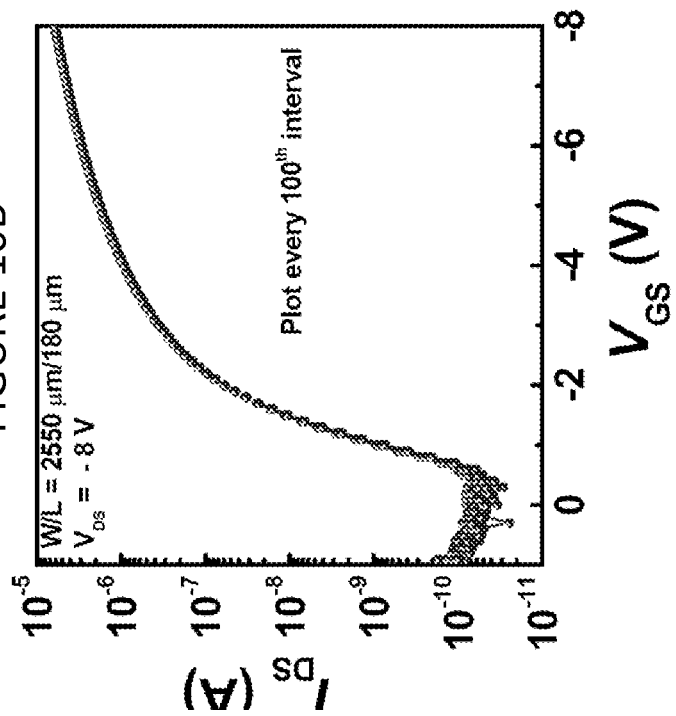
FIGS. 10A and 10B show a sampling of the transfer curves measured in a CYTOP (40 nm)/$Al_2O_3$ (50 nm) OFET during multiple continuous scans from the "off" to the "on" region, before and after air exposure.
Figure 10A:
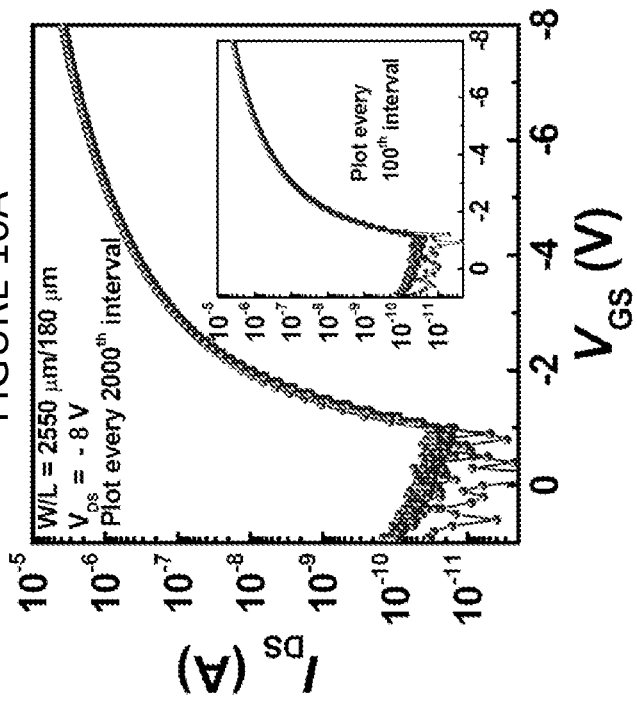

FIGS. 10A and 10B show a sampling of the transfer curves measured in a CYTOP (40 nm)/$Al_2O_3$ (50 nm) OFETs during multiple continuous scans from the "off" to the "on" region, before (FIG. 10A) and after (FIG. 10B) air exposure for 31 days. Negligible changes in the transfer characteristics, during the first 1000 scans, were observed in OFETs with a CYTOP/$Al_2O_3$ gate dielectric, as shown in the inset of FIG. 10A, before the OFETs were exposed to air. To further test the operational stability of these devices before exposing them to air, both were subjected to an additional 20,000 scans. FIG. 10A shows that even under such conditions, negligible changes were observed in the transfer characteristics of both kinds of OFETs. Even after being exposed to air for 31 days, the operational stability under multiple continuous scans was preserved, as shown in FIG. 10B. This remarkable stability is a consequence of the excellent electrical properties of the CYTOP/TIPS-pentacene interface.

As shown in FIG. 9A, before exposing the OFETs to air and after 1000 scans, devices 1 of the different types of OFETs were subjected to 3600 s (1 h) of DC bias stress. FIG. 11A shows the temporal evolution of the $I_{DS}$ measured in all OFETs normalized to the initial value. In the OFET with the $Al_2O_3$ gate dielectric, a drop in the normalized $I_{DS}$ was measured, reaching a final value of 0.77 after 1 h. During the same interval, the current measured in a CYTOP device dropped to 0.9. However, the evolution of the CYTOP/$Al_2O_3$ bi-layer is different in that the current slightly increases, reaching a value of 1.04 after 1 h. FIG. 11B shows the evolution of the normalized $I_{DS}$ measured in all OFETs for 1 h bias stress after 31 days of exposure to air (devices 2). In OFETs with the bi-layer gate dielectric, the mechanism driving the slight increase of $I_{DS}$ is significantly different from the one observed in the other OFETs. Furthermore, the operational stability of OFETs with the bi-layer gate dielectric was tested after $O_2$ plasma treatment by monitoring the current change over 24 h of electrical bias stress. FIG. 11C shows that changes in the normalized $I_{DS}$ remain below 4% its original value. As shown in FIG. 11D, this remarkable stability results in negligible changes of the transfer and output characteristics before and after DC bias stress. It should be noted that, as found before, $I_{DS}$ shows a slight increase during the initial stages of the DC bias stress but slowly decreased after prolonged stress. FIG. 11E shows the temporal evolution of the $I_{DS}$ over 24 h of electrical bias stress measured in an OFET with a CYTOP (40 nm)/$Al_2O_3$ (50 nm) film for: a pristine OFET (Dev. 1), after 31 days of exposed in air (Dev. 2), after $O_2$ plasma treatment (Dev. 3), after air exposure 90 days (Dev. 4), after air exposure for 150 days (Dev. 5), after air exposed for 210 days (Dev. 6), and after air exposure for 365 days (Dev. 7). As can be seen, the variation of $I_{DS}$ under DC bias was less than ±10%.

The remarkable stability of the OFETs with the bi-layers under electrical bias arises from compensating effects: 1) a decrease in $I_{DS}$ caused by intrinsic deep traps at the CYTOP/TIPS-pentacene interface and 2) an increase in $I_{DS}$ caused by dipoles that can be oriented at the CYTOP/$Al_2O_3$ interface and/or by charge injection and trapping at the gate dielectric.

Systematic Stability Study on OFETs with CYTOP/$Al_2O_3$ Bi-Layer Dielectric

For illustrating the advantages of the embodiments of the invention, the following study has been made on OFETs with CYTOP/$Al_2O_3$ bi-layer dielectric. The effects of $O_2$ and $H_2O$ exposure on p-channel OFETs were studied.

The generalized effects of $O_2$ and $H_2O$ exposure on the transfer characteristics of such OFETs is depicted in FIGS. 16A and 16B. FIG. 16A shows that $O_2$ has both doping and oxidation effects, the doping effect tending to shift the transfer characteristic curve to the right, and the oxidation effect tending to shift the transfer characteristic curve to the left. FIG. 16B shows that $H_2O$ increases dielectric polarization, which tends to shift the transfer characteristic curve to the right, but also has the effect of trap creation, which tends to shift the transfer characteristic curve to the left.

The generalized effects of $O_2$ and $H_2O$ exposure on the temporal evolution of the $I_{DS}$ during DC bias stress are shown in FIG. 16C. FIG. 16C shows that $O_2$ exposure has little effect on $I_{DS}$ during DC bias stress. $H_2O$ exposure, however, causes a decrease in $I_{DS}$ over time during DC bias stress.

Figure 17:
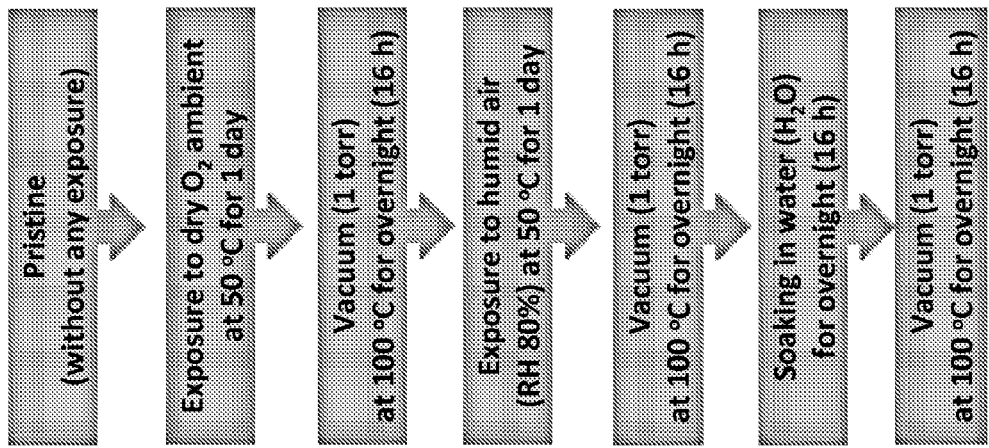
FIG. 17 illustrates an exposure sequence showing the conditions to which sets of OFETs were exposed to determine their environmental stability.

To test the extent of these effects, three different OFETs were tested. The first was a TIPS-pentacene and PTAA blend channel based OFET with a CYTOP/$Al_2O_3$ bi-layer (45 nm CYTOP; 50 nm $Al_2O_3$), as shown in FIG. 4D. The second was a diF-TESADT and PTAA blend channel based OFET with a CYTOP/$Al_2O_3$ bi-layer (45 nm CYTOP; 50 nm $Al_2O_3$), as shown in FIG. 4E. The third was a TIPS-pentacene and PTAA blend channel based OFET with a CYTOP/$Al_2O_3$/CYTOP tri-layer (20 nm CYTOP; 50 nm $Al_2O_3$; 20 nm CYTOP), as shown in FIG. 4F. The OFETs were subject to the exposure sequence shown in FIG. 17.

Figure 18A:
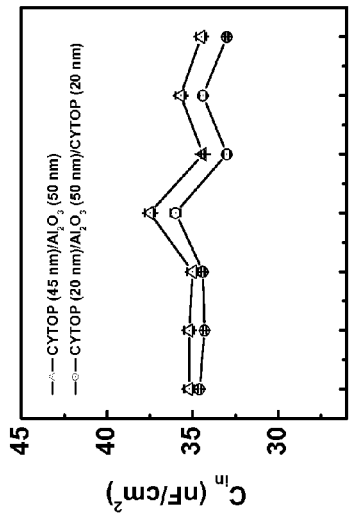
FIGS. 18A-18C show the capacitance $C_{in}$(nF/cm$^2$), mobility μ(cm$^2$/Vs), and threshold voltage $V_{th}$(V) for each stage of the exposure sequence of FIG. 17.
Figure 18B:
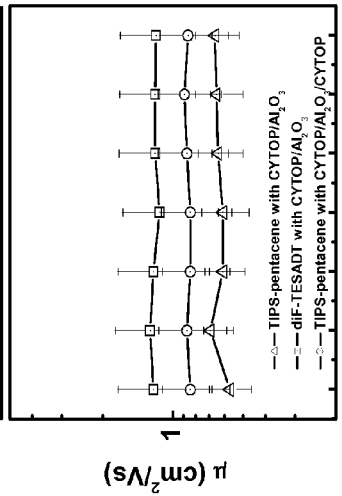
Figure 18C:
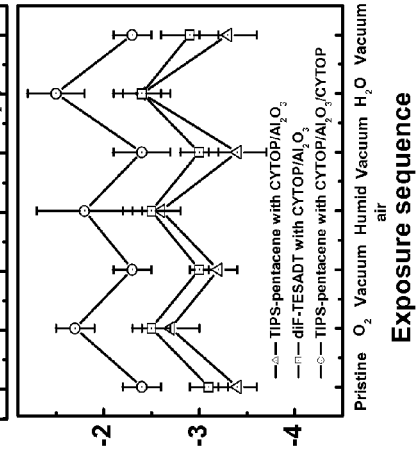

FIGS. 18A-18C show the capacitance $C_{in}$(nF/cm$^2$), mobility $\mu$(cm$^2$/Vs), and threshold voltage $V_{th}$(V) for each stage of the exposure sequence. These results indicate that the effects of $O_2$ and $H_2O$ are reversible for CYTOP/$Al_2O_3$ bi-layer and CYTOP/$Al_2O_3$/CYTOP tri-layer OFETs.

FIGS. 19A and 19B show the variation in capacitance for frequencies ranging from 20 Hz to 1 million Hz, for the CYTOP/$Al_2O_3$ bi-layer OFET (45 nm CYTOP; 50 nm $Al_2O_3$) (FIG. 19A) and the CYTOP/$Al_2O_3$/CYTOP tri-layer OFET (20 nm CYTOP; 50 nm $Al_2O_3$; 20 nm CYTOP) (FIG. 19B), at each stage of the exposure sequence.

Figure 20B:
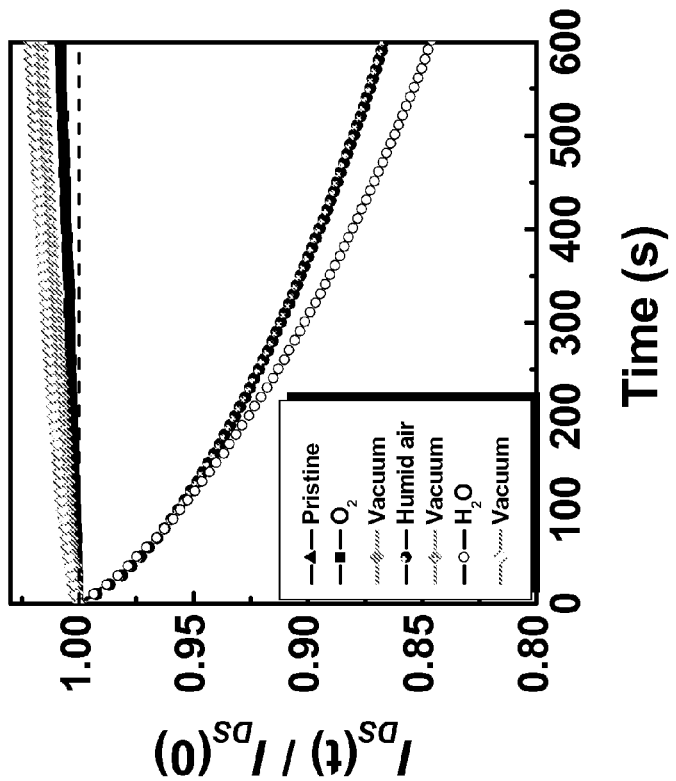
FIGS. 20A and 20B show the transfer characteristics and temporal evolution of the $I_{DS}$ during DC bias for a TIPS-pentacene and PTAA blend channel based OFET with a CYTOP/$Al_2O_3$ bi-layer (45 nm CYTOP; 50 nm $Al_2O_3$), after each stage of the exposure sequence of FIG. 17.
Figure 20A:
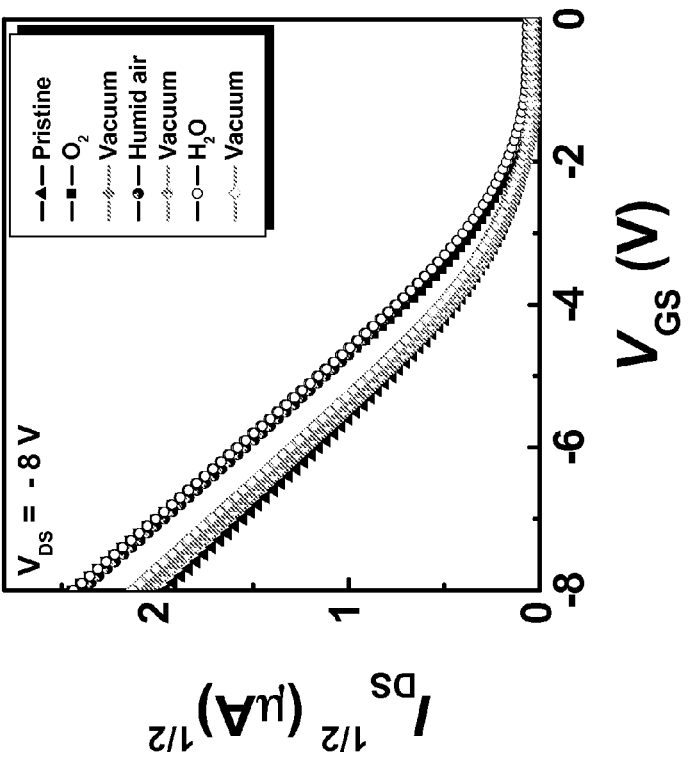

FIGS. 20A and 20B show the transfer characteristics and temporal evolution of the $I_{DS}$ during DC bias for the TIPS-pentacene and PTAA blend channel based OFET with a CYTOP/$Al_2O_3$ bi-layer (45 nm CYTOP; 50 nm $Al_2O_3$). The data obtained during testing of the OFET is summarized in the table below.

FIGS. 21A and 21B show the transfer characteristics and temporal evolution

| Average 9 devices | Cin (nF/cm$^2$) | W/L | $\mu$ (cm$^2$/Vs) | $V_{th}$ (V) |
|---|---|---|---|---|
| Pristine | 35.2 ± 0.3 | 2550 μm/180 μm | 0.57 ± 0.11 | −3.4 ± 0.2 |
| Dry O2 | 35.2 ± 0.3 | 2550 μm/180 μm | 0.69 ± 0.14 | −2.7 ± 0.3 |
| Vacuum | 35.0 ± 0.3 | 2550 μm/180 μm | 0.61 ± 0.12 | −3.4 ± 0.2 |
| Humid air | 37.5 ± 0.3 | 2550 μm/180 μm | 0.61 ± 0.12 | −2.6 ± 0.2 |
| Vacuum | 34.4 ± 0.1 | 2550 μm/180 μm | 0.64 ± 0.14 | −3.4 ± 0.3 |
| H2O (water) | 35.7 ± 0.3 | 2550 μm/180 μm | 0.65 ± 0.15 | −2.4 ± 0.2 |
| Vacuum | 34.5 ± 0.3 | 2550 μm/180 μm | 0.66 ± 0.14 | −3.3 ± 0.3 | of the $I_{DS}$ during DC bias for the diF-TESADT and PTAA blend channel based OFET with a CYTOP/$Al_2O_3$ bi-layer (45 nm CYTOP; 50 nm $Al_2O_3$). The data obtained during testing of the OFET is summarized in the table below.

| Average 7 devices | Cin (nF/cm$^2$) | W/L | $\mu$ (cm$^2$/Vs) | $V_{th}$ (V) |
|---|---|---|---|---|
| Pristine | 35.2 ± 0.3 | 2550 μm/180 μm | 1.21 ± 0.51 | −3.1 ± 0.2 |
| Dry O2 | 35.2 ± 0.3 | 2550 μm/180 μm | 1.25 ± 0.51 | −2.5 ± 0.2 |
| Vacuum | 35.0 ± 0.3 | 2550 μm/180 μm | 1.21 ± 0.51 | −3.0 ± 0.1 |
| Humid air | 37.5 ± 0.3 | 2550 μm/180 μm | 1.14 ± 0.50 | −2.5 ± 0.3 |
| Vacuum | 34.4 ± 0.1 | 2550 μm/180 μm | 1.19 ± 0.51 | −3.0 ± 0.2 |
| H2O (water) | 35.7 ± 0.3 | 2550 μm/180 μm | 1.19 ± 0.50 | −2.4 ± 0.3 |
| Vacuum | 34.5 ± 0.3 | 2550 μm/180 μm | 1.18 ± 0.50 | −2.9 ± 0.3 |

Figure 22B:
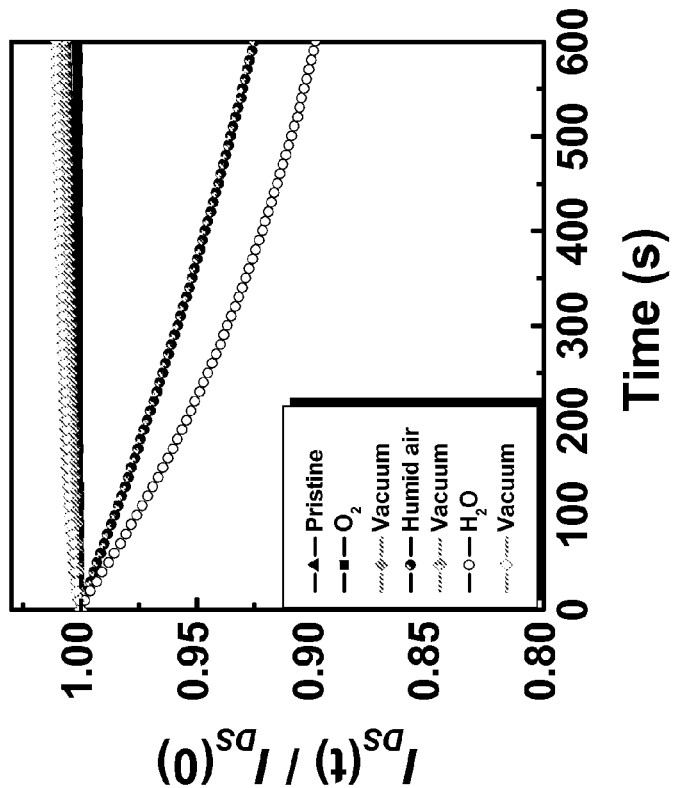
FIGS. 22A and 22B show the transfer characteristics and temporal evolution of the $I_{DS}$ during DC bias for a TIPS-pentacene and PTAA blend channel based OFET with a CYTOP/Al$_2$O$_3$/CYTOP tri-layer (20 nm CYTOP; 50 nm Al$_2$O$_3$; 20 nm CYTOP), after each stage of the exposure sequence of FIG. 17.
Figure 22A:
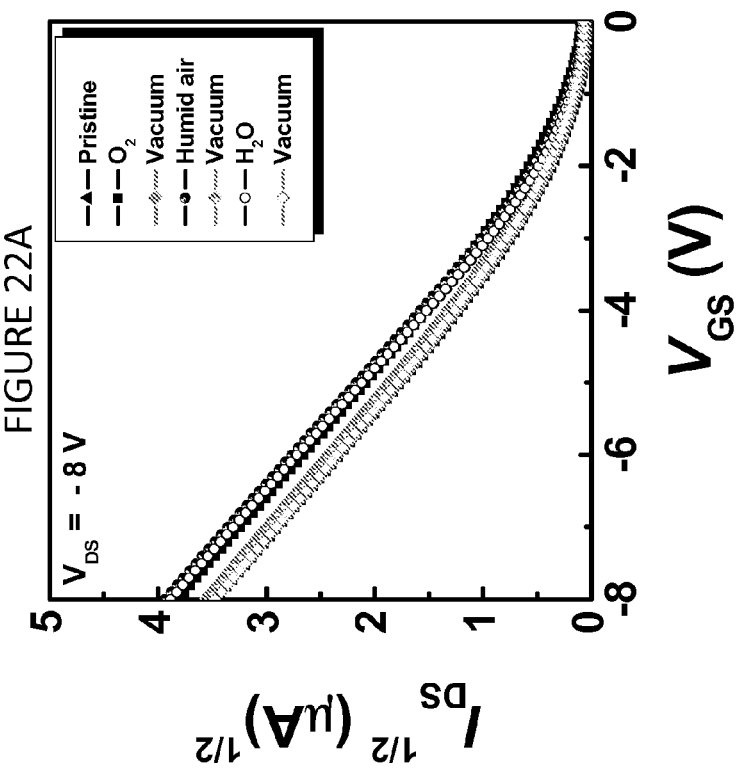

FIGS. 22A and 22B show the transfer characteristics and temporal evolution of the $I_{DS}$ during DC bias for the TIPS-pentacene and PTAA blend channel based OFET with a CYTOP/$Al_2O_3$/CYTOP tri-layer (20 nm CYTOP; 50 nm Al2O3; 20 nm CYTOP). The data obtained during testing of the OFET is summarized in the table below.

| Average 7 devices | Cin (nF/cm$^2$) | W/L | $\mu$ (cm$^2$/Vs) | $V_{th}$ (V) |
|---|---|---|---|---|
| Pristine | 35.2 ± 0.3 | 2550 μm/180 μm | 1.21 ± 0.51 | −3.1 ± 0.2 |
| Dry O2 | 35.2 ± 0.3 | 2550 μm/180 μm | 1.25 ± 0.51 | −2.5 ± 0.2 |
| Vacuum | 35.0 ± 0.3 | 2550 μm/180 μm | 1.21 ± 0.51 | −3.0 ± 0.1 |
| Humid air | 37.5 ± 0.3 | 2550 μm/180 μm | 1.14 ± 0.50 | −2.5 ± 0.3 |

-continued

| Average 7 devices | Cin (nF/cm$^2$) | W/L | µ (cm$^2$/Vs) | $V_{th}$ (V) |
|---|---|---|---|---|
| Vacuum | 34.4 ± 0.1 | 2550 µm/180 µm | 1.19 ± 0.51 | −3.0 ± 0.2 |
| H2O (water) | 35.7 ± 0.3 | 2550 µm/180 µm | 1.19 ± 0.50 | −2.4 ± 0.3 |
| Vacuum | 34.5 ± 0.3 | 2550 µm/180 µm | 1.18 ± 0.50 | −2.9 ± 0.3 |

Comparative Study on Various Fluoropolymer (CYTOP, Hyflon, and Teflon)/Inorganic ($Al_2O_3$ and $SiN_x$) Bi-Layers For illustrating the advantages of the embodiments of the invention, the following study has been made of capacitors and OFETs having fluoropolymer bi-layers. Eight capacitors and eight OFETs with different fluoropolymer bi-layers have been compared.

CYTOP (45 nm)/$Al_2O_3$ (50 nm);
Hyflon (45 nm)/$Al_2O_3$ (50 nm);
Teflon (45 nm)/$Al_2O_3$ (50 nm);
CYTOP (20 nm)/$Al_2O_3$ (50 nm)/CYTOP (20 nm);
CYTOP (45 nm)/$S_iN_x$ (50 nm);
Hyflon (45 nm)/$S_iN_x$ (50 nm);
Teflon (45 nm)/$S_iN_x$ (50 nm);
CYTOP (20 nm)/$S_iN_x$ (50 nm)/CYTOP (20 nm).

To prepare the capacitors, Au (50 nm) bottom electrodes were deposited on glass substrates (Corning 1737) by thermal evaporation through a shadow mask. Various fluoropolymer (CYTOP, Hyflon, and Teflon)/inorganic ($Al_2O_3$ and $SiN_x$) bi-layers and CYTOP/inorganic ($Al_2O_3$ and $SiN_x$)/CYTOP triple layers were used as dielectrics. CYTOP solution (CTL-809M) was purchased from Asahi Glass with a concentration of 9 wt. %. Hyflon solution (Hyflon® AD 40X) was received from Solvay, of which concentration is ~6.6 wt %. Teflon solution (601S2-100-6) was purchased from DuPont with a concentration of 6 wt. %. To deposit the 45-nm-thick fluoropolymer layers, the original solutions were diluted with their solvents (CT-solv. 180 for CYTOP, LS165 for Hyflon, and FC-40 for Teflon) to have solution:solvent ratios of 1:3.5 for CYTOP, 1:2 for Hyflon, and 1:3 for Teflon. For 20 nm CYTOP layers, the solution:solvent ratio is 1:7. Fluoropolymer layers were deposited by spin coating at 3000 (for CYTOP) and at 4000 rpm (for Hyflon and Teflon) for 60 sec. After deposition, fluoropolymer layers were annealed at 100° C. for 20 min. Then, the $Al_2O_3$ dielectric films (50 nm) were deposited on top of the fluoropolymer layer using a Savannah 100 ALD system from Cambridge Nanotech Inc. Films were grown at 110° C. using alternating exposures of trimethyl aluminum [$Al(CH_3)_3$] and $H_2O$ vapor at a deposition rate of approximately 0.1 nm per cycle. $SiN_x$ films (50 nm) were deposited on fluoropolymer layers by plasma enhanced chemical vapor deposition (PECVD) at 110° C. For triple layer dielectrics, CYTOP films (20 nm) deposited on $Al_2O_3$ and $SiN_x$ films and annealed at 100° C. for 20 min. Finally, Al (150 nm) top electrodes were deposited by thermal evaporation through a shadow mask.

FIGS. 23A-23D show the capacitance and current density-electric field (J-E) characteristics of the tested capacitors. A summary of the dielectric properties of the tested capacitors is contained in the Table below.

| Dielectric type | $C_{in}$ (nF/cm2) at 1 KHz Measured value | Cin (nF/cm$^2$) Calculated value | Breakdown field (MV/cm) @ J = 10$^{-6}$ A/cm$^2$ |
|---|---|---|---|
| CYTOP (45 nm)/$Al_2O_3$ (50 nm) | 35.2 ± 0.3 | 34.6 | Over 3.3 MV/cm |
| CYTOP (20 nm)/$Al_2O_3$ (50 nm)/CYTOP (20 nm) | 34.6 ± 0.1 | | Over 3.3 MV/cm |
| Hyflon (45 nm)/$Al_2O_3$ (50 nm) | 39.1 ± 0.1 | | 3 MV/cm |
| Teflon (45 nm)/$Al_2O_3$ (50 nm) | 34.7 ± 0.3 | | Over 3.3 MV/cm |
| CYTOP (45 nm)/$SiN_x$ (50 nm) | 32.2 ± 0.2 | 32.6 | Over 3.3 MV/cm |
| CYTOP (20 nm)/$SiN_x$ (50 nm)/CYTOP (20 nm) | 32.1 ± 0.2 | | Over 3.3 MV/cm |
| Hyflon (45 nm)/$SiN_x$ (50 nm) | 31.1 ± 0.3 | | Over 3.3 MV/cm |
| Teflon (45 nm)/$SiN_x$ (50 nm) | 32.3 ± 0.2 | | Over 3.3 MV/cm |

To prepare the OFETS, a bottom-contact and top-gate structure were fabricated on glass substrates (Corning, Eagle 2000). Au (50 nm) bottom-contact source/drain electrodes were deposited by thermal evaporation through a shadow mask. A self-assembled monolayer of pentafluorobenzenethiol (PFBT) was formed on the Au electrodes by immersion in a 10 mmol PFBT solution in ethanol for 15 min in a $N_2$-filled dry box, rinsing with pure ethanol, and drying. The TIPS-pentacene and PTAA blend solution was prepared as follows: TIPS-pentacene and PTAA were individually dissolved in 1,2,3,4-Tetrahydronaphthalene anhydrous, 99%, (Sigma Aldrich) for a concentration of 30 mg/mL and the two individual solutions were mixed to yield a weight ratio of 1:1. TIPS-pentacene and PTAA blend active layers were deposited by spin coating at 500 rpm for 10 sec and at 2000 rpm for 20 sec. Then, samples were annealed at 100° C. for 15 min in a $N_2$-filled dry box. Various fluoropolymer (CYTOP, Hyflon, and Teflon)/inorganic ($Al_2O_3$ and $SiN_x$) bi-layers and CYTOP/inorganic ($Al_2O_3$ and $SiN_x$)/CYTOP triple layers were used as dielectrics. CYTOP solution (CTL-809M) was purchased from Asahi Glass with a concentration of 9 wt. %. Hyflon solution (Hyflon® AD 40X) was received from Solvay, of which concentration is ~6.6 wt %. Teflon solution (601S2-100-6) was purchased from DuPont with a concentration of 6 wt. %. To deposit the 45-nm-thick fluoropolymer layers, the original solutions were diluted with their solvents (CT-solv. 180 for CYTOP, LS165 for Hyflon, and FC-40 for Teflon) to have solution:solvent ratios of 1:3.5 for CYTOP, 1:2 for Hyflon, and 1:3 for Teflon. For 20 nm CYTOP layers, the solution:solvent ratio is 1:7. Fluoropolymer layers were deposited by spin coating at 3000 (for CYTOP) and at 4000 rpm (for Hyflon, Teflon) for 60 sec. After deposition, fluoropolymer layers were annealed at 100° C. for 20 min. Then, the $Al_2O_3$ dielectric films (50 nm) were deposited on top of the fluoropolymer layer using a Savannah 100 ALD system from Cambridge Nanotech Inc. Films were fabricated at 110° C. using alternating exposures of trimethyl aluminum [$Al(CH_3)_3$] and $H_2O$ vapor at a deposition rate of approximately 0.1 nm per cycle. SiN$_x$ films (50 nm) were deposited on fluoropolymer layers by plasma enhanced chemical vapor deposition (PECVD) at 110° C. For triple layer dielectrics, CYTOP films (20 nm) deposited on the top of Al$_2$O$_3$ and SiN$_x$ films and annealed at 100° C. for 20 min. Finally, Al (150 nm) gate electrodes were deposited by thermal evaporation through a shadow mask.

Figure 24H:
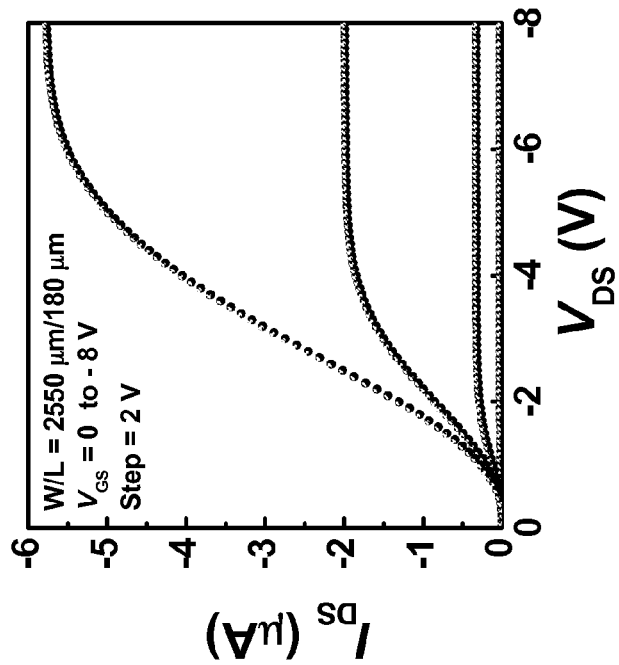
FIGS. 24G and 24H show the transfer characteristic and output characteristics for a CYTOP (20 nm)/Al$_2$O$_3$ (50 nm)/CYTOP (20 nm) tri-layer OFET.
Figure 24G:
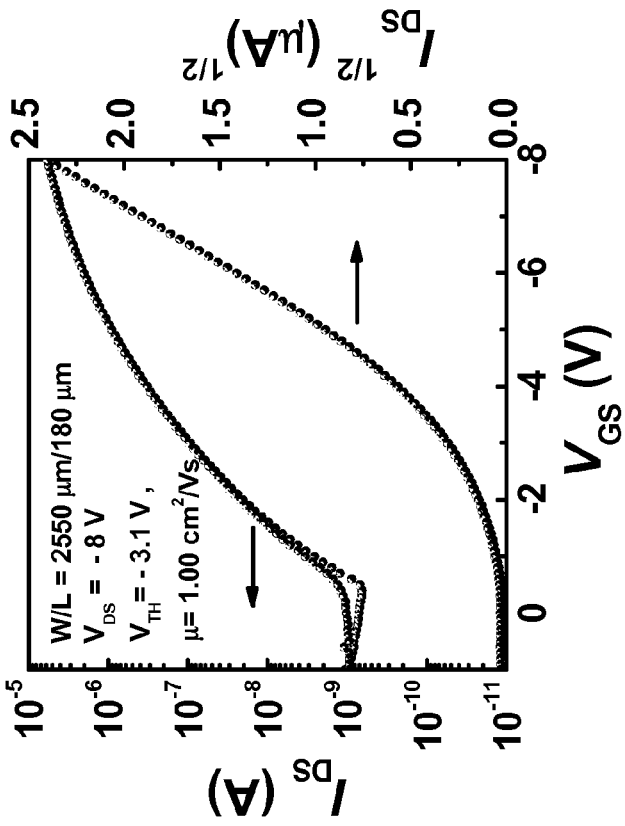
Figure 24J:
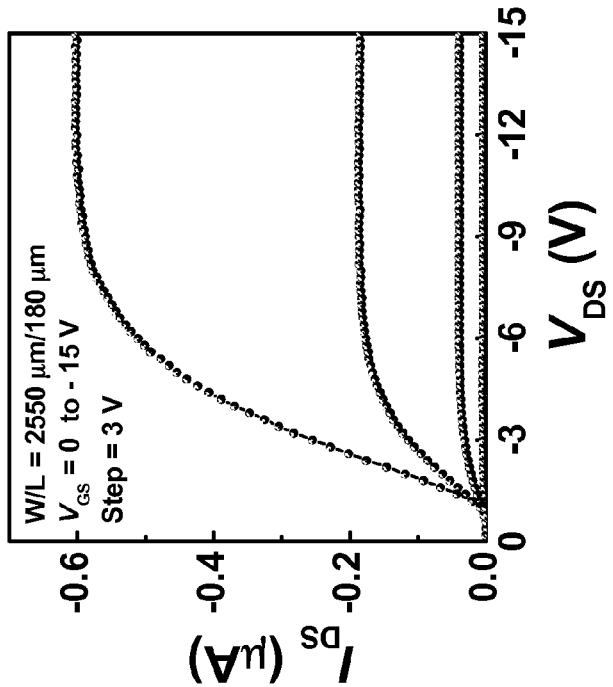
FIGS. 24I and 24J show the transfer characteristic and output characteristics for a CYTOP (45 nm)/S$_i$N$_x$ (50 nm) bi-layer OFET.
Figure 24I:
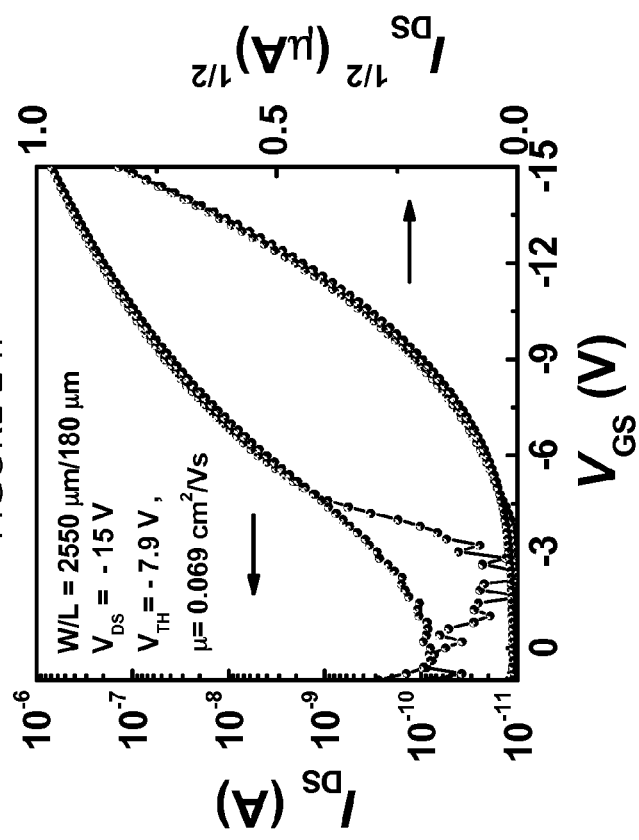

FIGS. 24A and 24B show the transfer characteristic and output characteristics for the CYTOP (45 nm)/Al$_2$O$_3$ (50 nm) bi-layer OFET. FIGS. 24C and 24D show the transfer characteristic and output characteristics for the Hyflon (45 nm)/Al$_2$O$_3$ (50 nm) bi-layer OFET. FIGS. 24E and 24F show the transfer characteristic and output characteristics for the Teflon (45 nm)/Al$_2$O$_3$ (50 nm) bi-layer OFET. FIGS. 24G and 24H show the transfer characteristic and output characteristics for the CYTOP (20 nm)/Al$_2$O$_3$ (50 nm)/CYTOP (20 nm) tri-layer OFET. FIGS. 24I and 24J show the transfer characteristic and output characteristics for the CYTOP (45 nm)/S$_i$N$_x$ (50 nm) bi-layer OFET. FIGS. 24K and 24L show the transfer characteristic and output characteristics for the Hyflon (45 nm)/S$_i$N$_x$ (50 nm) bi-layer OFET. FIGS. 24M and 24N show the transfer characteristic and output characteristics for the Teflon (45 nm)/S$_i$N$_x$ (50 nm) bi-layer OFET. FIGS. 24O and 24P show the transfer characteristic and output characteristics for the CYTOP (20 nm)/S$_i$N$_x$ (50 nm)/CYTOP (20 nm) tri-layer OFET.

A summary of the performance of the tested OFETs is contained in the below table.

Figure 15D:
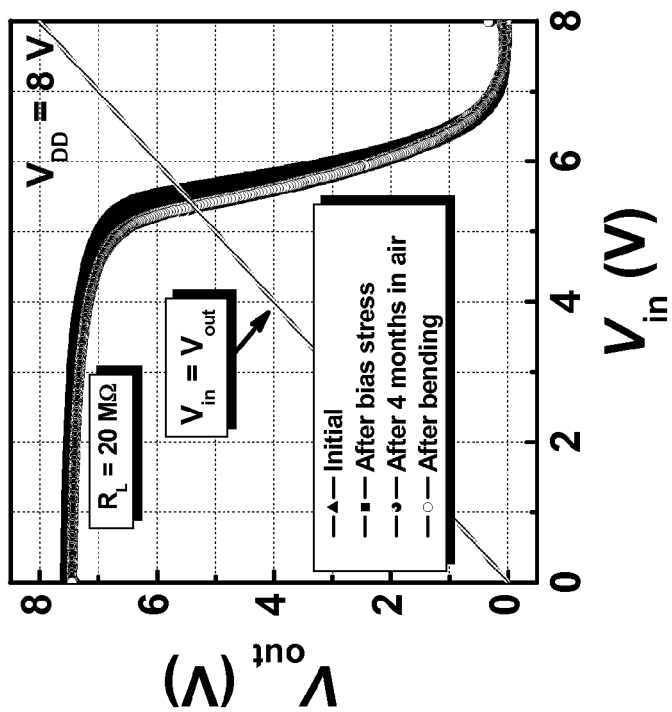
FIG. 15D shows the voltage transfer characteristics of a resistive-load inverters with the plastic substrate OFET initially, after 2 hours of DC bias stress, after 4 months in air, and after bending for 30 minutes (tensile stress).
Figure 15C:
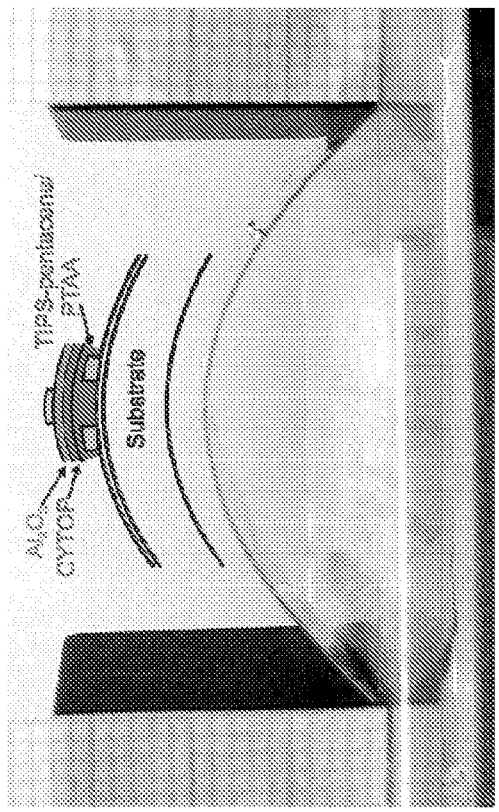
FIG. 15C shows the bending apparatus used to bend the plastic substrate OFET.

$\mu=0.24\pm0.08$ cm$^2$/Vs, the threshold voltage V$_{th}$=-1.3±0.1 V, I$_{on}$/I$_{off}$=10$^4$ were measured in these bi-layer devices. OFETs (W/L=2550 μm/180 μm) using a CYTOP (40 nm)/Al$_2$O$_3$ (50 nm) gate dielectric and a plastic (PES) substrate was subjected to 3600 s (1 h) of DC bias stress. FIG. 14A shows the temporal evolution of the I$_{DS}$ measured in the OFET normalized to the initial value. The evolution of the CYTOP/Al$_2$O$_3$ bi-layer in the plastic substrate OFET was similar to that of the glass substrate device, as can be seen by comparing FIG. 11A with FIG. 14A. FIGS. 14B and 14C show the transfer and output characteristics of the plastic substrate OFET after being subjected to the DC bias stress. FIGS. 15A and 15B show the transfer and output characteristics of OFETs (W/L=2550 μm/180 μm) using a CYTOP (40 nm)/Al$_2$O$_3$ (50 nm) gate dielectric and a plastic (PES) substrate initially, after 4 months in air, and after bending for 30 minutes (tensile stress). FIG. 15C shows the bending apparatus used to bend the plastic substrate OFET. FIG. 15D shows the voltage transfer characteristics of the plastic substrate OFET (determined using a resistive-load inverter) initially, after 2 hours of DC bias stress, after 4 months in air, and after bending for 30 minutes (tensile stress).

Figure 26B:
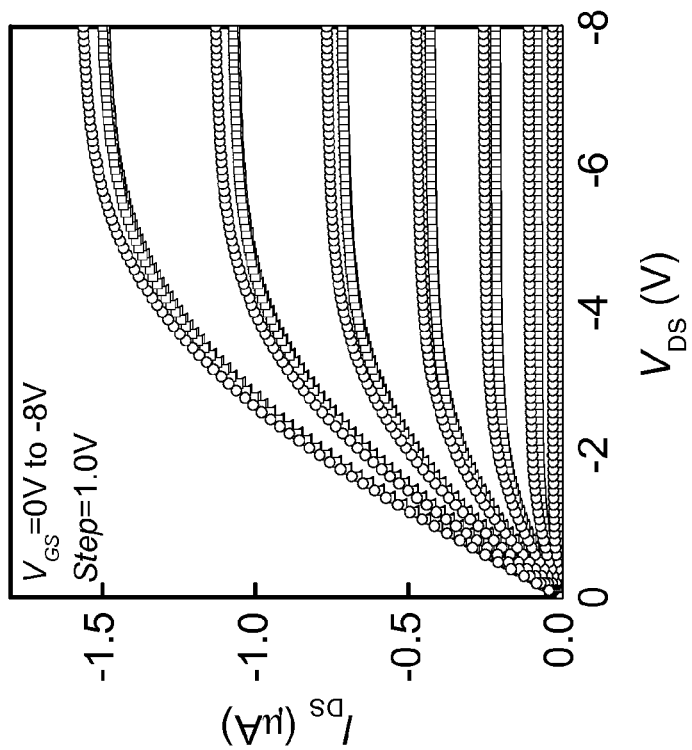
FIGS. 26A and 26B show the transfer characteristics and output characteristics of the pentacene FETs of FIG. 4G after various stress conditions.
Figure 26A:
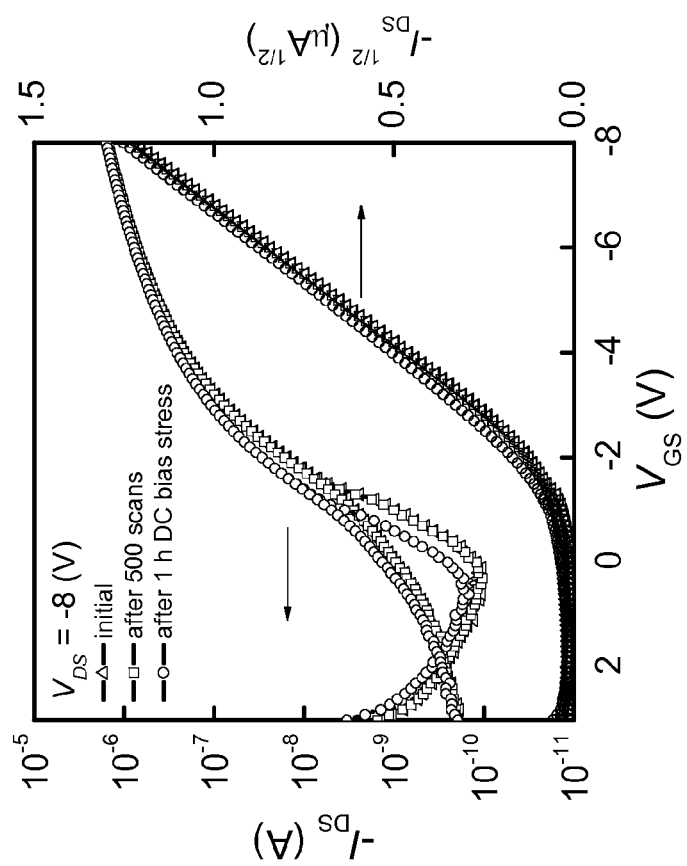

FIGS. 25A and 25B show the drain current I$_{DS}$ with respect to gate voltage V$_{GS}$ for the pentacene and InGaZnO FETs discussed in Example 11. FIG. 25C shows the temporal evolution of the I$_{DS}$ measured in the pentacene and InGaZnO FETs, normalized to the initial value, under DC bias stress over 60 minutes. FIGS. 26A and 26B show the transfer char-

| Dielectric | W/L | Cin (nF/cm$^2$) | μ (cm$^2$/Vs) | V$_{th}$ (V) | I$_{on/off}$ |
|---|---|---|---|---|---|
| CYTOP (40 mm)/Al$_2$O$_3$ (50 nm) | 2550 μm/180 μm (ave. 7) | 35.2 | 0.98 ± 0.17 | -3.7 ± 0.6 | 3 × 10$^4$ |
| Hyflon (40 nm)/Al$_2$O$_3$ (50 nm) | 2550 μm/180 μm (ave. 7) | 39.1 | 0.70 ± 0.09 | -3.7 ± 0.2 | 10$^3$ |
| Teflon (40 nm)/Al$_2$O$_3$ (50 nm) | 2550 μm/180 μm (ave. 8) | 34.7 | 0.67 ± 0.16 | -4.1 ± 0.5 | 3 × 10$^3$ |
| CYTOP (20 nm)/Al$_2$O$_3$ (50 nm)/CYTOP (20 nm) | 2550 μm/180 μm (ave. 7) | 34.6 | 0.69 ± 0.22 | -3.4 ± 0.4 | 5 × 10$^3$ |
| CYTOP (40 nm)/SiN$_x$ (50 nm) | 2550 μm/180 μm (ave. 8) | 32.2 | 0.044 ± 0.025 | -8.5 ± 0.4 | 10$^4$ |
| Hyflon (40 nm)/SiN$_x$ (50 nm) | 2550 μm/180 μm (ave. 7) | 31.1 | 0.009 ± 0.005 | -8.2 ± 0.4 | 5 × 10$^3$ |
| Teflon (40 nm)/SiN$_x$ (50 nm) | 2550 μm/180 μm (ave. 8) | 32.3 | 0.005 ± 0.001 | -6.7 ± 0.5 | 10$^3$ |
| CYTOP (20 nm)/SiN$_x$ (50 nm)/CYTOP (20 nm) | 2550 μm/180 μm (ave. 8) | 32.1 | 0.019 ± 0.008 | -8.2 ± 0.4 | 10$^3$ |

It should be noted that field-effect mobility values for fluoropolymer/SiN$_x$ bi-layer OFETs were 10-100 times lower than those for fluoropolymer/Al$_2$O$_3$ bi-layer OFETs.

Results Yielded by Other Embodiments

Figure 12B:
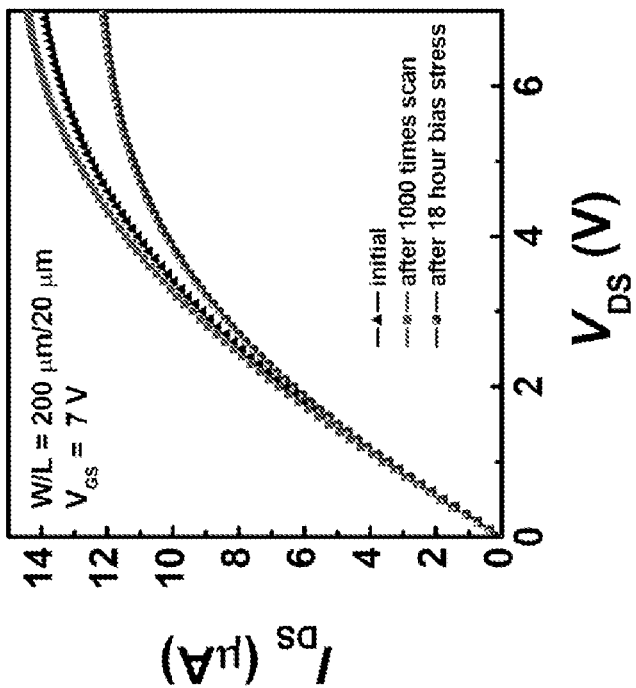
FIGS. 12A and 12B show the transfer and output characteristics of amorphous InGaZnO FETs with the CYTOP/$Al_2O_3$ bi-layer after multiple scans of the transfer characteristic and after a constant DC bias stress for 18 hour, respectively.
Figure 12A:
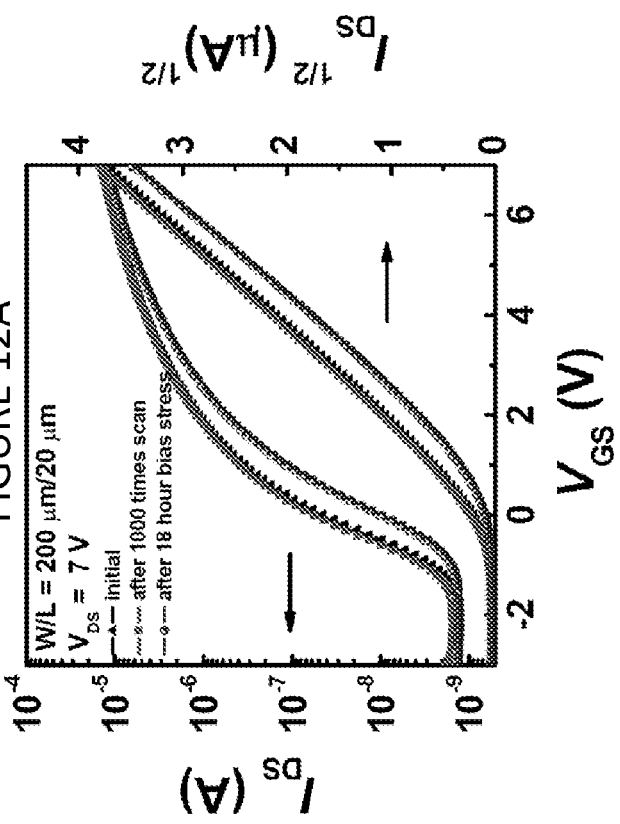

FIGS. 12A and 12B show the transfer and output characteristics of amorphous InGaZnO FETs with the CYTOP (40 nm)/Al$_2$O$_3$ (50 nm) bi-layer after multiple scans of the transfer characteristic up to 1,000 cycles and after a constant DC bias stress for 18 hour (V$_{GS}$=V$_{DS}$=7 V). Under continuous multiple scans or under a constant DC bias stress, the oxide FET shows no degradation of mobility but a slight change in the threshold voltage.

Figure 27B:
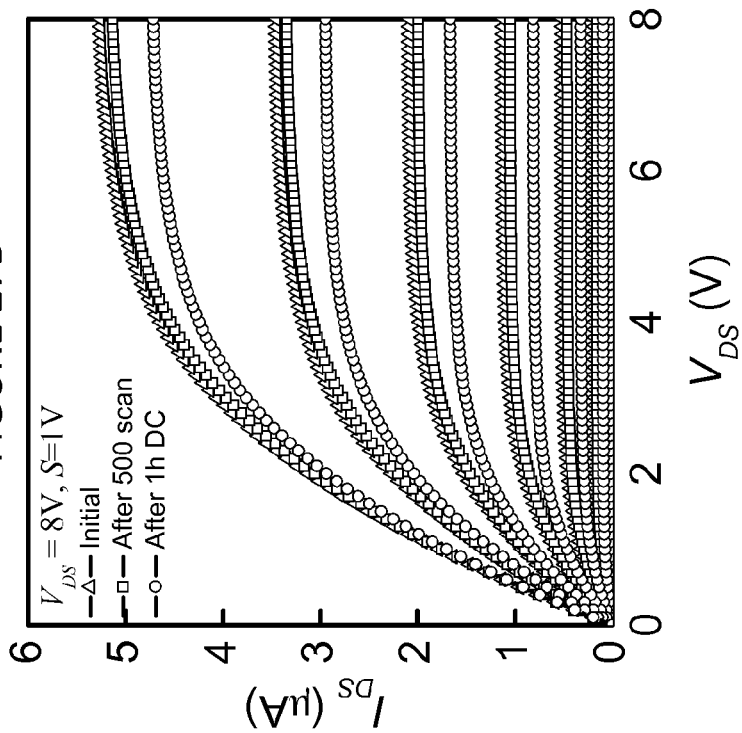
FIGS. 27A and 27B show the transfer characteristics and output characteristics of the InGaZnO FETs of FIG. 4G after various stress conditions.
Figure 27A:
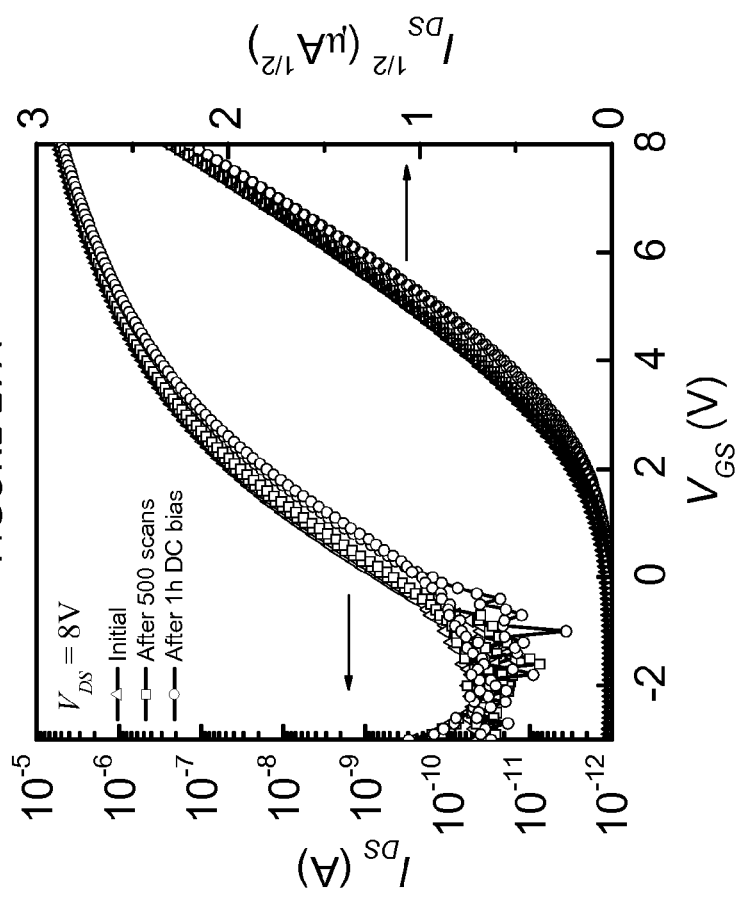
Figure 28A:
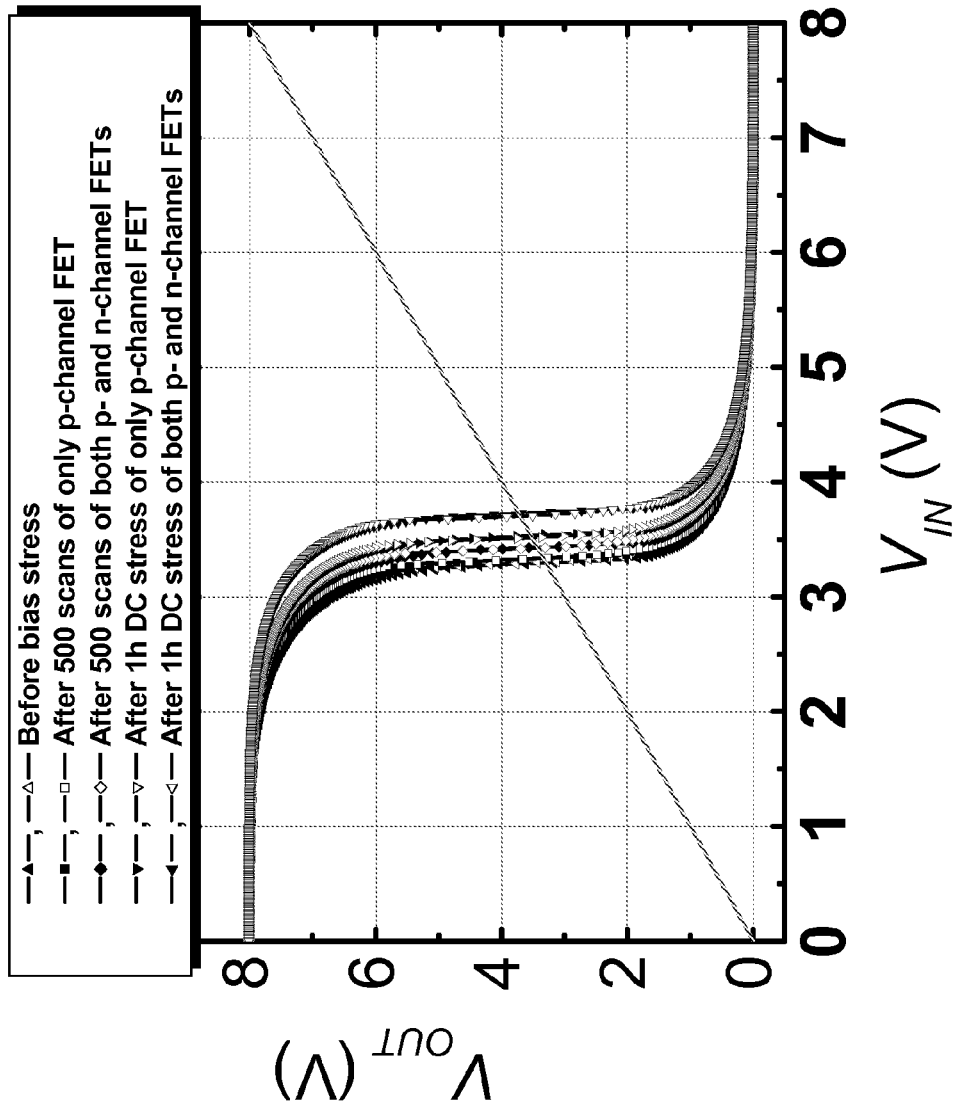
FIGS. 28A and 28B show the voltage transfer characteristics and static gain of the inverter of FIG. 4G after various stress conditions.
Figure 28B:
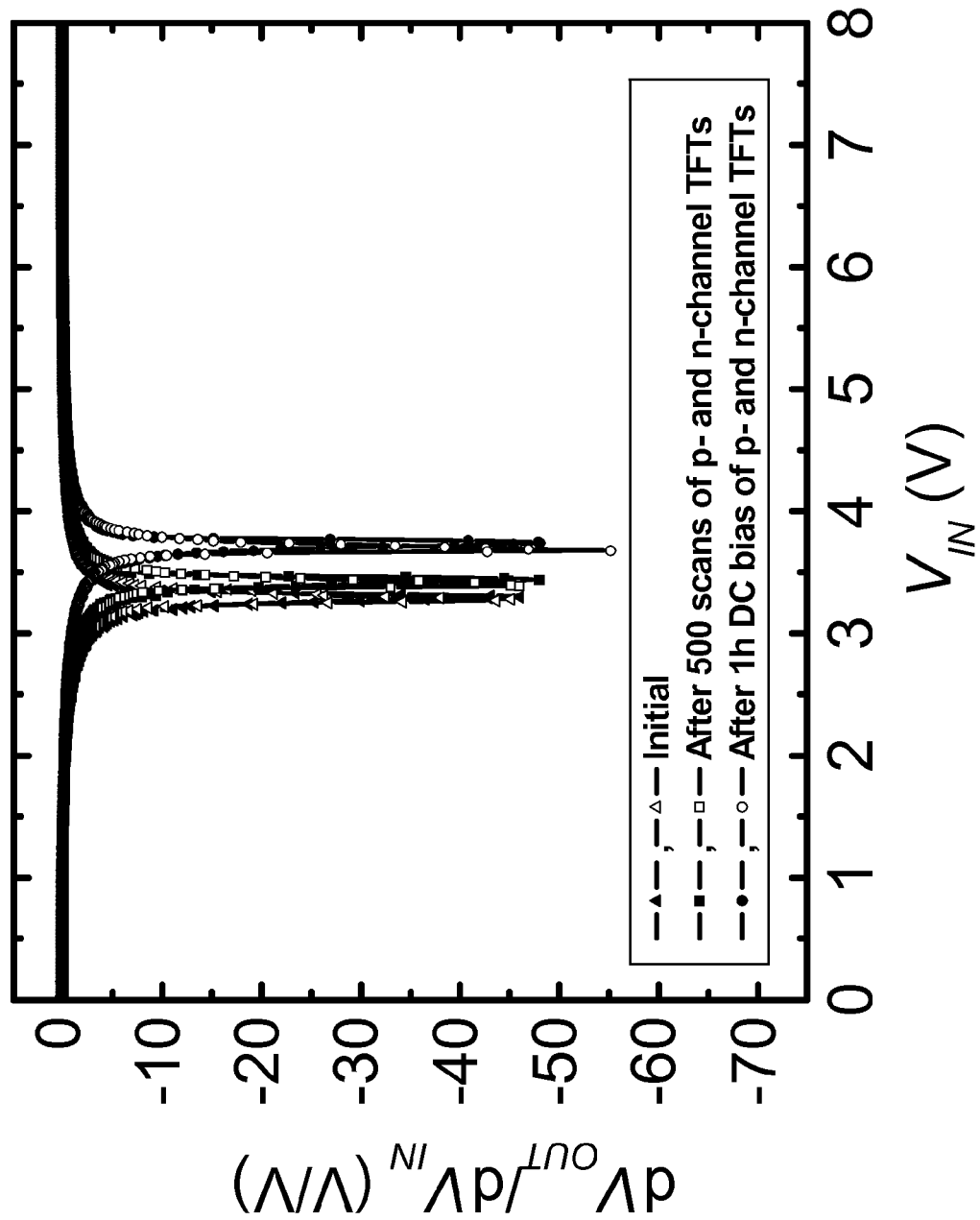

FIGS. 13A-13B show the transfer and output characteristics, measured from pristine devices under a nitrogen atmosphere, of OFETs (W/L=2550 μm/180 μm) using a CYTOP (40 nm)/Al$_2$O$_3$ (50 nm) gate dielectric and a plastic (PES) substrate, as discussed in Examiner 7. The OFETs showed no hysteresis and achieved a maximum value of μ=0.34 cm$^2$/Vs at a low voltage of 8 V. Average values of the mobility acteristics and output characteristics of the pentacene FETs discussed in Example 11. FIGS. 27A and 27B show the transfer characteristics and output characteristics of the InGaZnO FETs discussed in Example 11. FIGS. 28A and 28B show the voltage transfer characteristics and static gain of the inverter of FIG. 4G.

Figure 30B:
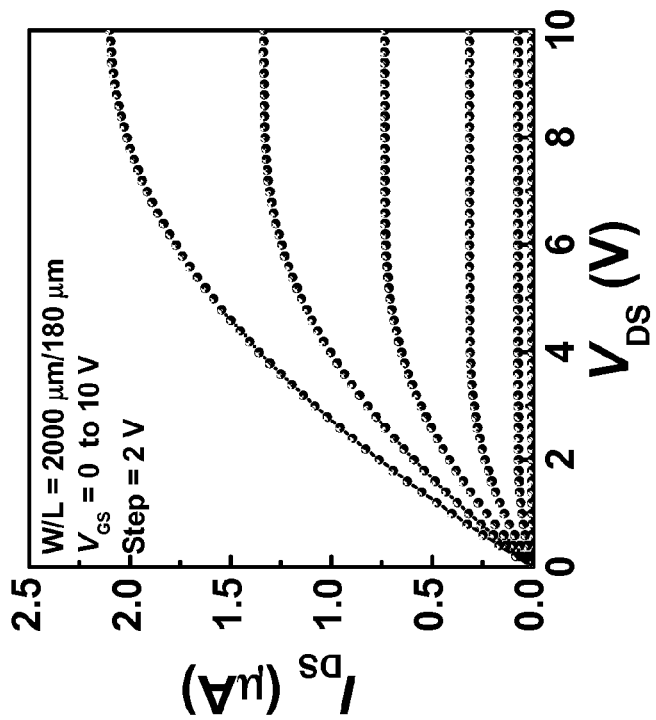
FIGS. 30A and 30B show the transfer characteristics and output characteristics of a Polyera ActivInk N2200 based OFET with a CYTOP/Al$_2$O$_3$ bi-layer (45 nm CYTOP; 50 nm Al$_2$O$_3$) and evaporated Ag source/drain electrodes, as discussed in Example 13.
Figure 30A:
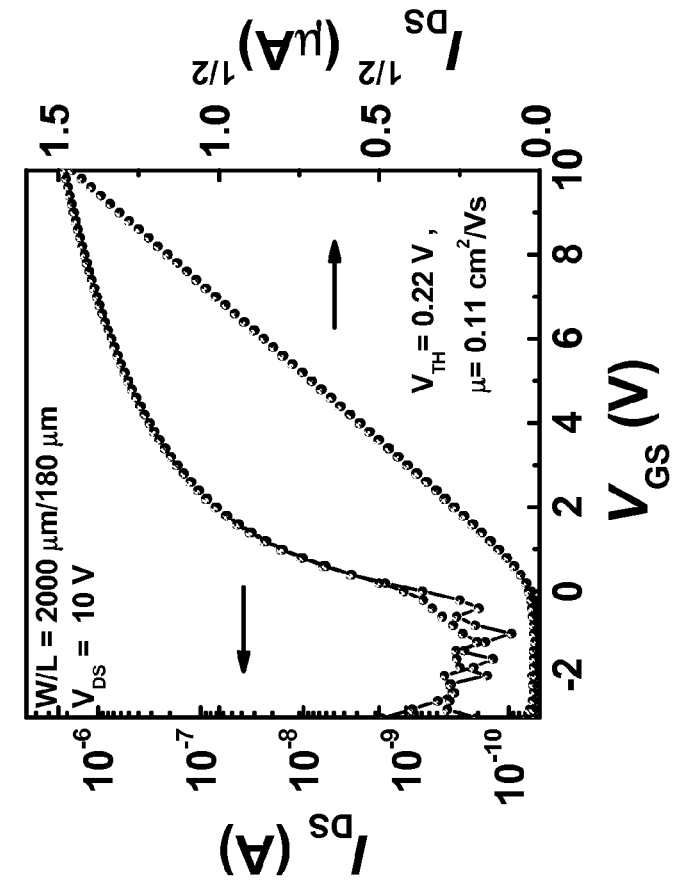
Figure 31B:
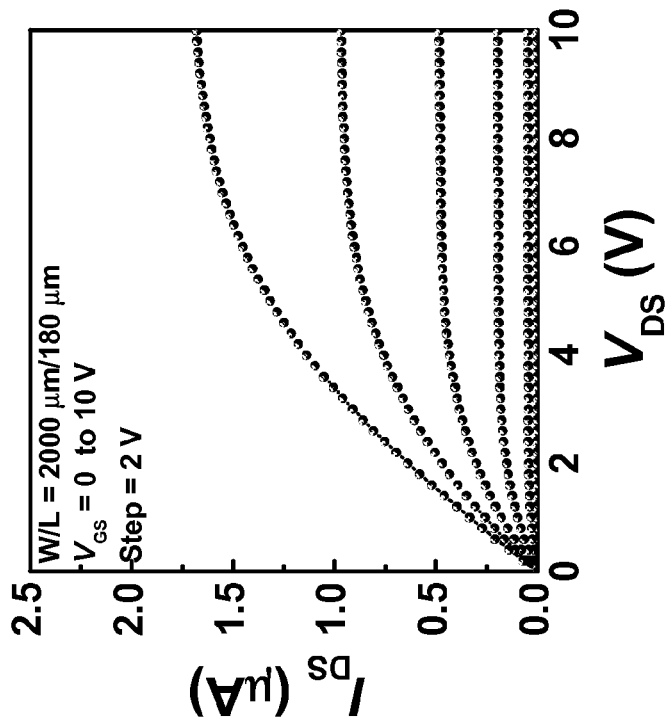
FIGS. 31A and 31B show the transfer characteristics and output characteristics of a Polyera ActivInk N2200 based OFET with a CYTOP/Al$_2$O$_3$ bi-layer (45 nm CYTOP; 50 nm Al$_2$O$_3$) and printed Ag source/drain electrodes, as discussed in Example 14.
Figure 31A:
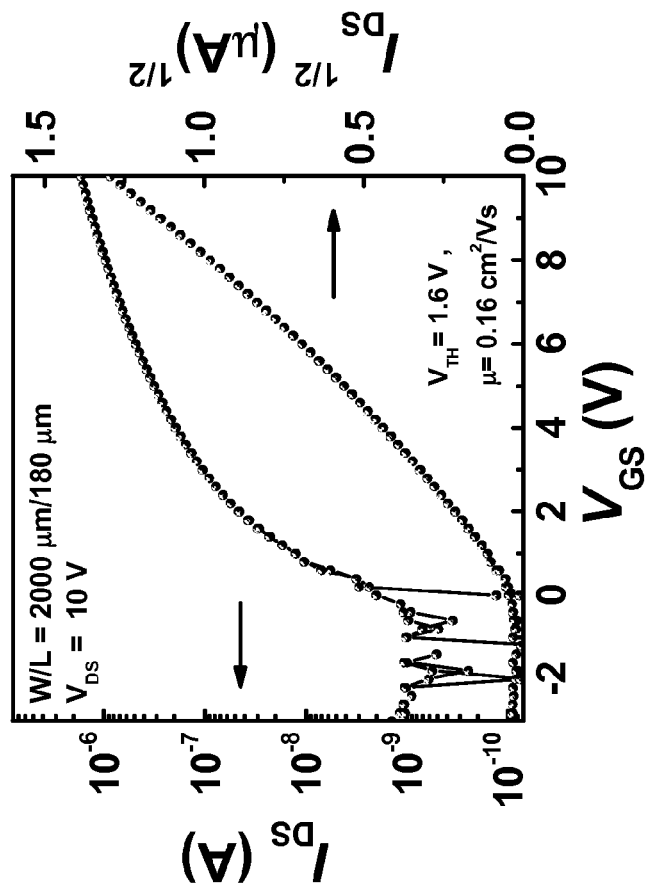

FIGS. 29A and 29B show the transfer characteristics and output characteristics of a Polyera ActivInk N2200 based OFET with a CYTOP/Al$_2$O$_3$ bi-layer (45 nm CYTOP; 50 nm Al$_2$O$_3$) and evaporated Au source/drain electrodes, as discussed in Example 12. FIGS. 30A and 30B show the transfer characteristics and output characteristics of a Polyera ActivInk N2200 based OFET with a CYTOP/Al$_2$O$_3$ bi-layer (45 nm CYTOP; 50 nm Al$_2$O$_3$) and evaporated Ag source/drain electrodes, as discussed in Example 13. FIGS. 31A and 31B show the transfer characteristics and output characteristics of a Polyera ActivInk N2200 based OFET with a CYTOP/Al$_2$O$_3$ bi-layer (45 nm CYTOP; 50 nm Al$_2$O$_3$) and printed Ag source/drain electrodes, as discussed in Example 14. A summary of the performance of the printed tested printed OFETs is contained in the table below.

| compound | W/L | $C_{in}$ (nF/cm$^2$) | S/D electrode | μ (cm$^2$/Vs) | $V_{TH}$ (V) | Ion/off |
|---|---|---|---|---|---|---|
| P(NDI20D-T2)-Polyera N2200 | 2000 μm/180 μm | 34.8 | evaporated Au | 0.08 | 0.18 | 2 × 10³ |
| | 2000 μm/180 μm | 34.8 | evaporated Ag | 0.11 | 0.22 | 8 × 10³ |
| | 2000 μm/180 μm | 34.8 | printed Ag | 0.16 | 1.6 | 3 × 10³ |

Figure 32B:
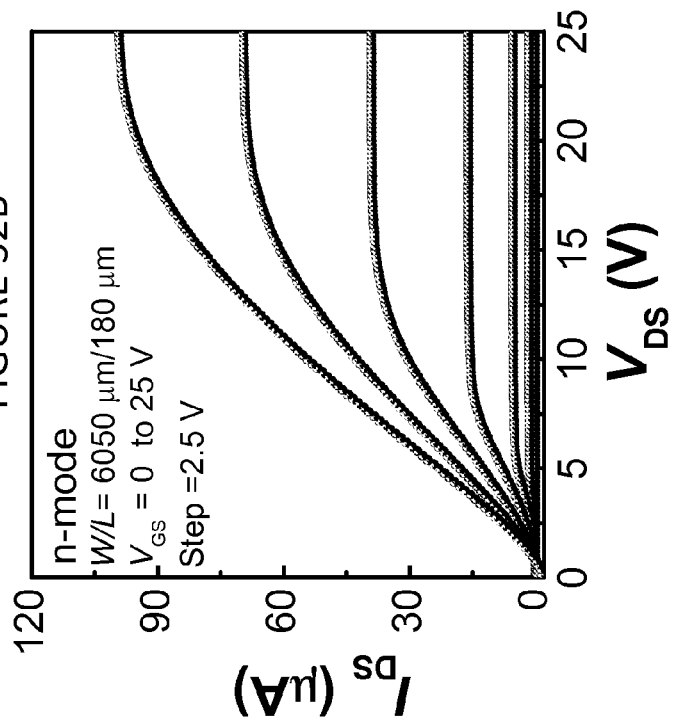
FIGS. 32A and 32B show the transfer characteristics and output characteristics of an LEH-III-002a based OFET with a CYTOP/Al$_2$O$_3$ bi-layer (45 nm CYTOP; 50 nm Al$_2$O$_3$) and Au bottom contact source/drain electrodes in n-mode operation.
Figure 32A:
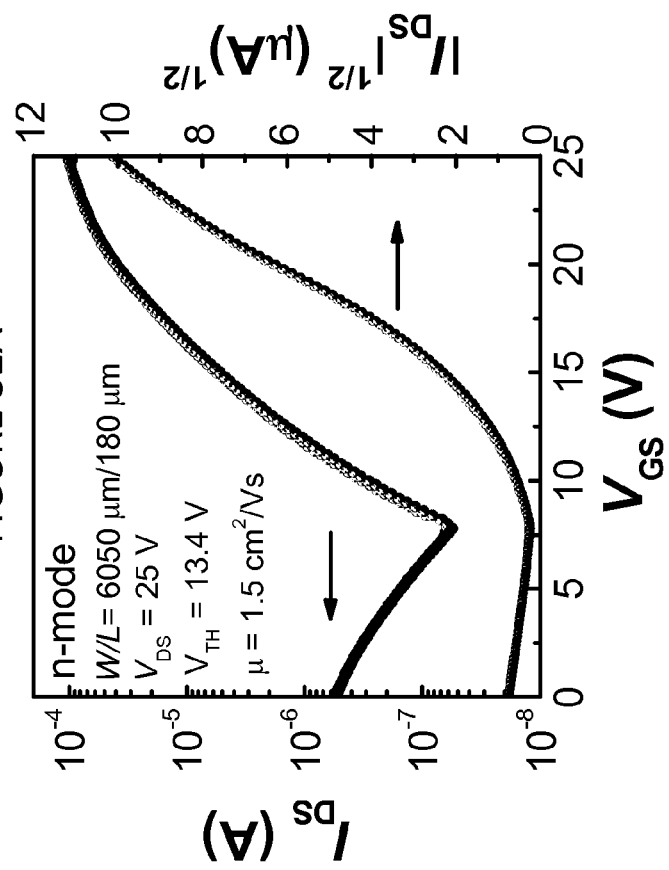

FIGS. 32A and 32B show the transfer characteristics and output characteristics of an LEH-III-002a based OFET with a CYTOP/Al$_2$O$_3$ bi-layer (45 nm CYTOP; 50 nm Al$_2$O$_3$) and Au bottom contact source/drain electrodes in n-channel operation.

FIGS. 33A and 33B show the transfer characteristics and output characteristics of an LEH-III-002a based OFET with a CYTOP/Al$_2$O$_3$ bi-layer (45 nm CYTOP; 50 nm Al$_2$O$_3$) and Au bottom contact source/drain electrodes in p-channel operation.

FIGS. 34A and 34B show the transfer characteristics and output characteristics of an LEH-III-085g based OFET with a CYTOP/Al$_2$O$_3$ bi-layer (45 nm CYTOP; 50 nm Al$_2$O$_3$) and Al bottom contact source/drain electrodes.

Figure 35B:
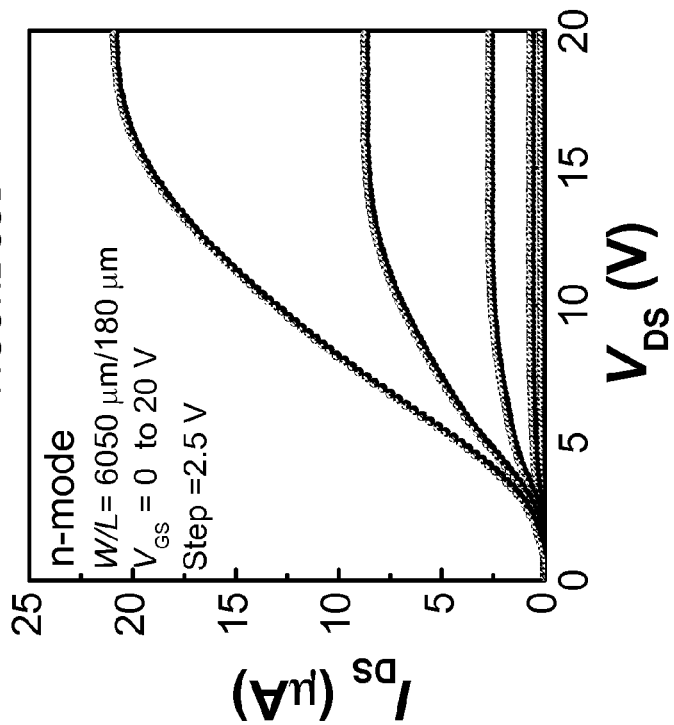
FIGS. 35A and 35B show the transfer characteristics and output characteristics of an LEH-III-085g:PαMS based OFET with a CYTOP/Al$_2$O$_3$ bi-layer (45 nm CYTOP; 50 nm Al$_2$O$_3$) and Ag bottom contact source/drain electrodes in n-mode operation.
Figure 35A:
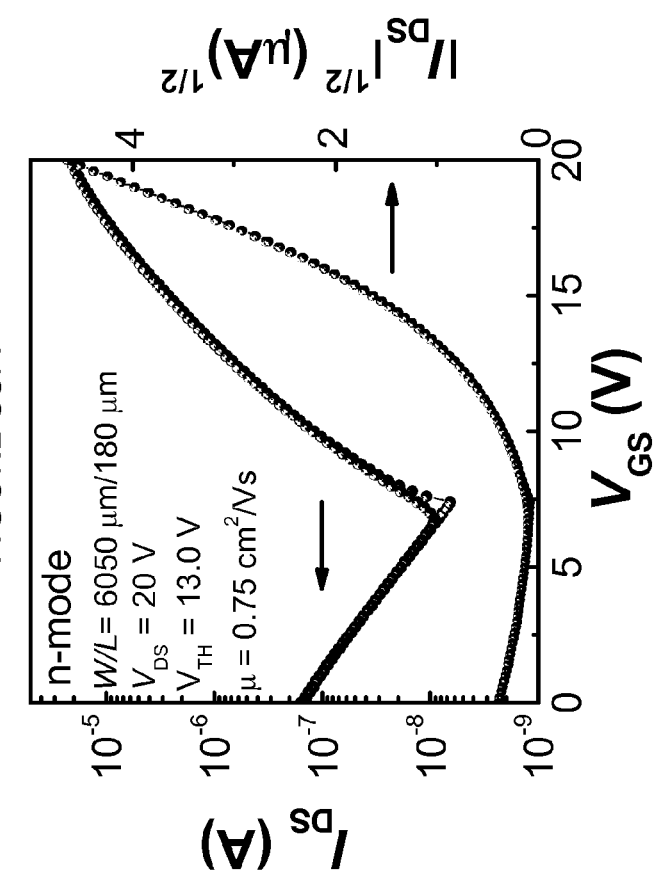

FIGS. 35A and 35B show the transfer characteristics and output characteristics of an LEH-III-085g:PαMS based OFET with a CYTOP/Al$_2$O$_3$ bi-layer (45 nm CYTOP; 50 nm Al$_2$O$_3$) and Ag bottom contact source/drain electrodes in re-channel operation.

FIGS. 36A and 36B show the transfer characteristics and output characteristics of an LEH-III-085g:PαMS based OFET with a CYTOP/Al$_2$O$_3$ bi-layer (45 nm CYTOP; 50 nm Al$_2$O$_3$) and Ag bottom contact source/drain electrodes in p-channel operation.

Figure 37B:
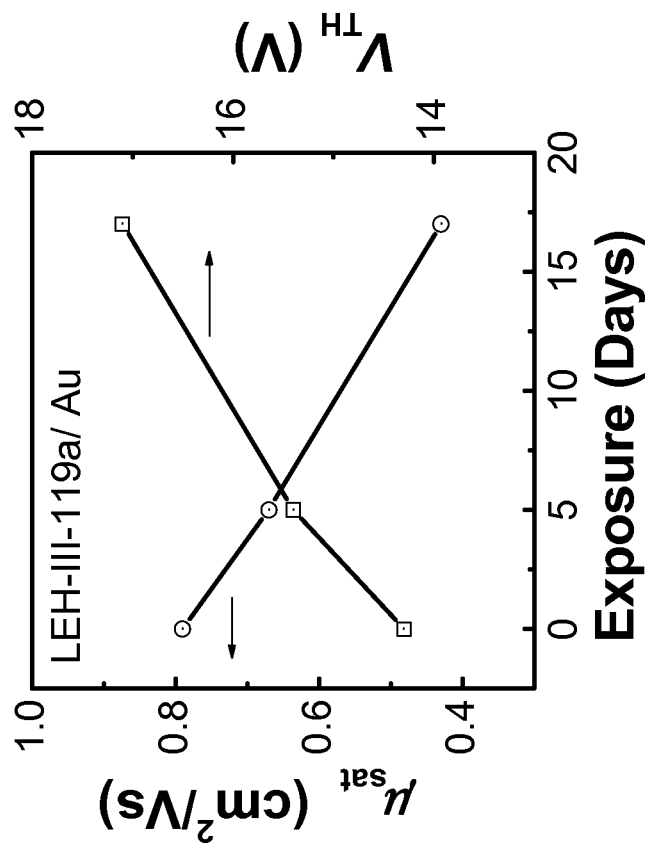

FIGS. 37A and 37B show the results of an ambient exposure study on the LEH-III-119a based OFET with a CYTOP/Al$_2$O$_3$ bi-layer (45 nm CYTOP; 50 nm Al$_2$O$_3$) and Au bottom contact source/drain electrodes. FIG. 37A shows the transfer characteristics of this OFET initially, after 5 days, after 17 days, and after annealing. FIG. 37B shows the mobility and threshold voltages of this OFET initially, after 5 days, and after 17 days.

Figure 38A:
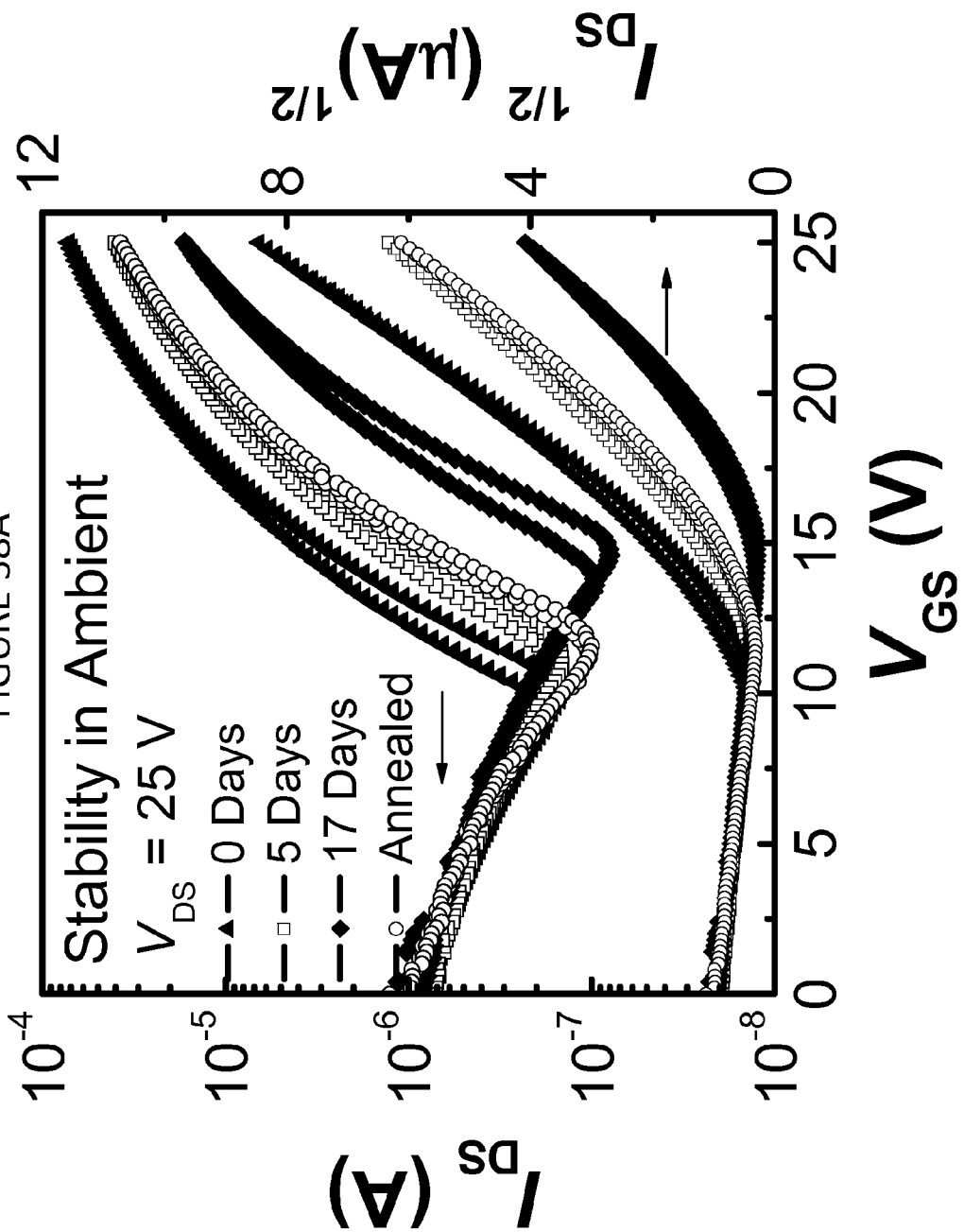
FIGS. 38A and 38B show the results of an ambient exposure study on the LEH-III-119a/PαMS blend based OFET with a CYTOP/Al$_2$O$_3$ bi-layer (45 nm CYTOP; 50 nm Al$_2$O$_3$) and Au bottom contact source/drain electrodes.
Figure 38B:
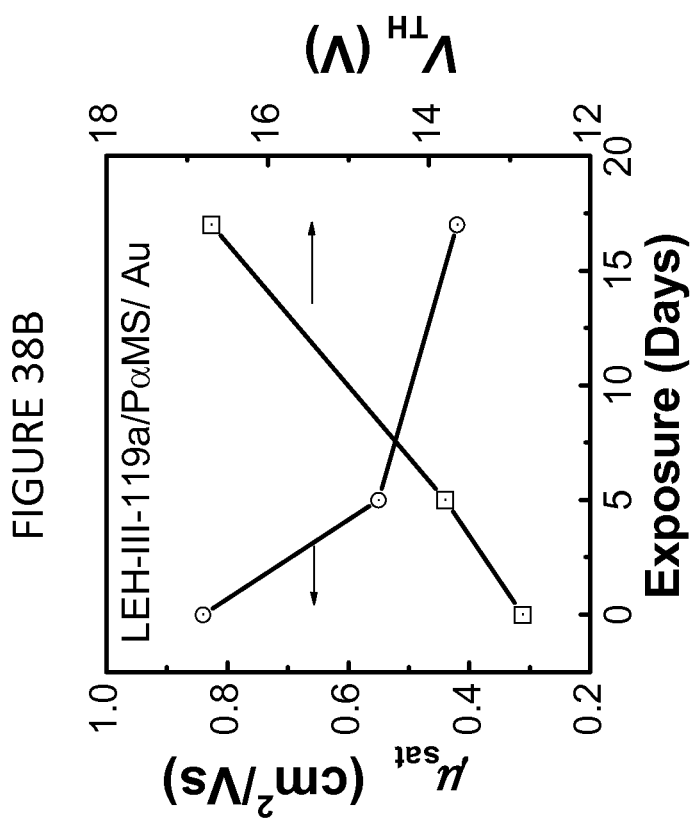

FIGS. 38A and 38B show the results of an ambient exposure study on the LEH-III-119a:PαMS based OFET with a CYTOP/Al$_2$O$_3$ bi-layer (45 nm CYTOP; 50 nm Al$_2$O$_3$) and Au bottom contact source/drain electrodes. FIG. 38A shows the transfer characteristics of this OFET initially, after 5 days, after 17 days, and after annealing. FIG. 38B shows the mobility and threshold voltages of this OFET initially, after 5 days, and after 17 days.

FIGS. 39A and 39B show the transfer characteristics and output characteristics of a DRR-IV-209n based OFET with a CYTOP/Al$_2$O$_3$ bi-layer (45 nm CYTOP; 50 nm Al$_2$O$_3$).

A summary of the performance of the LEH-III-002a, LEH-III-085g, LEH-III-119a, DRR-IV-209n based OFETs is shown in the tables below.

| | | | | | | |
|---|---|---|---|---|---|---|
| LEH-III-002a and LEH-III-085g | | | | | | |
| Batch | Mode | W/L | S/D electrode | $C_{in}$ (nF/cm$^2$) | μ (cm$^2$/VS) | $V_{TH}$ (V) |
| LEH-III-002a (SPT-II-23-C2) | Ambipolar (n-mode) | 6050 μm/180 μm (ave. 4 dev.) | Au | 34.8 | 1.1 (±0.3) | 13.1 (±1.1) |
| | Ambipolar (p-mode) | 6050 μm/180 μm (ave. 4 dev.) | Au | 34.8 | 5.7 (±3.3) × 10$^{-3}$ | −14.4 (±0.8) |
| LEH-III-085g (SPT-II-45-a) | Only n-channel | 2550 μm/180 μm (ave. 5 dev.) | Al | 34.8 | 0.16 (±0.02) | 0.01 (±0.02) |
| LEH-III-085g/PaMS blend (SPT-II-75-d) | Ambipolar (n-mode) | 6050 μm/180 μm (ave. 4 dev.) | Ag | 34.8 | 0.72 (±0.05) | 12.9 (±0.3) |
| | Ambipolar (p-mode) | 6050 μm/180 μm (ave. 4 dev.) | Ag | 34.8 | 6.3 (±1.0) × 10$^{-3}$ | −11.7 (±1.1) |

| | | | | | | |
|---|---|---|---|---|---|---|
| LEH-III-119a ambient stability | | | | | | |
| Batch | Ambient exposure | W/L | S/D electrode | $C_{in}$ (nF/cm$^2$) | μ (cm$^2$/Vs) | $V_{TH}$ (V) |
| LEH-III-119a (SPT-II-57-i) | Pristine | 6050 μm/180 μm | Au | 34.8 | 0.79 | 14.3 |
| | 5 days in air | 6050 μm/180 μm | Au | 34.8 | 0.67 | 15.1 |
| | 17 days in air | 6050 μm/180 μm | Au | 34.8 | 0.43 | 17.1 |
| | 18 hrs vacuum annealing at 100° C. | 6050 μm/180 μm | Au | 34.8 | 0.51 | 17.0 |
| LEH-III-119a/PαMS | Pristine | 6050 μm/180 μm | Au | 34.8 | 0.84 | 12.8 |
| | 5 days in air | 6050 μm/180 μm | Au | 34.8 | 0.55 | 13.8 |

LEH-III-119a ambient stability

| Batch | Ambient exposure | W/L | S/D electrode | $C_{in}$ (nF/cm$^2$) | μ (cm$^2$/Vs) | $V_{TH}$ (V) |
|---|---|---|---|---|---|---|
| blend (SPT-II-57-j) | 17 days in air | 6050 μm/180 μm | Au | 34.8 | 0.42 | 16.7 |
| | 18 hrs vacuum annealing at 100° C. | 6050 μm/180 μm | Au | 34.8 | 0.65 | 14.9 |

DRR-IV-209n

| W/L | Cin (nF/cm$^2$) | Solvent | S/D electrode | μ (cm$^2$/Vs) | VTH (V) | $I_{on/off}$ |
|---|---|---|---|---|---|---|
| 2550 μm/180 μm (ave. 9 dev.) | 35.2 | 1,4-dioxane | Au | 0.042 ± 0.03 | 3.4 ± 0.5 | 10$^3$ |
| 2550 μm/180 μm (ave. 6 dev.) | 35.2 | dichlorobenzene | Au | 0.13 ± 0.01 | 4.9 ± 0.4 | 10$^4$ |

In conclusion, the multilayer approach of the invention opens up the opportunity to develop environmentally and operationally stable OFETs for many applications. Examples of such applications include: drivers for information displays and medical imaging arrays, complementary circuits, adaptive solar cell arrays, radio-frequency identification (RFID) tags, and chemical or physical sensors among many others. In applications such as active matrix display backplanes, where a constant current supply is required, bias stress effects have a detrimental impact over the display performance. For such applications the embodiment of the invention will have substantial advantages over for instance, current amorphous silicon (a-Si) FET technologies which are very susceptible to bias stress effects. A particularly attractive application of the invention refers to backplane circuits of active matrix organic light emitting diode (AMOLED) displays for commercial use. This is because conventional AMOLED displays need more transistors to compensate variations of the threshold voltage and mobility due to the degradation of driving transistor to prevent non-uniformity of organic light-emitting diode. This invention will allow high integration density and excellent backplane stability to operate AMOLED displays.

While the principles of the invention have been set out above in connection with specific embodiments, it is to be clearly understood that this description is merely made by way of example and not as a limitation of the scope of protection which is determined by the appended claims.

The invention claimed is:

1. A field-effect transistor having operational stability comprising:
    a gate, a source and a drain;
    a semiconductor layer between the source and the drain; and
    a gate insulator between the gate and the semiconductor layer;
    wherein the gate insulator comprises:
        a first layer adjoining the semiconductor layer at an interface, the first layer comprising a fluoropolymer; and
        a second layer comprising Al$_2$O$_3$, the second layer deposited by atomic layer deposition (ALD) to provide increased operational stability compared to other field-effect transistors;
        the first layer having a first dielectric constant and a first thickness; wherein interfacial charge trapping at the interface causes a first effect on a current between the drain and the source over time under a continuous bias stress;
        the second layer having a second dielectric constant and a second thickness, the second dielectric constant being higher than the first dielectric constant; wherein a change in the polarizability of the second layer over time under continuous bias stress causes a second effect on the current between the drain and the source; and
        wherein selection of the first and second thickness and the first and second dielectric constant are such that the first effect compensates at least partly the second effect which provides the increased operational stability, such that variation of the current between the source and the drain under the continuous bias stress for a period of one hour is less than 5 percent.

2. The field-effect transistor of claim 1, wherein the variation in the current between the source and the drain under the continuous bias stress for a period of two hours is less than 5 percent.

3. The field-effect transistor of claim 1, wherein the first layer is formed from an amorphous fluoropolymer having a glass transition temperature above 80 degrees Celcius and the fluoropolymer is selected from the group consisting of: a copolymer of 4,5-difluoro-2,2-bis(trifluoromethyl)-1,3-dioxole (PDD) and tetrafluoroethylene (TFE), or a copolymer of 2,2,4-trifluoro-5-trifluoromethoxy-1,3-dioxole (TTD) and tetrafluoroethylene (TFE).

4. The field-effect transistor of claim 3, wherein the second layer consists of Al$_2$O$_3$.

5. The field-effect transistor of claim 1, wherein the thickness of the first layer is less than 200 nm.

6. The field-effect transistor of claim 1, wherein the thickness of the second layer is less than 500 nm.

7. The field-effect transistor of claim 1, wherein the thickness of the first layer is less than 200 nm and the thickness of the second layer is less than 100 nm.

8. A process for manufacturing a field-effect transistor having operational stability, the process comprising:
providing a source, a drain, a gate, a semiconductor layer between the source and the drain, and a gate insulator between the gate and the semiconductor layer;
wherein providing the gate insulator comprises:
depositing a first layer comprising a fluoropolymer, wherein the first layer has a first dielectric constant and a first thickness, the first layer defining an interface with the semiconductor layer; wherein the depositing of the first layer is such that interfacial charge trapping at the interface causes a first effect on a current between the source and drain over time under a continuous bias stress; and
depositing a second layer comprising $Al_2O_3$, wherein the second layer is deposited by atomic layer deposition (ALD), the second layer having a second dielectric constant and a second thickness, the second dielectric constant being higher than the first dielectric constant; wherein a change in the polarizability of the second layer over time under continuous bias stress causes a second effect on the current between the drain and the source; and
wherein selection of the first and second thickness and the first and second dielectric constant are such that the first effect compensates at least partly the second effect to thereby provide increased operational stability compared to other field-effect transistors.

9. The field-effect transistor of claim 1, wherein the first layer is an amorphous fluoropolymer having a glass transition temperature above 80 degrees Celsius selected from the group consisting of: a copolymer of fluorinated 1,3-dioxole and tetrafluoroethylene (TFE), a copolymer of perfluorofuran (PFF) and tetrafluoroethylene (TFE), a homo- or copolymer of perfluoro(4-vinyloxyl)-1-alkenes, and combinations thereof.

10. The field-effect transistor of claim 1, wherein the second layer further comprises an inorganic material selected from the group consisting of $SiN_x$, $TiO_2$, $HfO_2$, $Ta_2O_5$, $SiO_2$, $Y_2O_3$, $ZrO_2$, and combinations thereof.

11. The field-effect transistor of claim 1, wherein the variation of the current between the source and the drain, normalized to the initial current at the end of a direct current (DC) bias test for a period of one hour, is less than 0.03 per hour.

12. The field-effect transistor of claim 1, wherein the thickness of the first layer is less than 50 nm and the thickness of the second layer is about 50 nm or less.

13. The field-effect transistor of claim 1, wherein the thickness of the first layer is less than 100 nm.

14. The process of claim 8, wherein the thickness of the first layer is less than 200 nm.

15. The process of claim 8, wherein the thickness of the second layer is less than 500 nm.

16. The process of claim 15, wherein the thickness of the first layer is less than 200 nm and the thickness of the second layer is less than 100 nm.

17. The process of claim 8, wherein the second layer consists of $Al_2O_3$.

18. The process of claim 8, wherein the thickness of the first layer is less than 50 nm and the thickness of the second layer is about 50 nm or less.

* * * * *